US012635478B2

(12) United States Patent
Shinohara et al.

(10) Patent No.: US 12,635,478 B2
(45) Date of Patent: May 19, 2026

(54) SUBSTRATE CLEANING DEVICE, SUBSTRATE PROCESSING APPARATUS AND SUBSTRATE CLEANING METHOD

(71) Applicant: SCREEN HOLDINGS CO., LTD., Kyoto (JP)

(72) Inventors: Tomoyuki Shinohara, Kyoto (JP); Yoshifumi Okada, Kyoto (JP); Nobuaki Okita, Kyoto (JP); Hiroshi Kato, Kyoto (JP); Takashi Shinohara, Kyoto (JP)

(73) Assignee: SCREEN HOLDINGS CO., LTD. (JP)

( * ) Notice: Subject to any disclaimer, the term of this patent is extended or adjusted under 35 U.S.C. 154(b) by 610 days.

(21) Appl. No.: 17/475,720

(22) Filed: Sep. 15, 2021

(65) Prior Publication Data

US 2022/0093420 A1 Mar. 24, 2022

(30) Foreign Application Priority Data

Sep. 18, 2020 (JP) ................................. 2020-157267
Sep. 18, 2020 (JP) ................................. 2020-157268
Sep. 18, 2020 (JP) ................................. 2020-157270

(51) Int. Cl.
H10P 72/76 (2026.01)
H10P 72/00 (2026.01)
(Continued)

(52) U.S. Cl.
CPC ...... H10P 72/7618 (2026.01); H10P 72/0414 (2026.01); B08B 1/12 (2024.01); B08B 1/20 (2024.01)

(58) Field of Classification Search
CPC ........... H01L 21/67051; H01L 21/6704; H01L 21/267028; H10P 72/0414; H10P 72/7618
See application file for complete search history.

(56) References Cited

U.S. PATENT DOCUMENTS 5,361,449 A 11/1994 Akimoto .......................... 15/302
5,989,346 A 11/1999 Hiroki ............................ 118/719
(Continued)

FOREIGN PATENT DOCUMENTS

CN 1536638 A 10/2004
CN 1923381 A 3/2007
(Continued)

OTHER PUBLICATIONS

Office Action dated May 30, 2023 issued in counterpart Korean Patent Application No. 10-2021-0122635.
(Continued)

*Primary Examiner* — Michael E Barr
*Assistant Examiner* — Kevin G Lee
(74) *Attorney, Agent, or Firm* — OSTROLENK FABER LLP

(57) ABSTRACT

A first substrate holder holds an outer peripheral end of a substrate. A second substrate holder holds a lower-surface center region of the substrate by suction at a position farther downward than the first substrate holder. The second substrate holder and the lower-surface brush are provided on a mobile base that is movable in a horizontal direction. The mobile base is moved between a position at which the lower-surface brush is opposite to a lower-surface outer region of the substrate and a position at which the lower-surface brush is opposite to the lower-surface center region of the substrate. The lower-surface center region of the substrate held by the first substrate holder is cleaned. At this time, a height position of the substrate is higher than an upper end portion of a processing cup. The lower-surface outer region of the substrate held by the second substrate holder is cleaned. At this time, a height position of the substrate is lower than the upper end portion of the processing cup.

24 Claims, 21 Drawing Sheets

(51) Int. Cl.
  *B08B 1/12* (2024.01)
  *B08B 1/20* (2024.01)

(56) References Cited

U.S. PATENT DOCUMENTS

| | | | |
|---|---|---|---|
| 6,821,073 B1 | 11/2004 | Koguchi | 414/403 |
| 8,166,985 B2 | 5/2012 | Nishiyama et al. | 134/137 |
| 9,947,556 B2 | 4/2018 | Takiguchi et al. | |
| 2002/0005168 A1 | 1/2002 | Kraus et al. | 118/715 |
| 2002/0157692 A1* | 10/2002 | Ishihara | B08B 1/32 |
| | | | 134/902 |
| 2003/0167612 A1 | 9/2003 | Kraus et al. | 29/25.02 |
| 2004/0053147 A1 | 3/2004 | Ito | 430/30 |
| 2004/0217545 A1 | 11/2004 | Kurita et al. | 271/236 |
| 2004/0218193 A1 | 11/2004 | Kurita et al. | 356/614 |
| 2004/0245956 A1 | 12/2004 | Kurita et al. | 318/560 |
| 2006/0120717 A1 | 6/2006 | Ito | 396/611 |
| 2007/0044823 A1 | 3/2007 | Yamamoto et al. | 134/33 |
| 2007/0065760 A1 | 3/2007 | Ito | 430/311 |
| 2007/0073443 A1 | 3/2007 | Kurita et al. | 700/245 |
| 2007/0098401 A1 | 5/2007 | Ito | 396/611 |
| 2008/0156351 A1 | 7/2008 | Mitsuyoshi et al. | 134/15 |
| 2008/0163899 A1 | 7/2008 | Takiguchi et al. | 134/30 |
| 2008/0199283 A1 | 8/2008 | Mitsuyoshi | 414/222.01 |
| 2008/0263793 A1 | 10/2008 | Nakano et al. | 15/77 |
| 2009/0202951 A1 | 8/2009 | Yamamoto et al. | 430/322 |
| 2010/0030347 A1 | 2/2010 | Shindo | 70/59 |
| 2010/0126539 A1 | 5/2010 | Lee et al. | 134/157 |
| 2012/0006326 A1 | 1/2012 | Yamamoto et al. | 134/33 |
| 2012/0006361 A1 | 1/2012 | Miyagi et al. | 134/30 |
| 2012/0130529 A1 | 5/2012 | Shindo | 700/114 |
| 2013/0312658 A1 | 11/2013 | Kashiyama et al. | |
| 2014/0102474 A1 | 4/2014 | Takiguchi et al. | |
| 2014/0202499 A1 | 7/2014 | Mitsuyoshi et al. | 134/25.1 |
| 2014/0202501 A1 | 7/2014 | Mitsuyoshi et al. | 134/61 |
| 2014/0352736 A1 | 12/2014 | Yamamoto et al. | 134/26 |
| 2015/0027492 A1 | 1/2015 | Takiguchi et al. | 134/6 |
| 2015/0107620 A1 | 4/2015 | Wu et al. | |
| 2015/0131088 A1 | 5/2015 | Shinohara et al. | |
| 2015/0133032 A1 | 5/2015 | Kubo et al. | |
| 2016/0236239 A1 | 8/2016 | Nishiyama | |
| 2016/0314958 A1 | 10/2016 | Takiguchi et al. | |
| 2017/0221696 A1 | 8/2017 | Nishiyama | |
| 2017/0225289 A1 | 8/2017 | Kubo et al. | |
| 2018/0231952 A1 | 8/2018 | Kuwahara | |
| 2019/0096729 A1 | 3/2019 | Muramoto | |
| 2019/0181022 A1* | 6/2019 | Mouri | B08B 1/10 |
| 2020/0075371 A1* | 3/2020 | Kuo | H01L 21/67271 |
| 2020/0211882 A1 | 7/2020 | Kuwahara et al. | |

FOREIGN PATENT DOCUMENTS

| | | | |
|---|---|---|---|
| CN | 101207007 A | 6/2008 |
| CN | 101246813 A | 8/2008 |
| CN | 105845606 A | 8/2016 |
| CN | 106935539 A | 7/2017 |
| CN | 108428655 A | 8/2018 |
| CN | 207806148 U | 9/2018 |
| CN | 109622429 A | 4/2019 |
| CN | 111383954 A | 7/2020 |
| EP | 1107288 A2 | 6/2001 |
| JP | H06-120184 A | 4/1994 |
| JP | H06-120318 A | 4/1994 |
| JP | H08-139152 A | 5/1996 |
| JP | H10-229062 A | 8/1998 |
| JP | 2001-160584 A | 6/2001 |
| JP | 2004-202451 A | 7/2004 |
| JP | 2005-340845 A | 12/2005 |
| JP | 2006-269974 A | 10/2006 |
| JP | 2008-166369 A | 7/2008 |
| JP | 2008-177541 A | 7/2008 |
| JP | 2009-194034 A | 8/2009 |
| JP | 2010-130021 A | 6/2010 |
| JP | 2012-146809 | 8/2012 |
| JP | 2013-247197 A | 12/2013 |
| JP | 2014-103412 A | 6/2014 |
| JP | 2014-130945 A | 7/2014 |
| JP | 2015-023248 A | 2/2015 |
| JP | 2015-119161 A | 6/2015 |
| JP | 5904169 B2 | 4/2016 |
| JP | 2016-152274 A1 | 8/2016 |
| JP | 5993625 B2 | 9/2016 |
| JP | 2018-014518 A | 1/2018 |
| JP | 2019-061996 A | 4/2019 |
| JP | 6503194 B2 | 4/2019 |
| JP | 2020-047719 A | 3/2020 |
| KR | 10-2016-0115732 A | 11/2006 |
| KR | 10-2008-0088724 A | 10/2008 |
| KR | 10-2009-0110222 A | 10/2009 |
| KR | 10-2016-0100839 A | 8/2016 |
| WO | WO 2017/163633 A1 | 9/2017 |
| WO | WO 2020/059375 A1 | 3/2020 |
| WO | WO 2021/053995 A1 | 3/2021 |

OTHER PUBLICATIONS

Notice of Allowance dated Mar. 12, 2024 issued in corresponding Japanese Patent Application No. 2020-157267.

Notice of Reasons for Refusal dated Apr. 30, 2024 issued in corresponding Japanese Patent Application No. 2020-157270.

Notice of Allowance dated Apr. 2, 2024 issued in corresponding Japanese Patent Application No. 2020-157268.

Office Action dated Feb. 10, 2023 issued in counterpart Taiwan Patent Application No. 110133307.

Office Action dated Apr. 30, 2025 issued in the counterpart Chinese Patent Application No. 202111079496.2.

Cao Ling, Progress in Surface Cleaning of Germanium Wafers, (The 46th Research Institute of CETC, Tianjin 300220, China), 1004-4507(2018)02-0036-04, Apr. 20, 2018. English translation of Abstract, front page.

Office Action dated May 8, 2025 issued in the counterpart Chinese Patent Application No. 202111042513.5.

* cited by examiner

F I G. 1
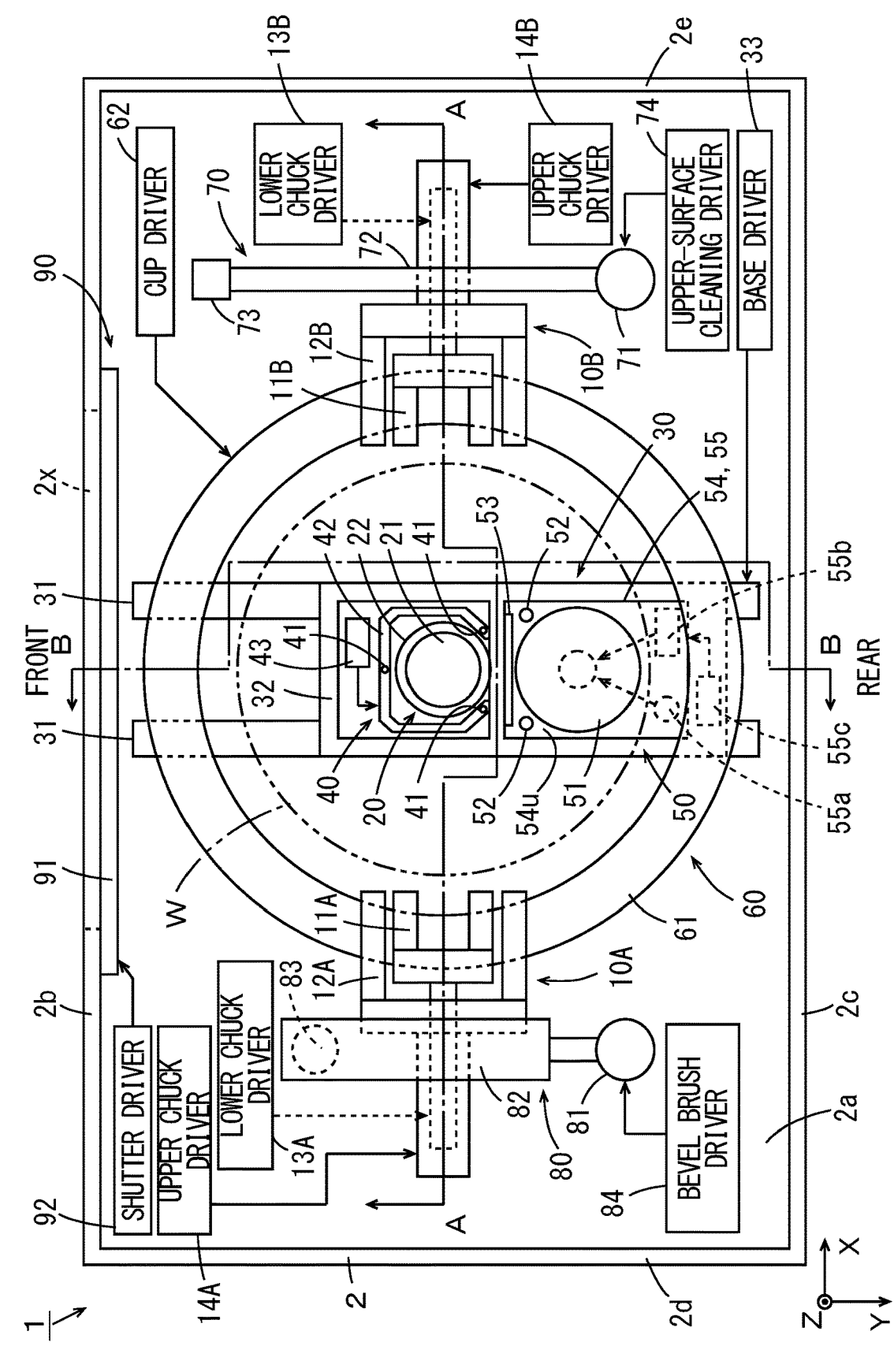

F I G. 2
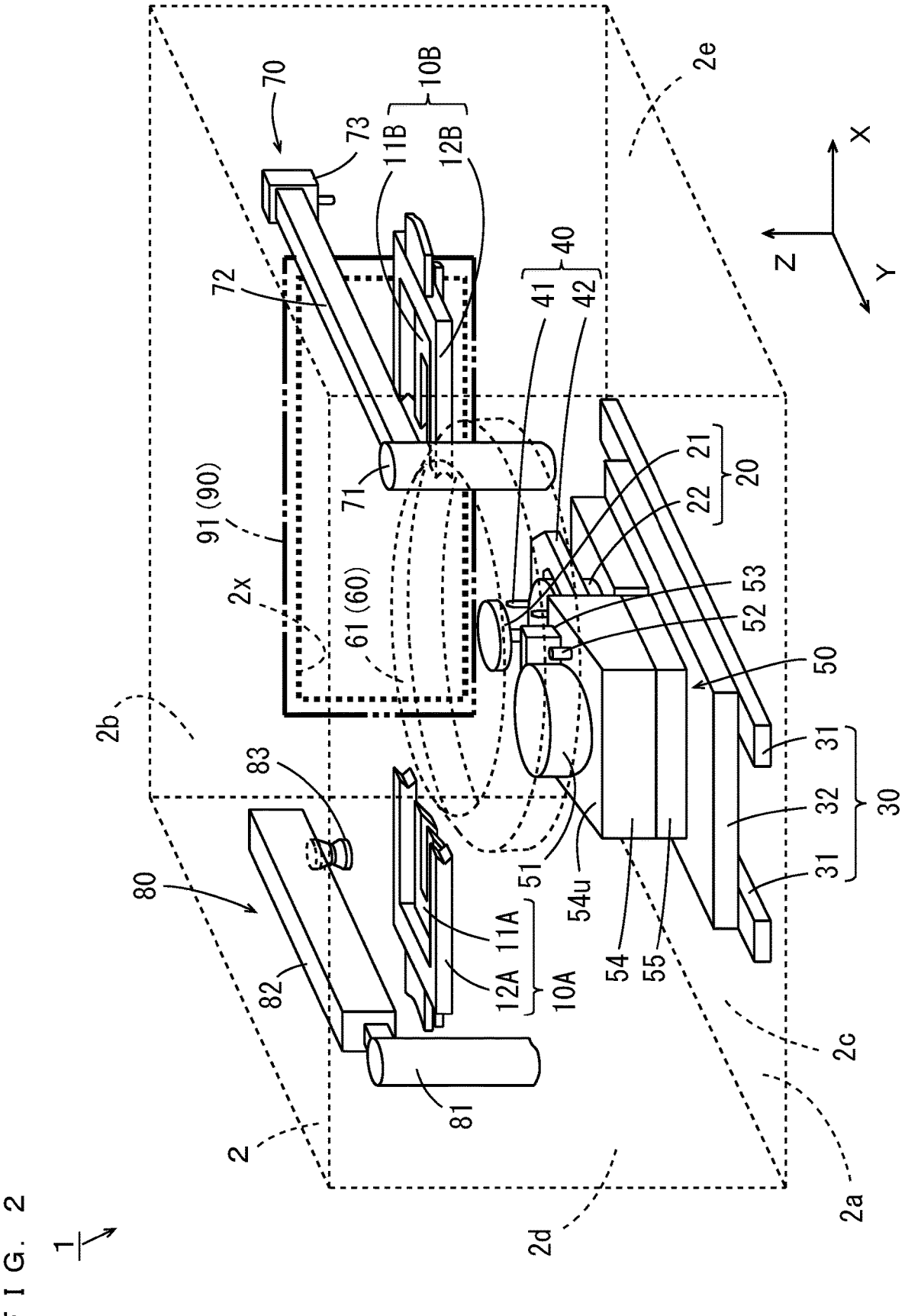

F I G.  3
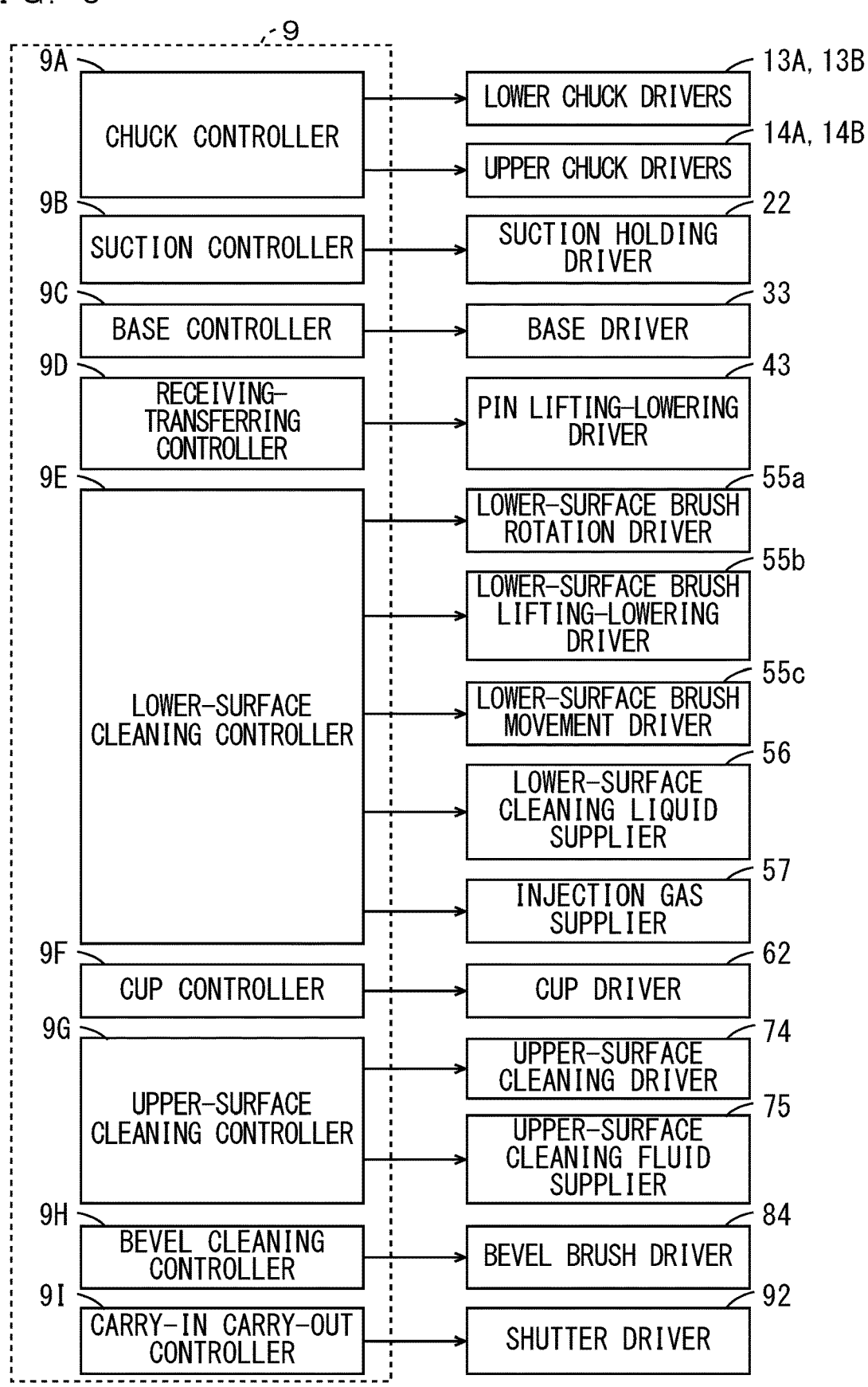

F I G . 4
PLAN VIEW
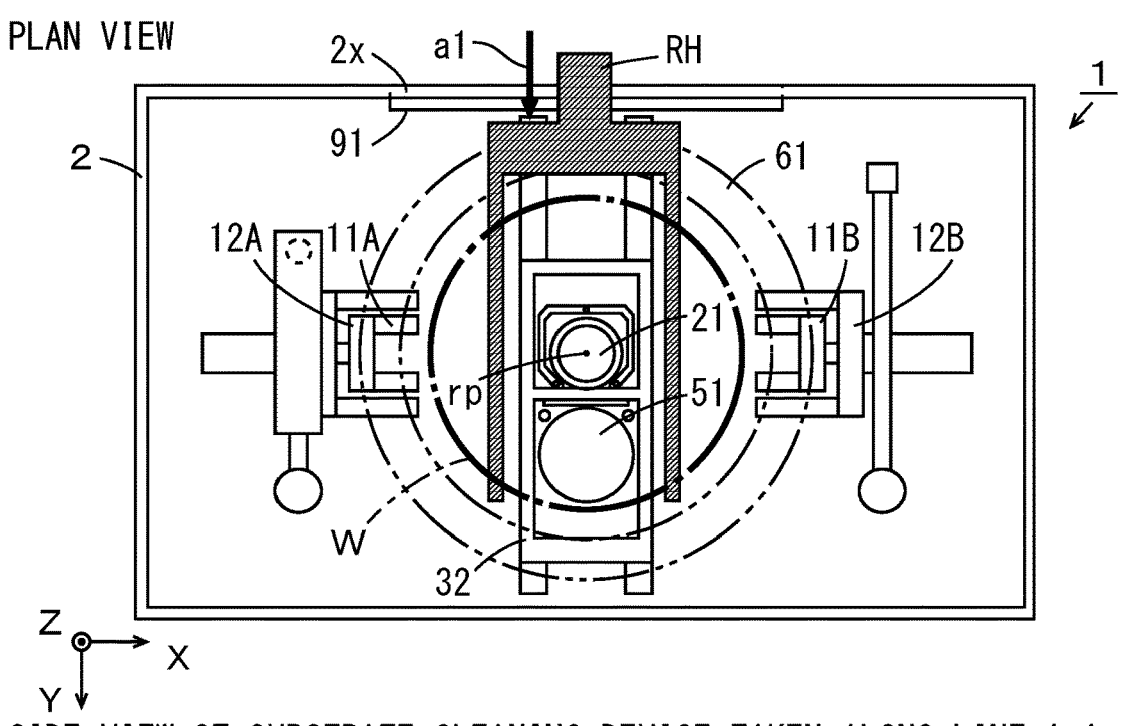
SIDE VIEW OF SUBSTRATE CLEANING DEVICE TAKEN ALONG LINE A-A
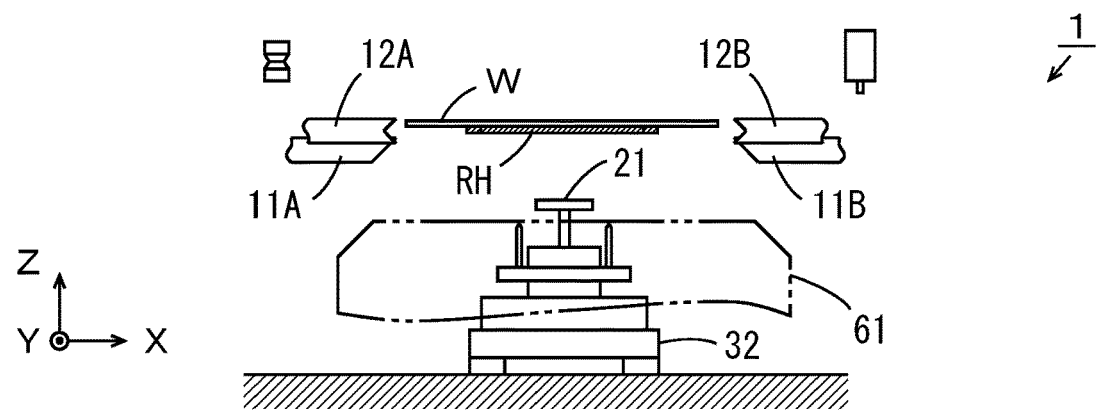
SIDE VIEW OF SUBSTRATE CLEANING DEVICE TAKEN ALONG LINE B-B
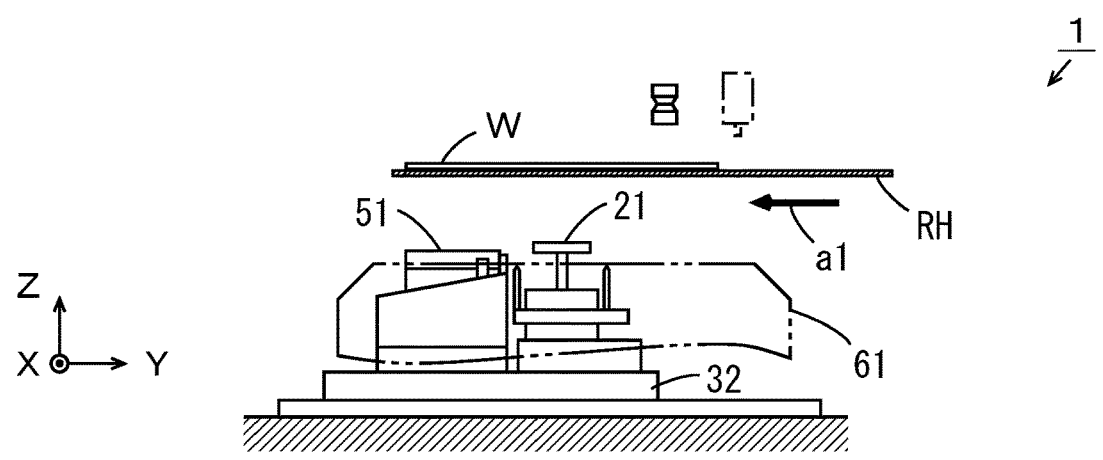

F I G. 5
PLAN VIEW
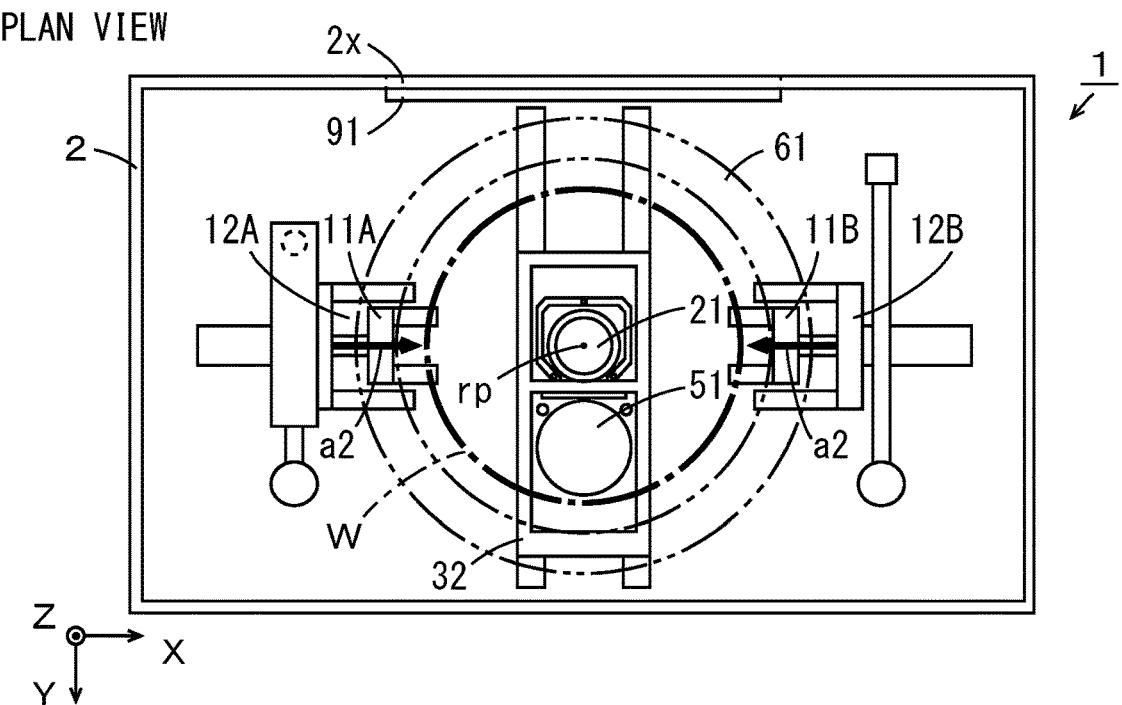
SIDE VIEW OF SUBSTRATE CLEANING DEVICE TAKEN ALONG LINE A-A
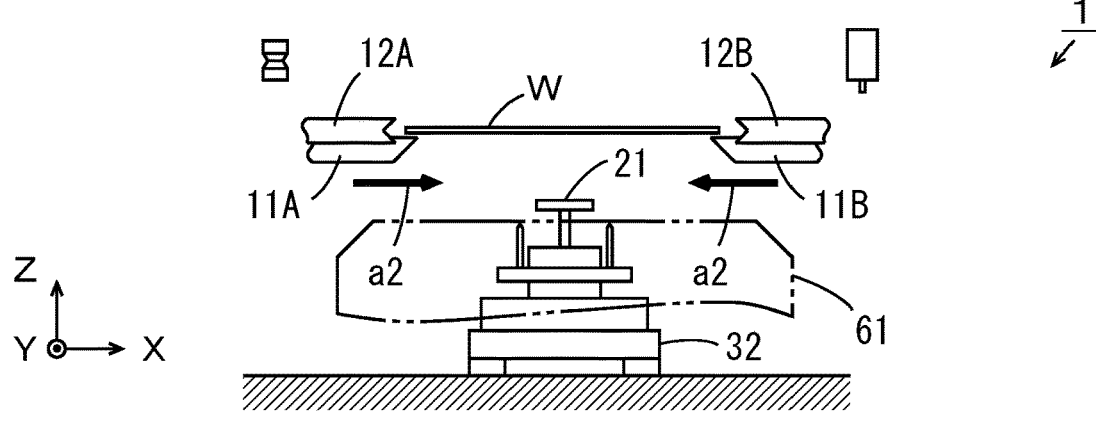
SIDE VIEW OF SUBSTRATE CLEANING DEVICE TAKEN ALONG LINE B-B
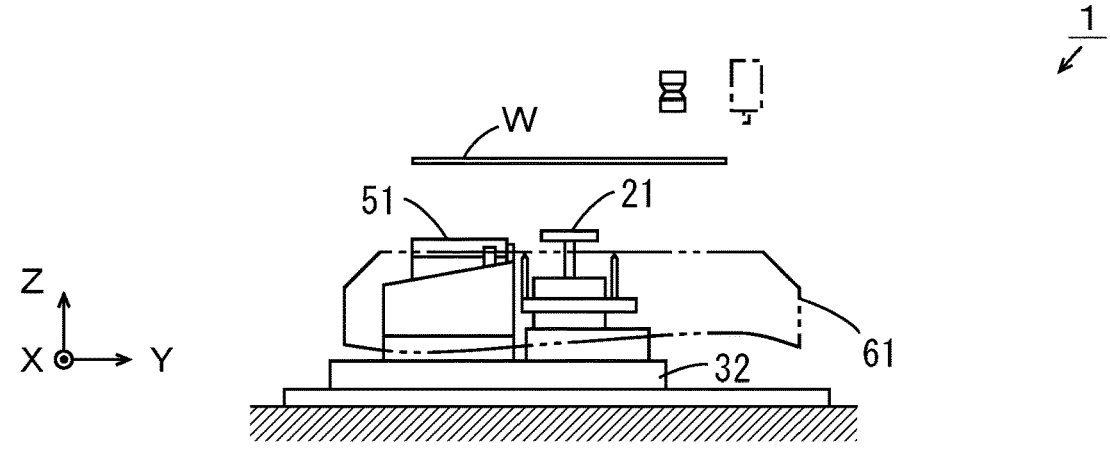

F I G. 6
PLAN VIEW
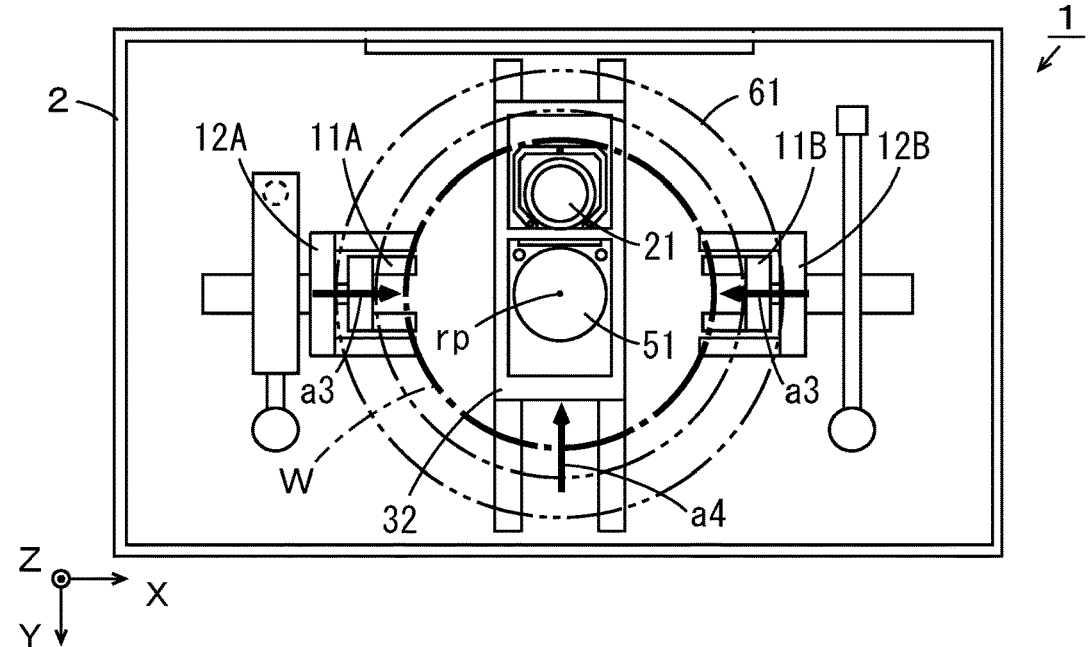
SIDE VIEW OF SUBSTRATE CLEANING DEVICE TAKEN ALONG LINE A-A
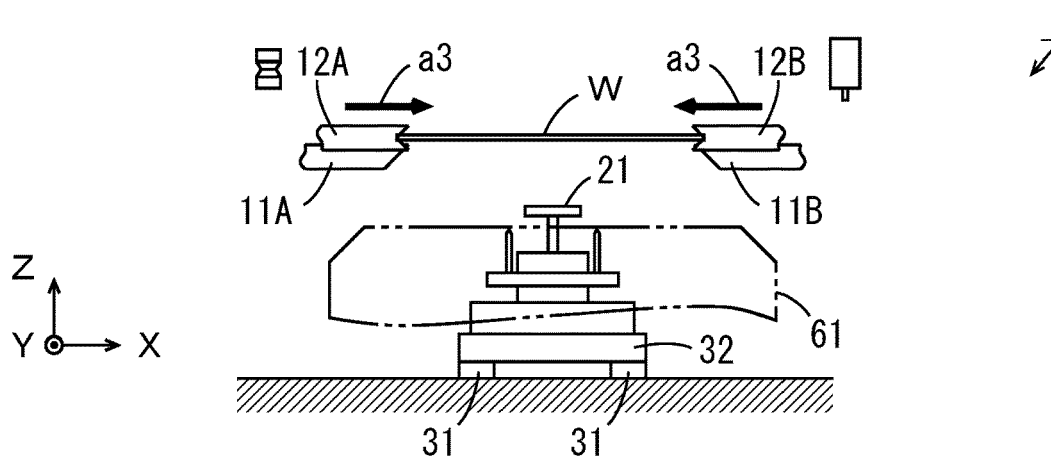
SIDE VIEW OF SUBSTRATE CLEANING DEVICE TAKEN ALONG LINE B-B
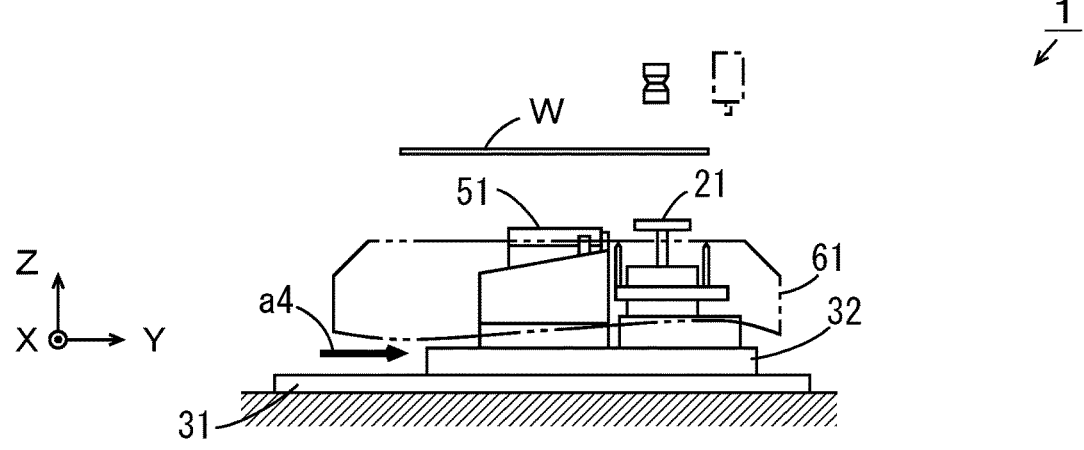

F I G . 7
PLAN VIEW
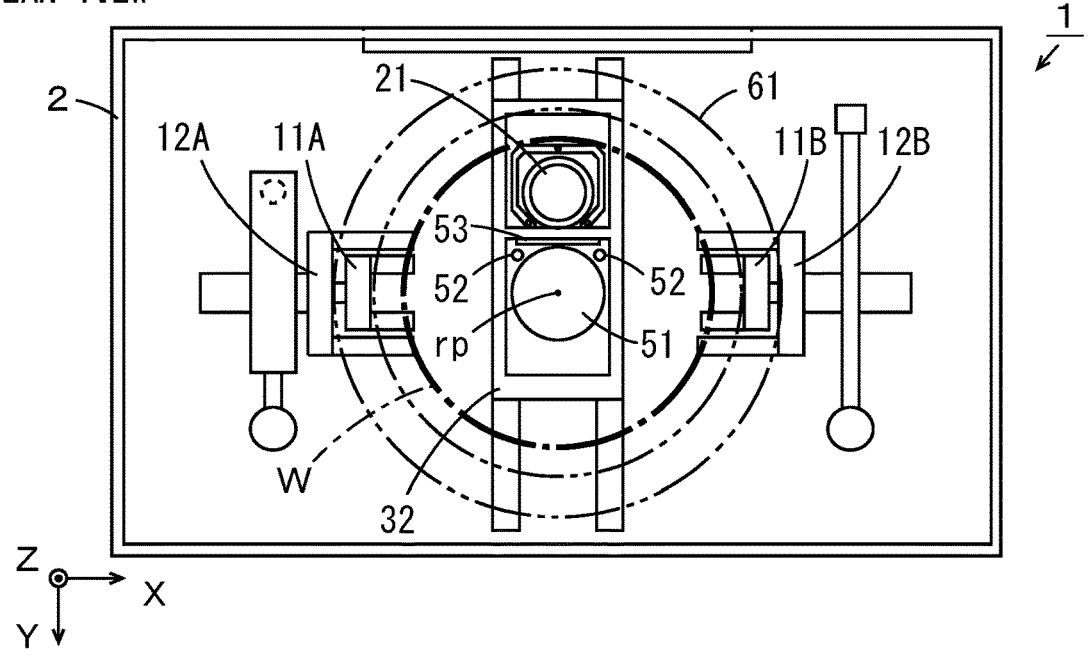
SIDE VIEW OF SUBSTRATE CLEANING DEVICE TAKEN ALONG LINE A-A
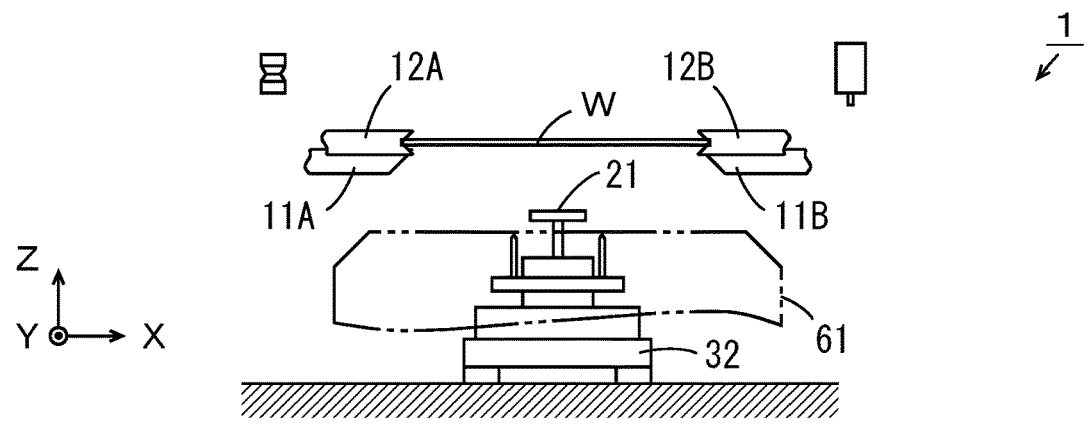
SIDE VIEW OF SUBSTRATE CLEANING DEVICE TAKEN ALONG LINE B-B
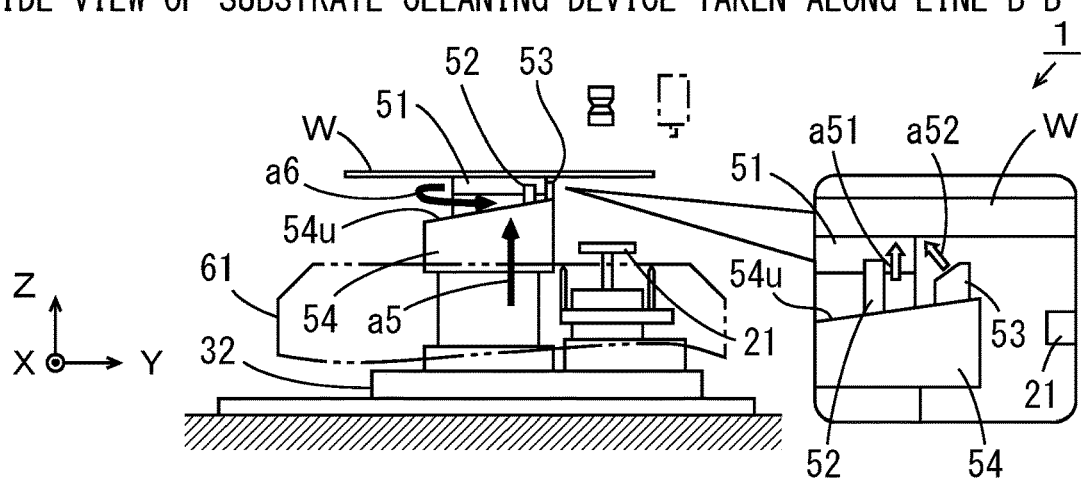

F I G. 8
PLAN VIEW
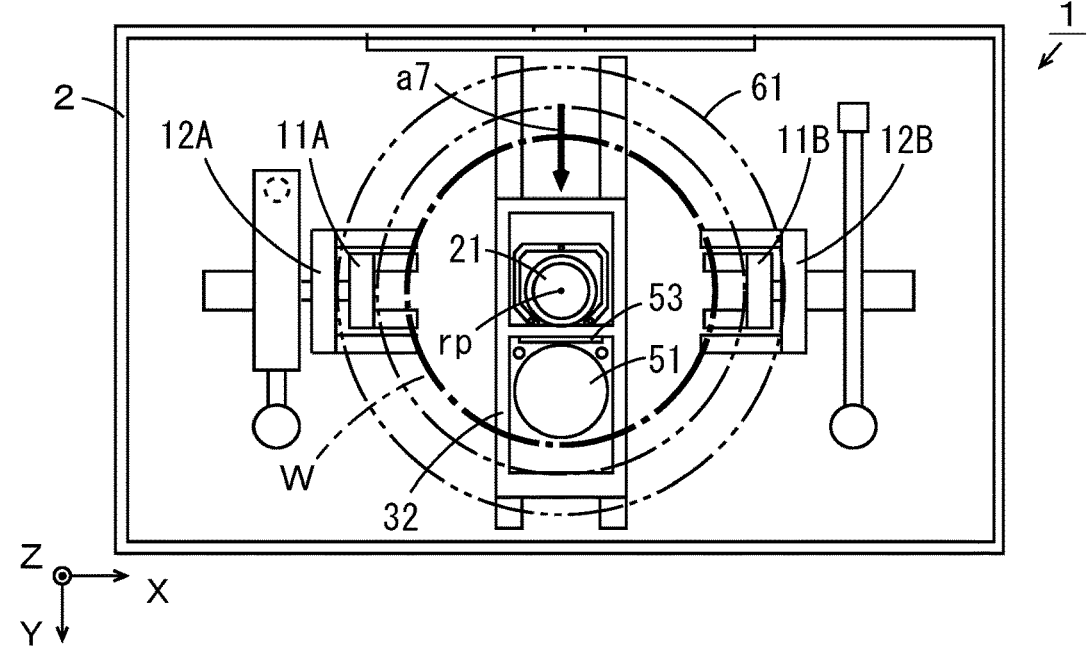
SIDE VIEW OF SUBSTRATE CLEANING DEVICE TAKEN ALONG LINE A-A
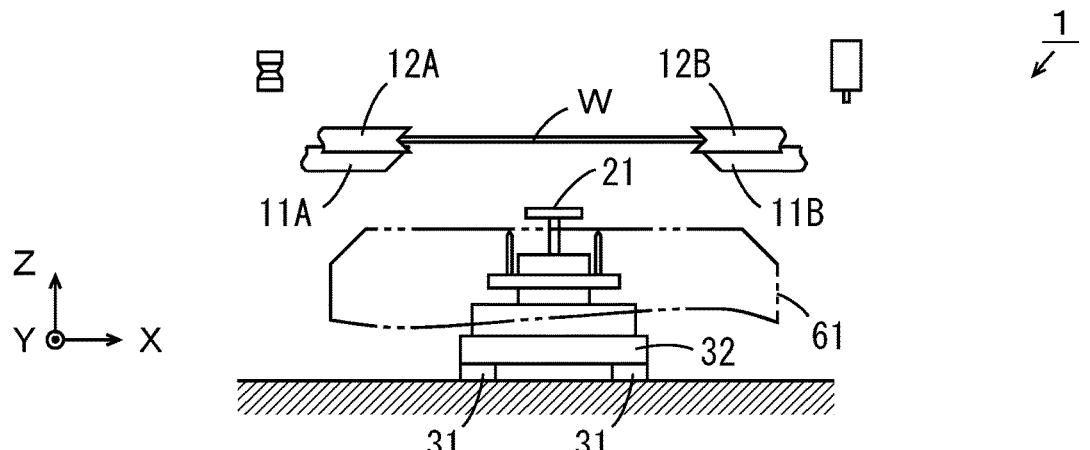
SIDE VIEW OF SUBSTRATE CLEANING DEVICE TAKEN ALONG LINE B-B
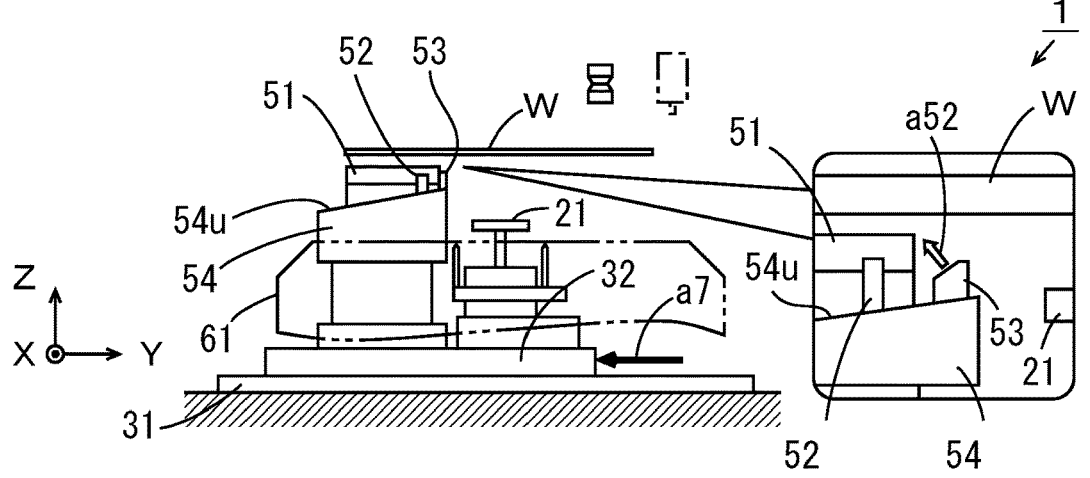

FIG. 9
PLAN VIEW
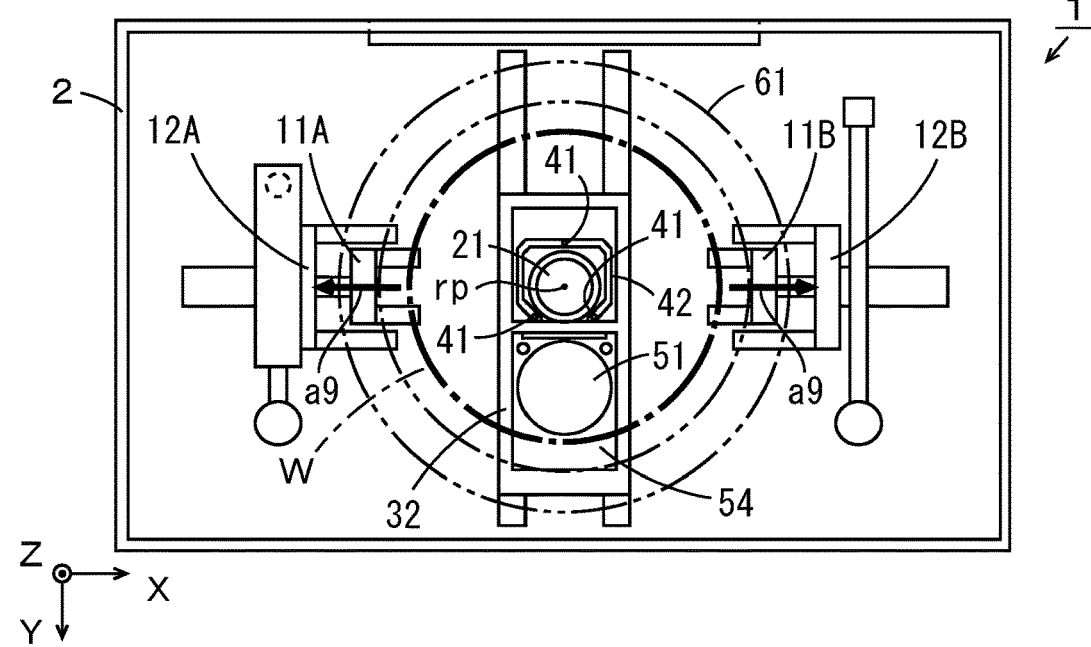
SIDE VIEW OF SUBSTRATE CLEANING DEVICE TAKEN ALONG LINE A-A
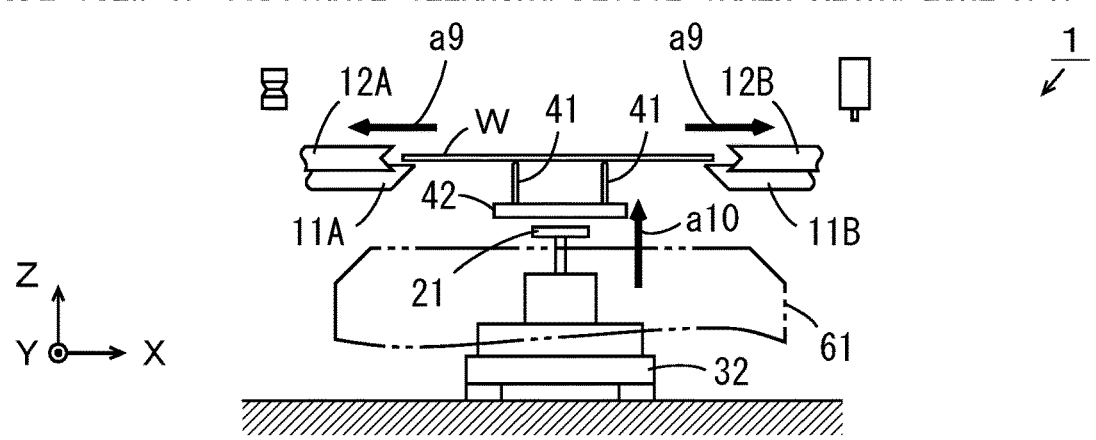
SIDE VIEW OF SUBSTRATE CLEANING DEVICE TAKEN ALONG LINE B-B
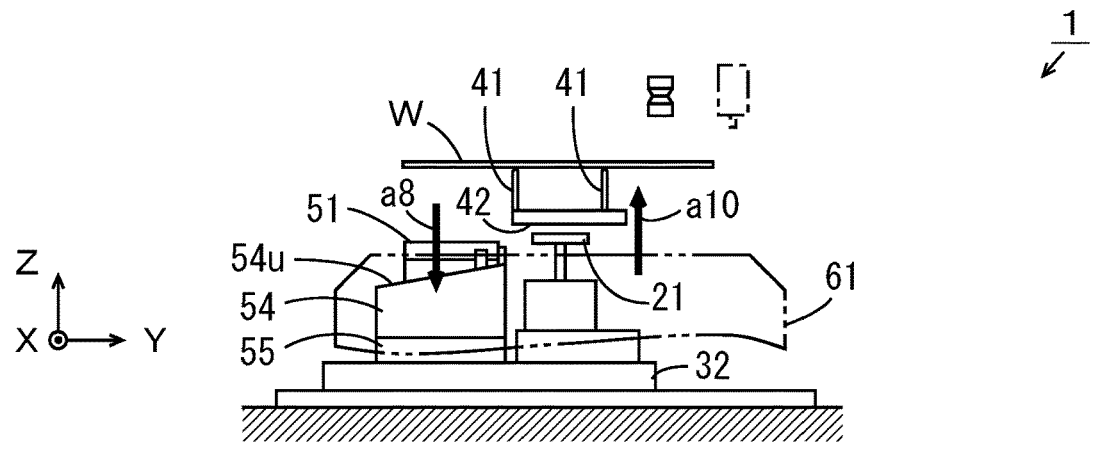

F I G. 1 0
PLAN VIEW
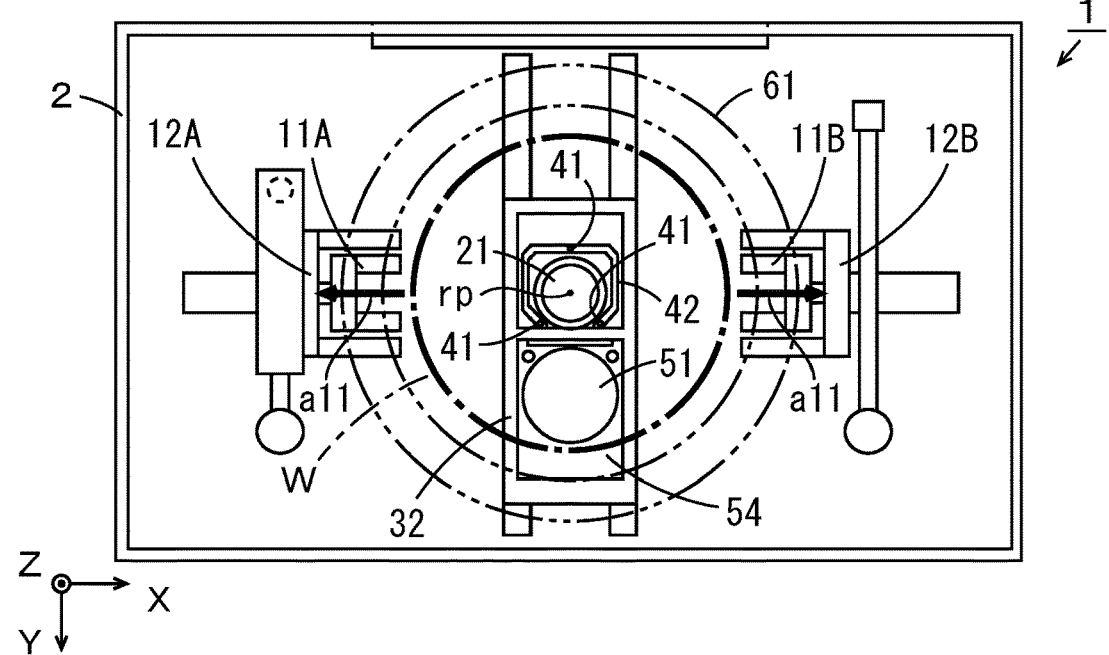
SIDE VIEW OF SUBSTRATE CLEANING DEVICE TAKEN ALONG LINE A-A
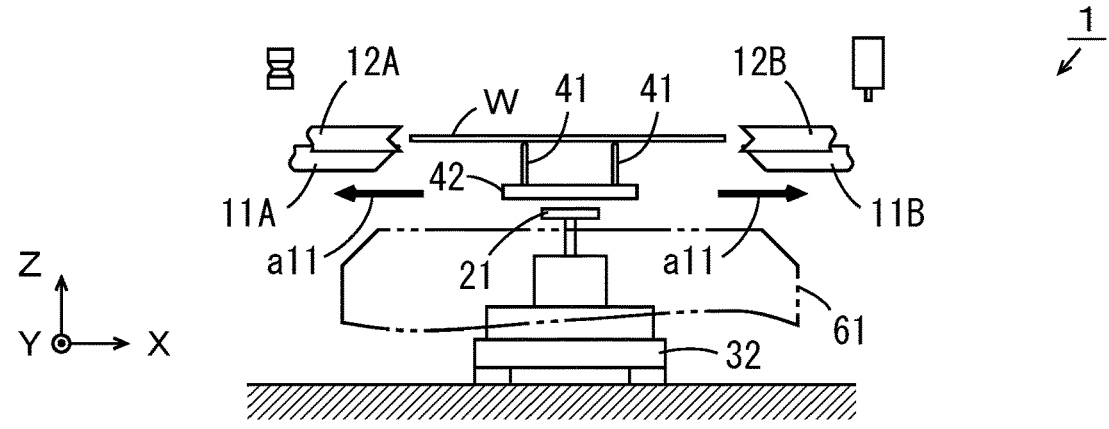
SIDE VIEW OF SUBSTRATE CLEANING DEVICE TAKEN ALONG LINE B-B
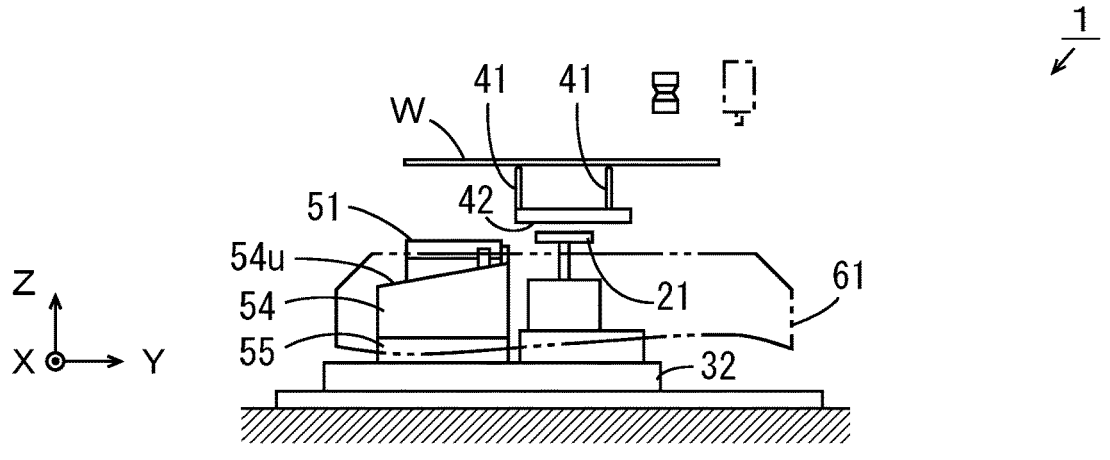

F I G. 1 1
PLAN VIEW
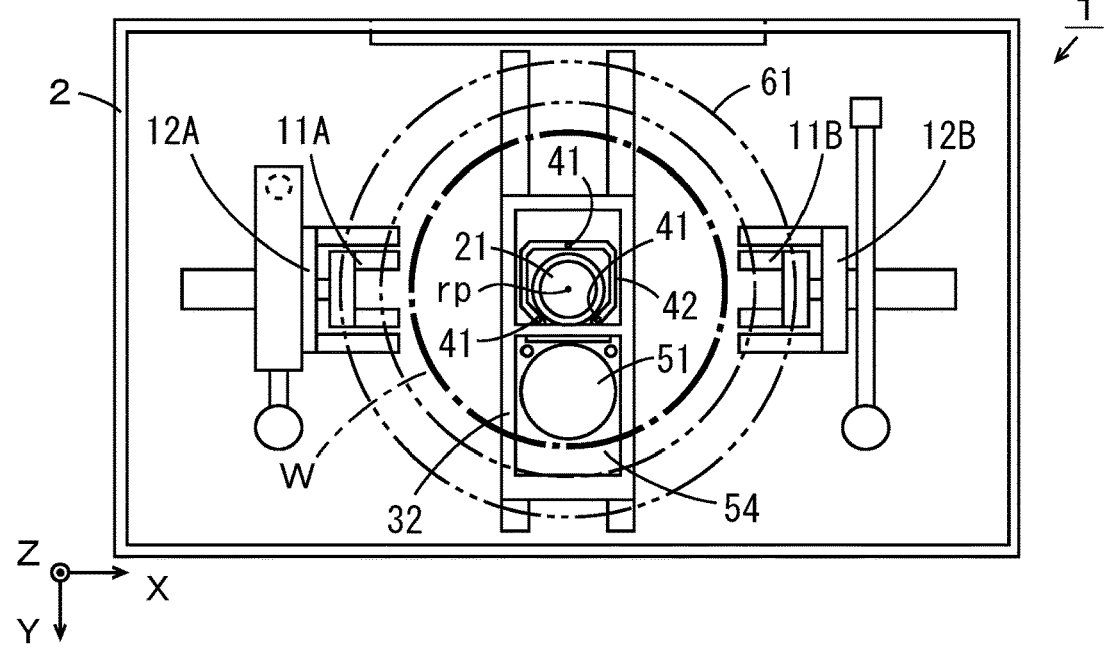
SIDE VIEW OF SUBSTRATE CLEANING DEVICE TAKEN ALONG LINE A-A
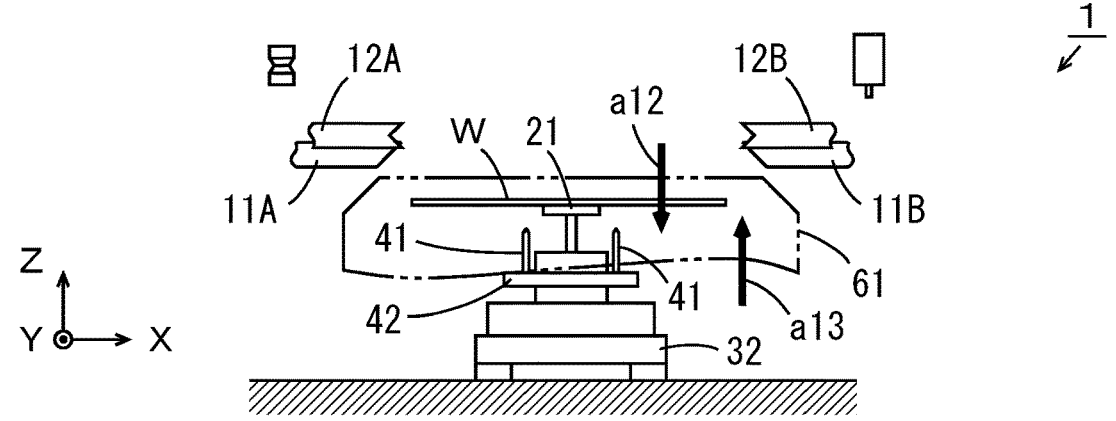
SIDE VIEW OF SUBSTRATE CLEANING DEVICE TAKEN ALONG LINE B-B
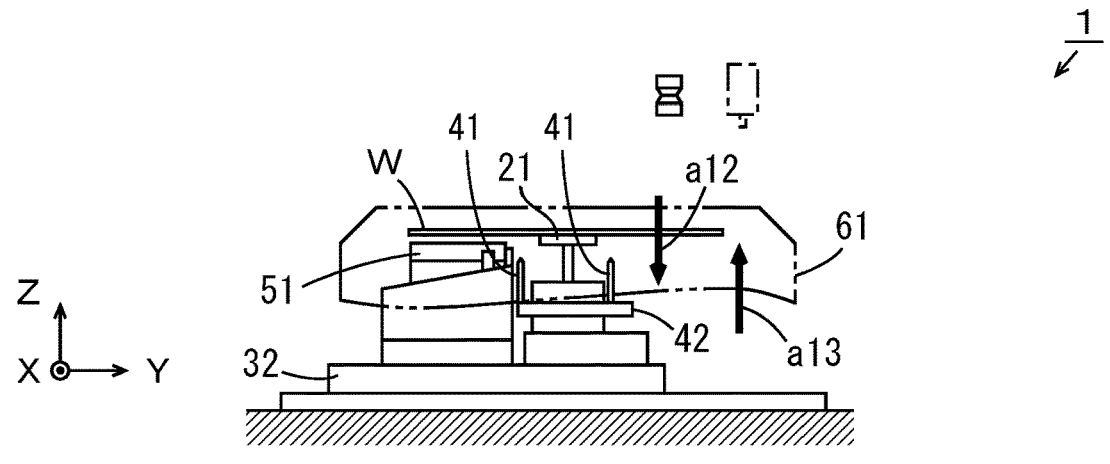

F I G. 1 2
PLAN VIEW
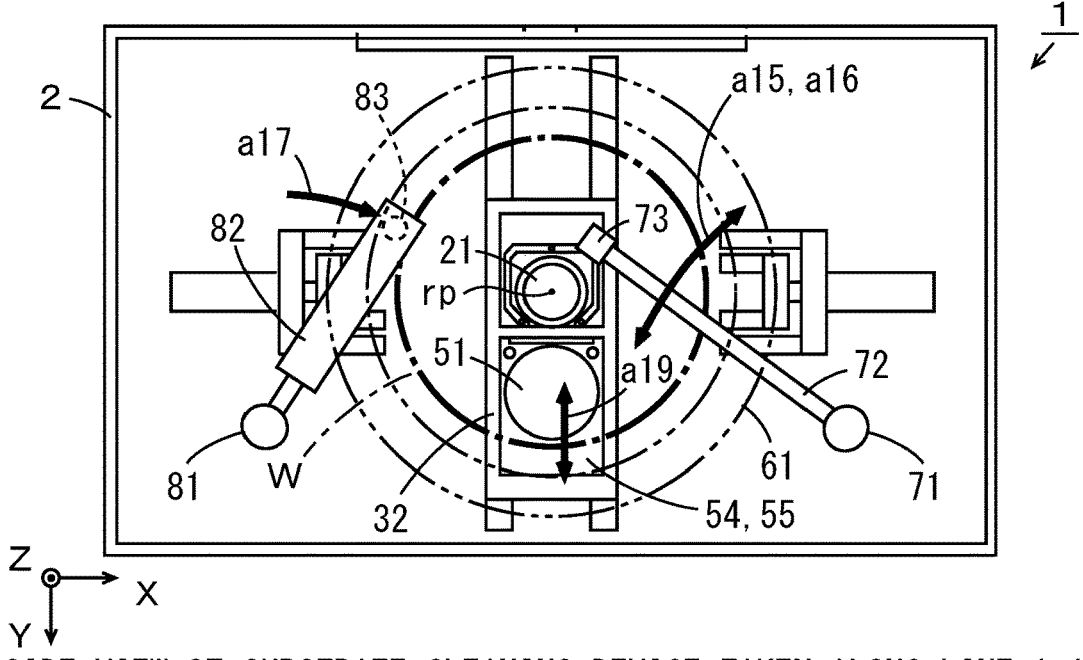
SIDE VIEW OF SUBSTRATE CLEANING DEVICE TAKEN ALONG LINE A-A
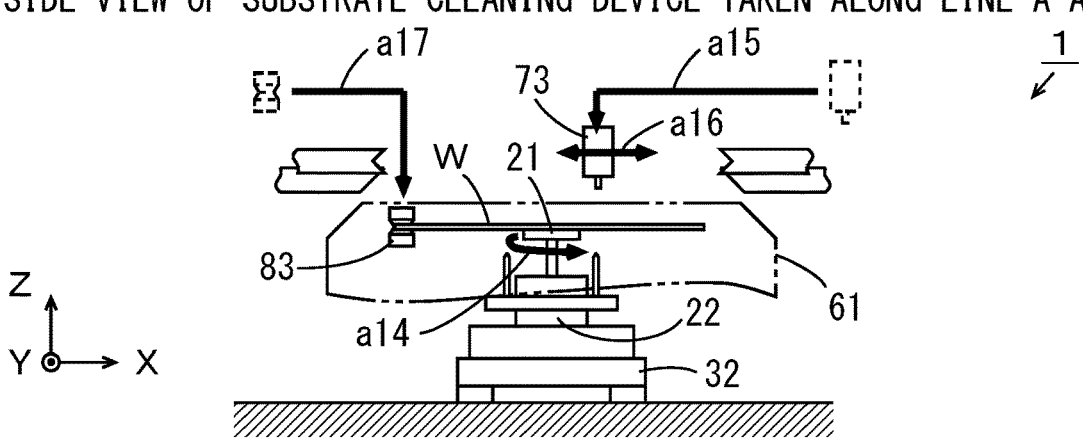
SIDE VIEW OF SUBSTRATE CLEANING DEVICE TAKEN ALONG LINE B-B
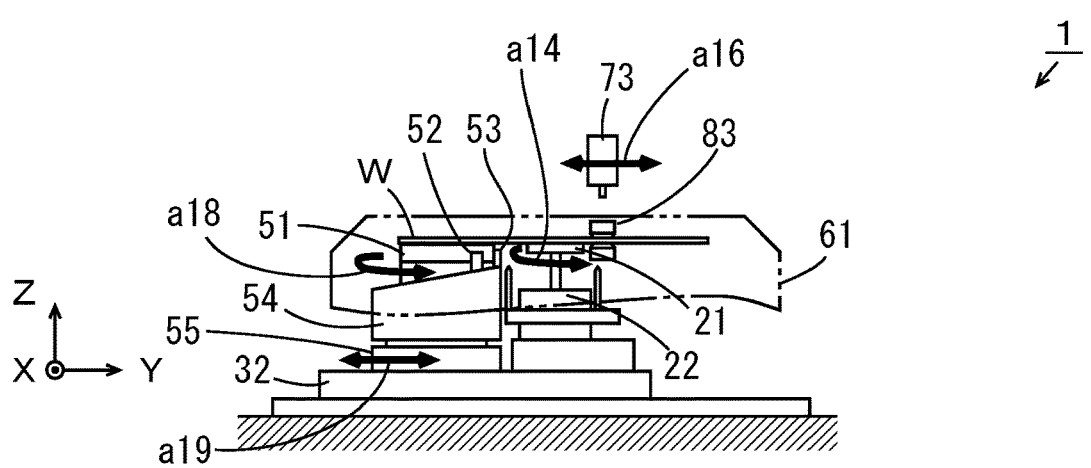

FIG. 13
PLAN VIEW
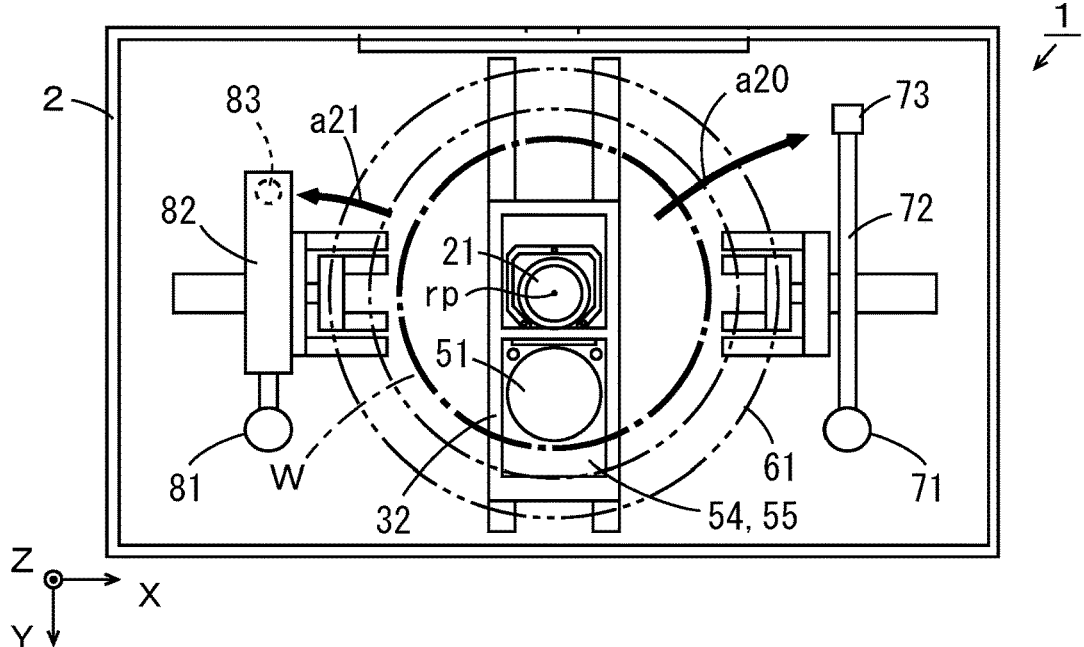
SIDE VIEW OF SUBSTRATE CLEANING DEVICE TAKEN ALONG LINE A-A
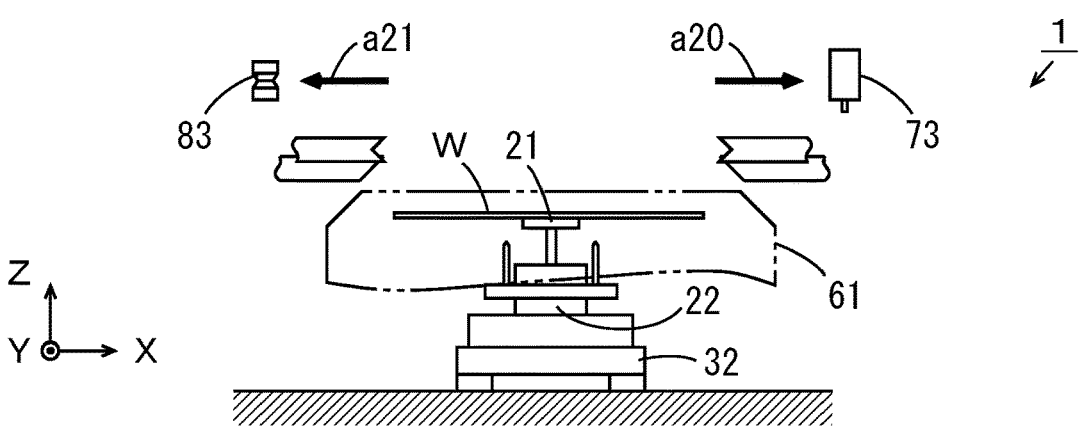
SIDE VIEW OF SUBSTRATE CLEANING DEVICE TAKEN ALONG LINE B-B
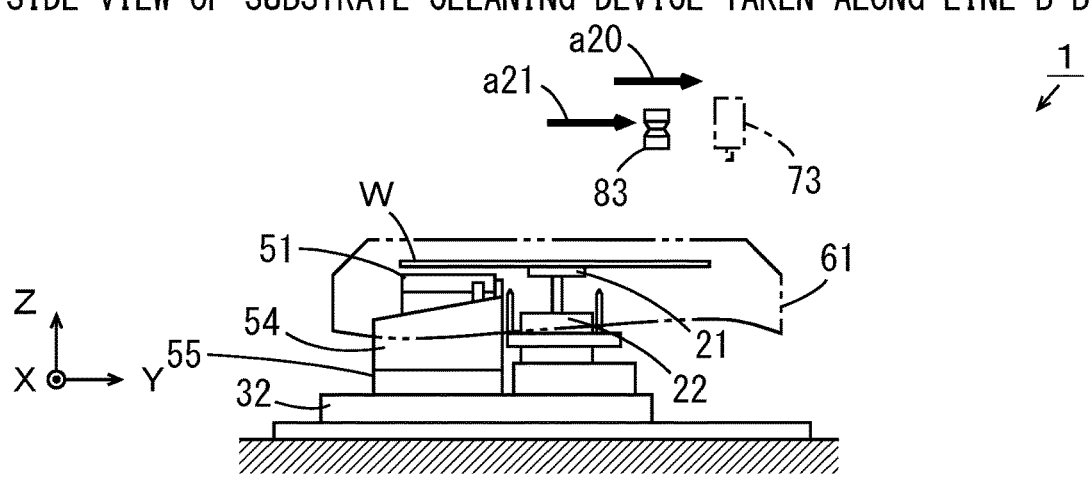

FIG. 14
PLAN VIEW
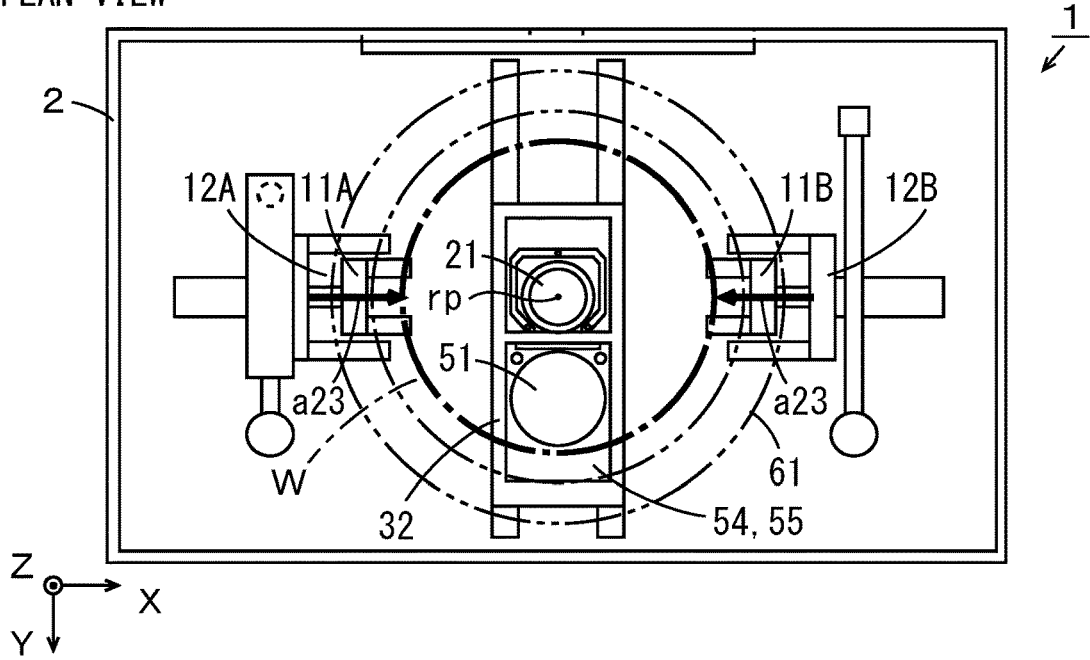
SIDE VIEW OF SUBSTRATE CLEANING DEVICE TAKEN ALONG LINE A-A
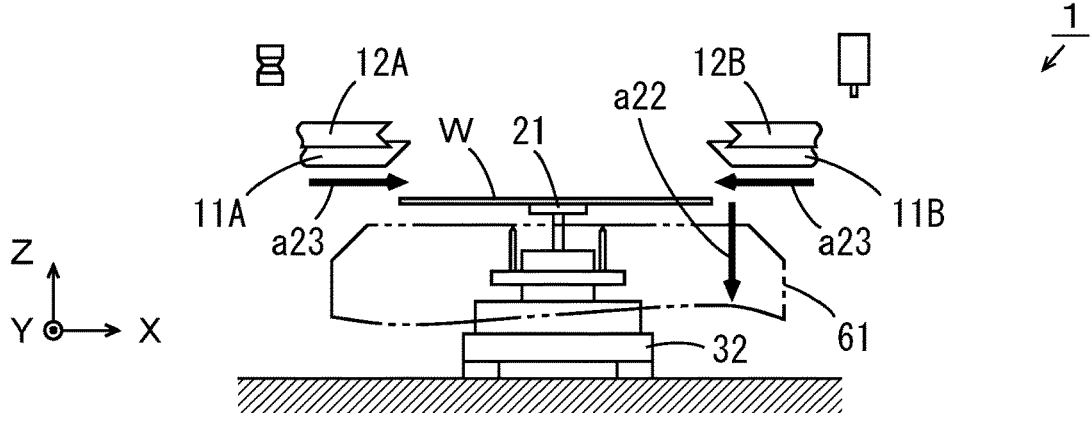
SIDE VIEW OF SUBSTRATE CLEANING DEVICE TAKEN ALONG LINE B-B
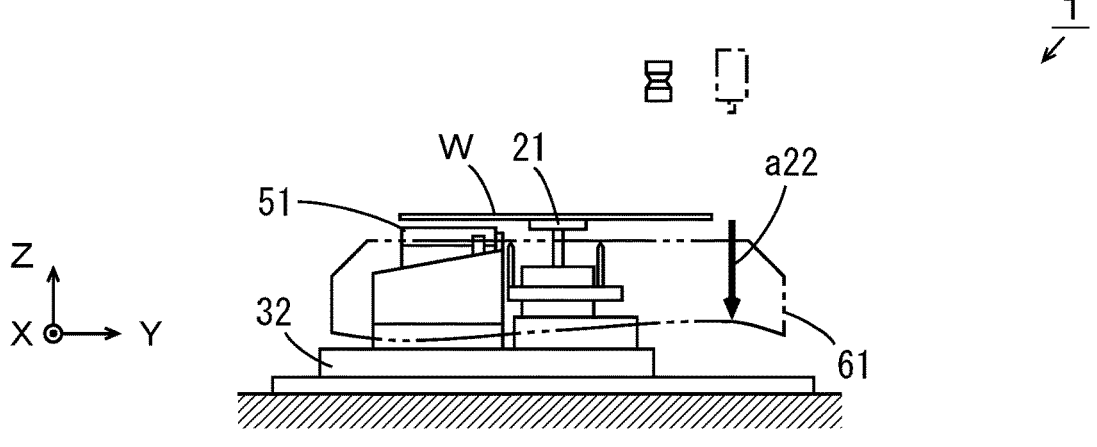

F I G. 1 5
PLAN VIEW
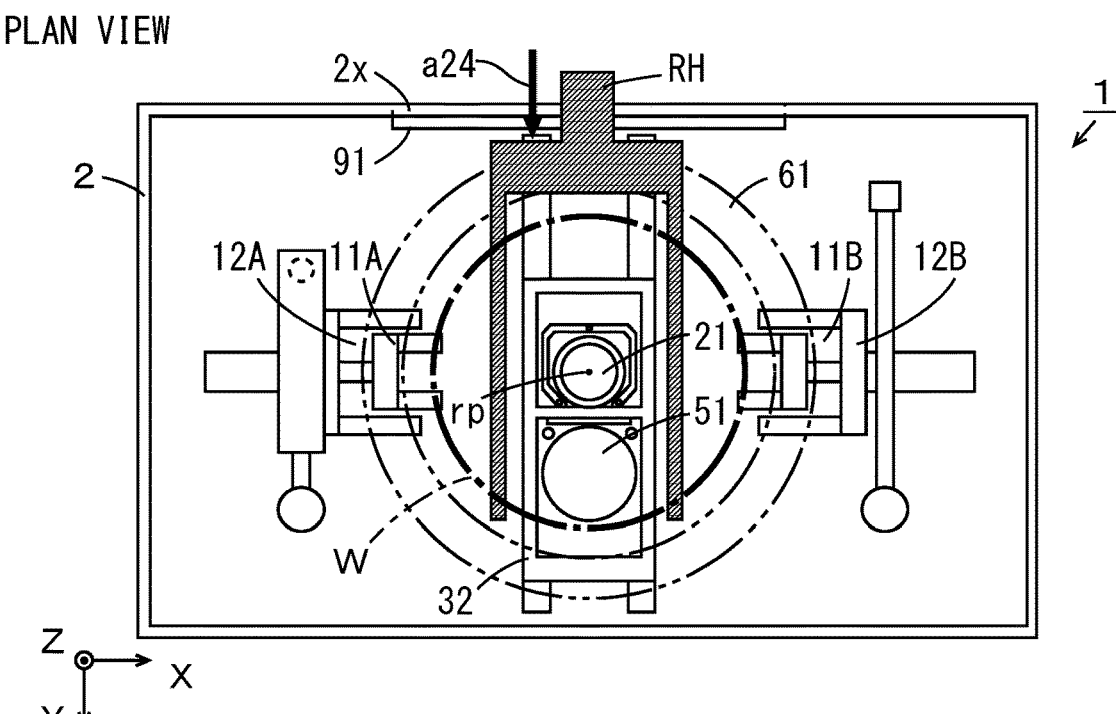
SIDE VIEW OF SUBSTRATE CLEANING DEVICE TAKEN ALONG LINE A-A
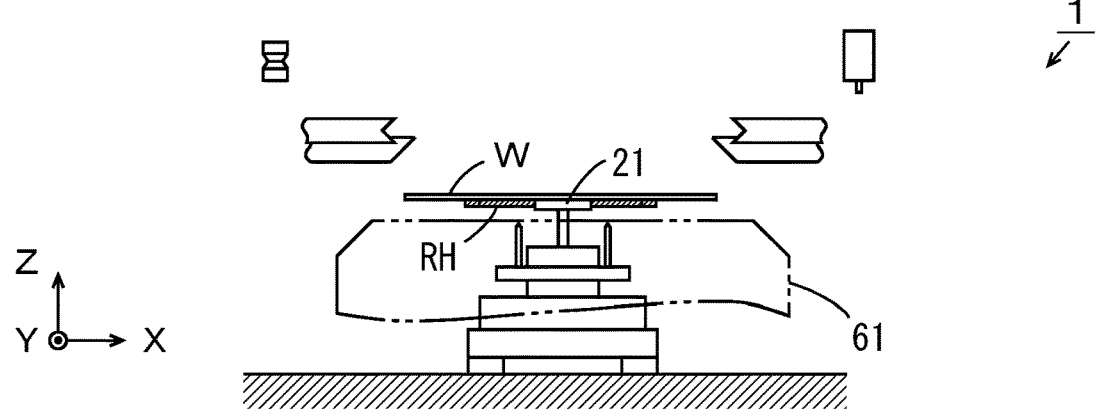
SIDE VIEW OF SUBSTRATE CLEANING DEVICE TAKEN ALONG LINE B-B
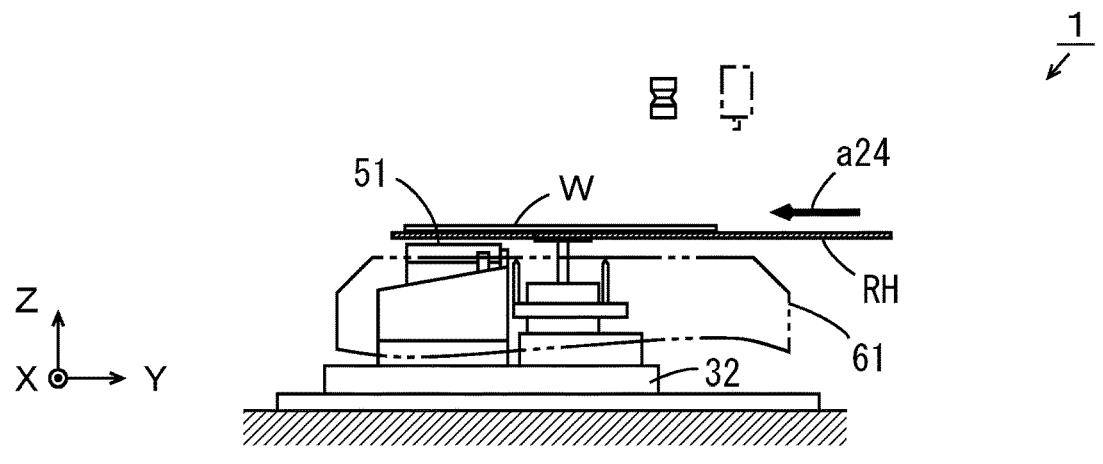

F I G.  1 6
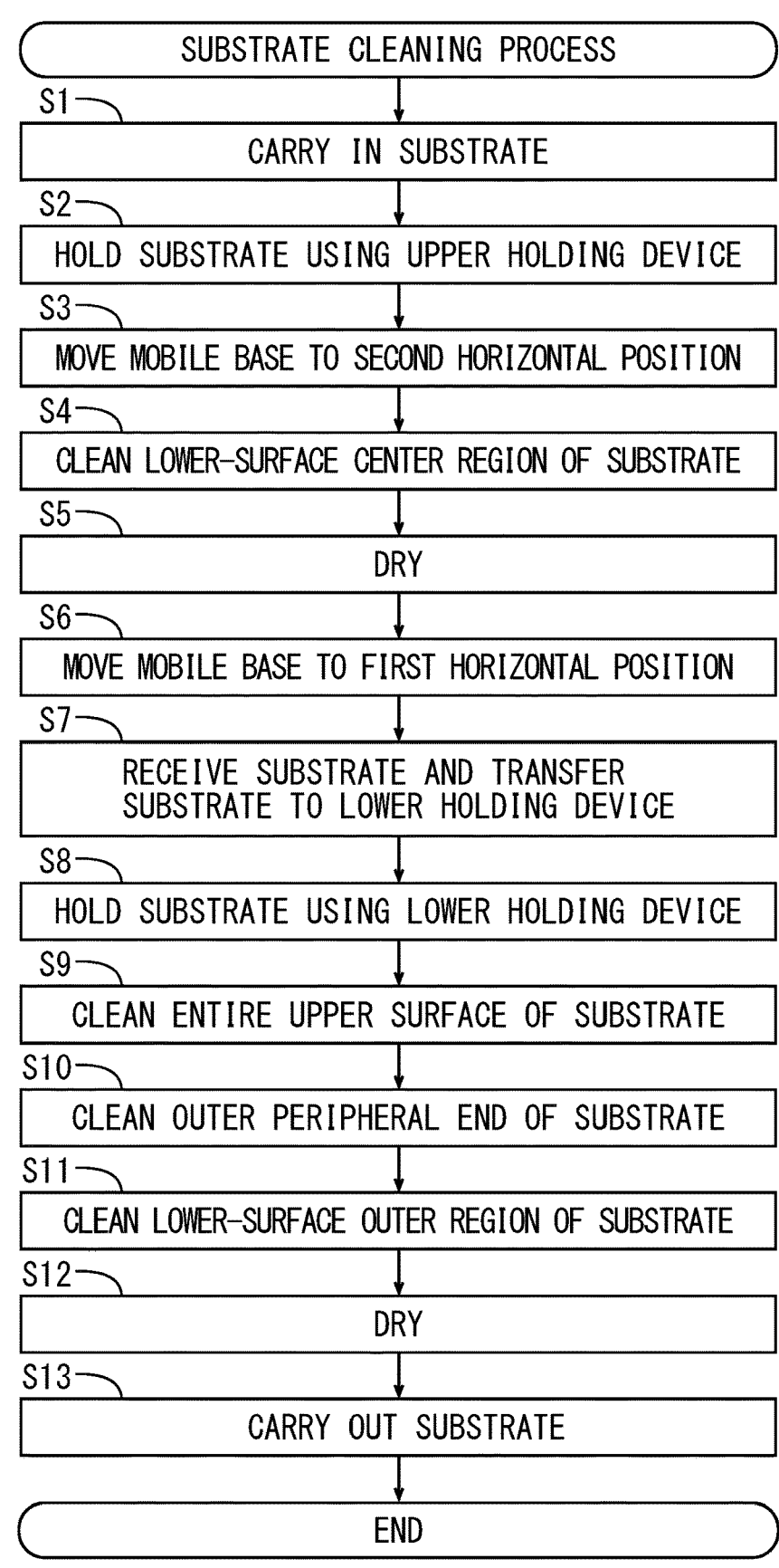

F I G.  1 7
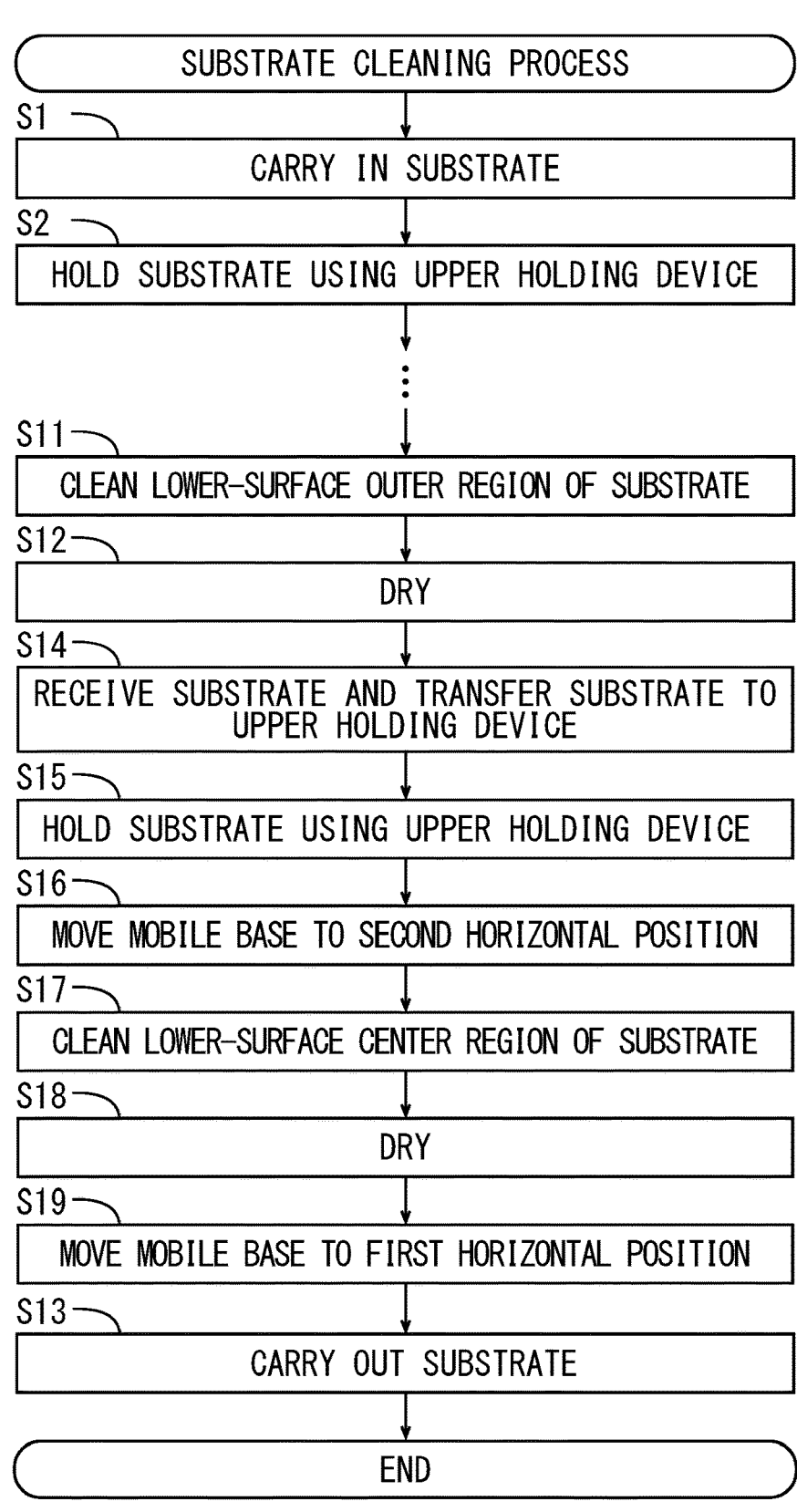

F I G. 1 8
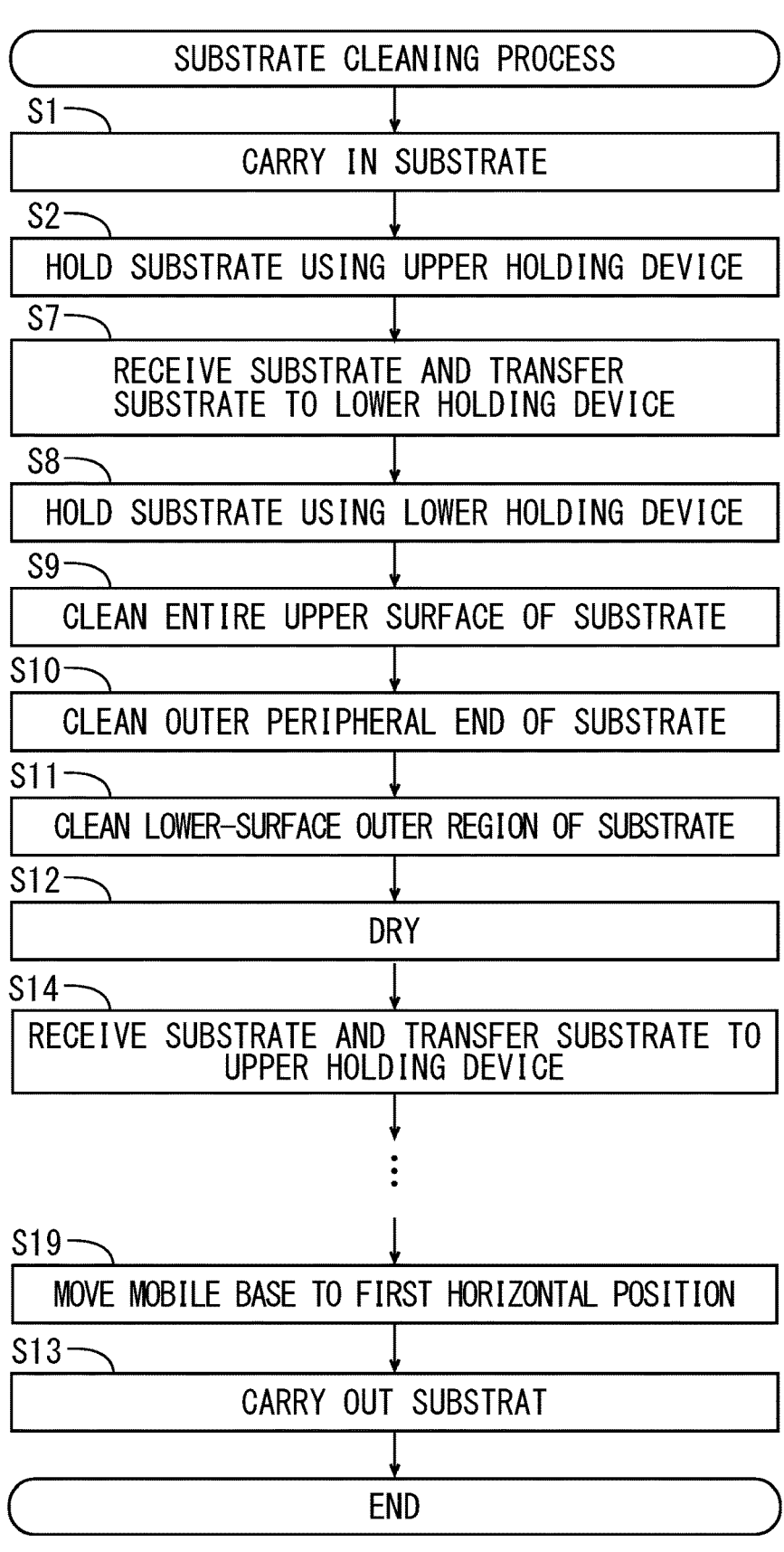

F I G .  1 9
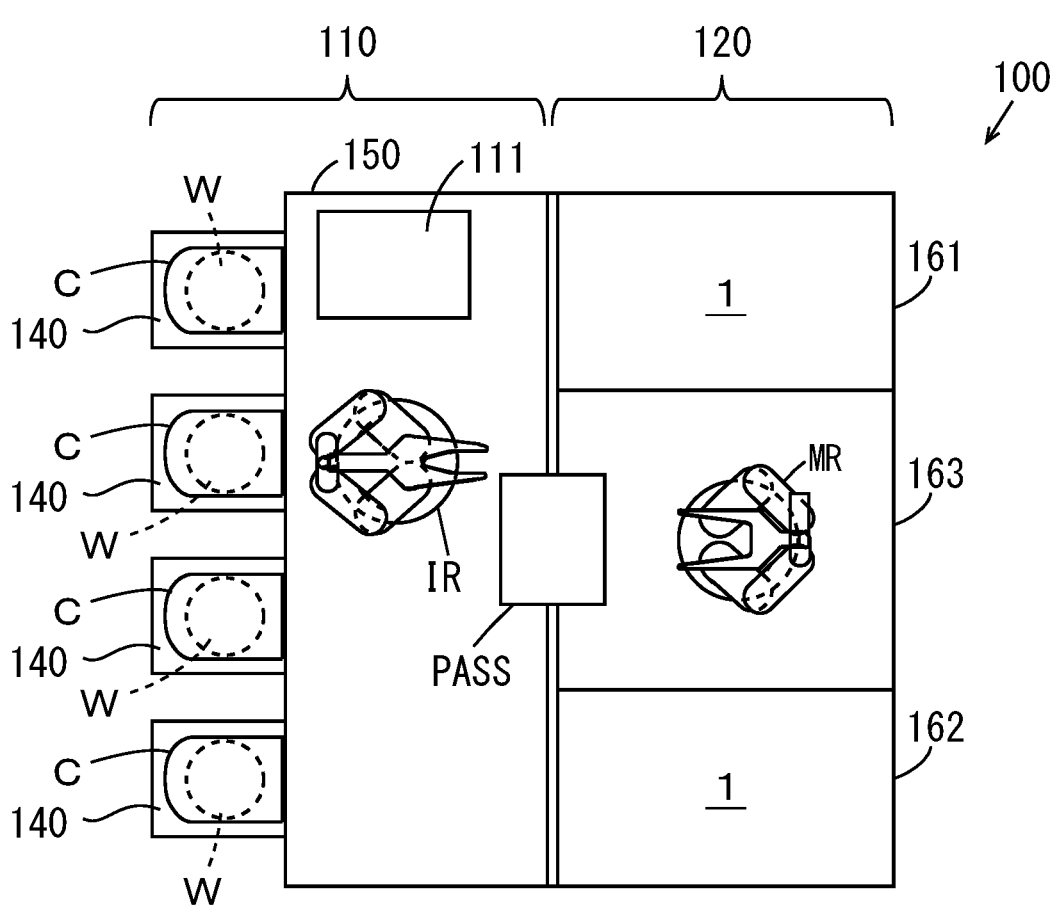

F I G.  2 0
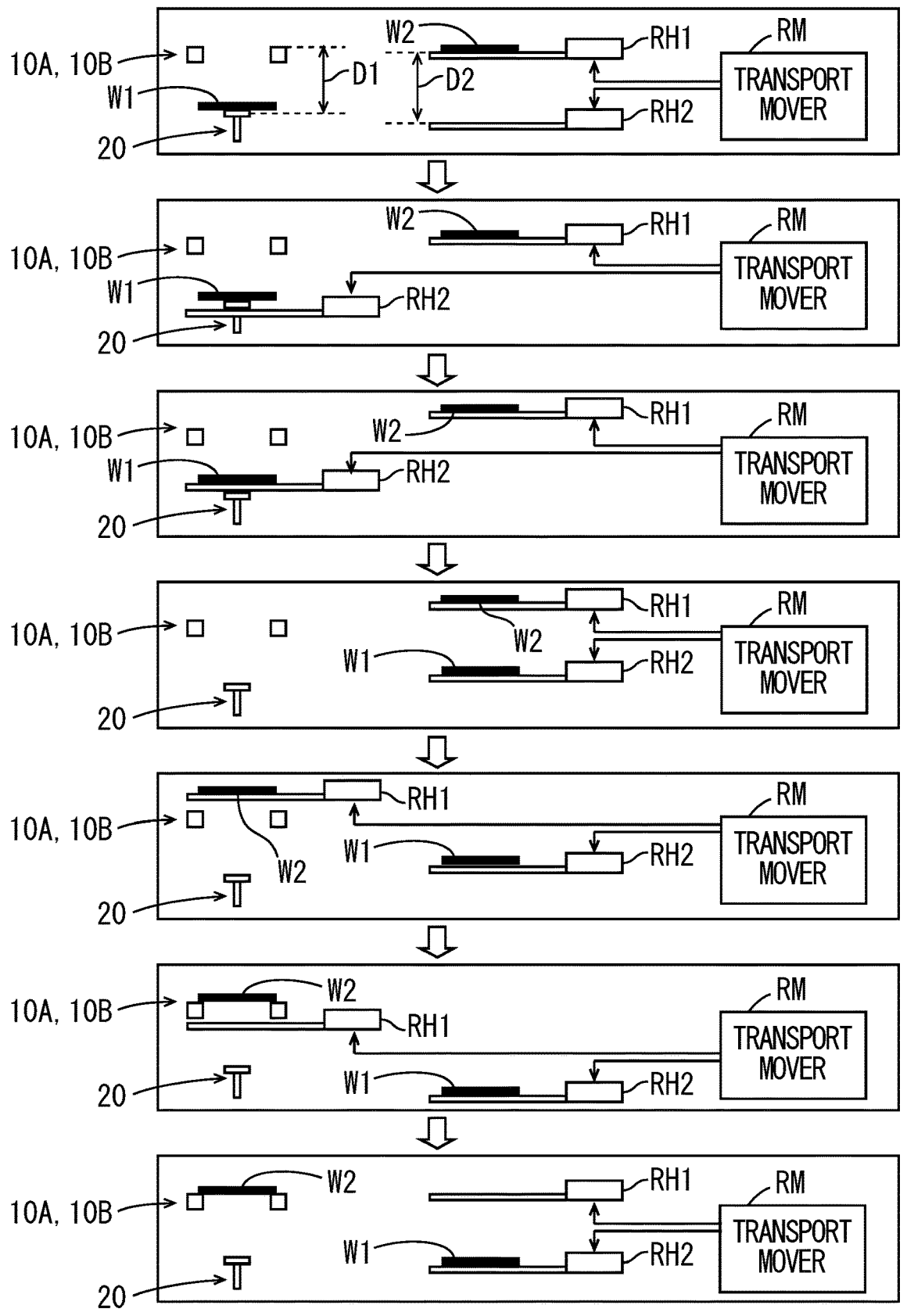

SUBSTRATE CLEANING DEVICE, SUBSTRATE PROCESSING APPARATUS AND SUBSTRATE CLEANING METHOD

BACKGROUND

Technical Field

The present invention relates to a substrate cleaning device, a substrate processing apparatus and a substrate cleaning method for performing a predetermined process on a substrate.

Description of Related Art

A substrate processing apparatus is used to perform various processes on various substrates such as a substrate for an FPD (Flat Panel Display) that is used for a liquid crystal display device, an organic EL (Electro Luminescence) display device or the like, a semiconductor substrate, a substrate for an optical disc, a substrate for a magnetic disc, a substrate for a magneto-optical disc, a substrate for a photomask, a ceramic substrate or a substrate for a solar cell. A substrate cleaning device is used to clean a substrate. A substrate cleaning device described in JP 5904169 B2 includes two suction pads for holding a back-surface peripheral portion of a wafer, a spin chuck for holding a back-surface center portion of the wafer and a brush for cleaning a back surface of the wafer. The two suction pads hold the wafer and move in a transverse direction. In this state, the back-surface center portion of the wafer is cleaned by the brush. Thereafter, the spin chuck receives the wafer from the suction pads. Further, the spin chuck rotates while holding the back-surface center portion of the wafer. In this state, the back-surface peripheral portion of the wafer is cleaned by the brush.

SUMMARY

It is required to reduce the size of the substrate cleaning device in order to reduce an installation space (footprint) occupied by the substrate cleaning device in a clean room. However, in the above-mentioned substrate cleaning device, when the wafer is moved in the transverse direction, a relatively large member (an upper cup, specifically) surrounding the wafer is also moved in the transverse direction together with the wafer. Therefore, it is difficult to reduce the size of the substrate cleaning device in a horizontal direction.

An object of the present invention is to provide a substrate cleaning device and a substrate cleaning method that enable an entire lower surface of a substrate to be cleaned while an increase in footprint is reduced.

Further, the above-mentioned upper cup is used to receive a cleaning liquid splashed from the wafer when the wafer is cleaned. Therefore, in a case where the upper cup is removed for reduction in size of the substrate cleaning device disclosed in JP 5904169 B2, the cleaning liquid including contaminants cannot be prevented from being splashed. In this case, high cleanliness of the substrate clean device cannot be maintained.

Another object of the present invention is to provide a substrate cleaning device and a substrate processing apparatus including the substrate cleaning device that enable an entire lower surface of a substrate to be cleaned while an increase in footprint is reduced, and enable to maintain high cleanliness.

(1) A substrate cleaning device according to one aspect of the present invention includes a first substrate holder that holds an outer peripheral end of a substrate, a second substrate holder that holds a lower-surface center portion of the substrate by suction at a position farther downward than the first substrate holder, a mover that moves the substrate between the first substrate holder and the second substrate holder, a cleaning tool that comes into contact with a lower surface of the substrate to clean the lower surface of the substrate, a cleaning tool lifter-lowerer that supports the cleaning tool from below, and lifts or lowers the cleaning tool between a first cleaning height position at which the cleaning tool comes into contact with the lower surface of the substrate held by the first substrate holder and a second cleaning height position at which the cleaning tool comes into contact with the lower surface of the substrate held by the second substrate holder, a rotation driver that supports the second substrate holder from below and rotates the second substrate holder about an axis extending in an up-and-down direction, a base portion that supports the cleaning tool lifter-lowerer and the rotation driver such that the cleaning tool and the second substrate holder are spaced apart from each other in a plan view, and a base mover that moves the base portion between a first horizontal position at which the second substrate holder is opposite to the lower-surface center portion of the substrate and the cleaning tool is opposite to the lower-surface outer region surrounding the lower-surface center portion of the substrate, and a second horizontal position at which the second substrate holder is opposite to the lower-surface outer region of the substrate and the cleaning tool is opposite to the lower-surface center portion of the substrate, with the substrate held by the first substrate holder.

In the substrate cleaning device, the base portion is moved to the second horizontal position with the outer peripheral end of the substrate held by the first substrate holder. With the base portion in the second horizontal position, the second substrate holder is opposite to the lower-surface outer region of the substrate, and the cleaning tool is opposite to the lower-surface center portion of the substrate. In this case, the cleaning tool lifter-lowerer lifts or lowers the cleaning tool to the first height position, so that the lower-surface center portion of the substrate held by the first substrate holder can be cleaned by the cleaning tool.

On the other hand, with the outer peripheral end of the substrate held by the first substrate holder, the base portion is moved to the first horizontal position. With the base portion in the first horizontal position, the second substrate holder is opposite to the lower-surface center portion of the substrate, and the cleaning tool is opposite to the lower-surface outer region of the substrate. In this case, the mover moves the substrate from the first substrate holder to the second substrate holder, whereby it is possible to hold the lower-surface center portion of the substrate by suction by the second substrate holder without requiring movement of the substrate in the horizontal direction. At this time, the second substrate holder is rotated about the axis extending in the up-and-down direction, and the cleaning tool lifter-lowerer lifts or lowers the cleaning tool to the second height position, whereby the lower-surface outer region of the substrate held by the second substrate holder can be cleaned by the cleaning tool.

In this manner, with the substrate cleaning device according to the one aspect of the present invention, it is not required to move the substrate in the horizontal direction in order to clean each of the lower-surface center portion and the lower-surface outer region of the substrate. Thus, the entire lower surface of the substrate can be cleaned while an increase in footprint is reduced.

(2) The substrate cleaning device may further include an attachment member to which the cleaning tool is attached, wherein the cleaning tool lifter-lowerer may support the cleaning tool by liftably and lowerably supporting the attachment member. Thus, the cleaning tool is supported by the cleaning tool lifter-lowerer to be liftable and lowerable via the attachment member.

(3) The substrate cleaning device may further include a cleaning liquid supplier that is attached to the attachment member and supplies a cleaning liquid to the lower surface of the substrate when the lower surface of the substrate is cleaned by the cleaning tool.

In this case, the cleaning liquid can be supplied efficiently to a portion, to be cleaned by the cleaning tool, in the lower surface of the substrate from a position in the vicinity of the cleaning tool. Thus, the consumption of the cleaning liquid is reduced, and excessive splashing of the cleaning liquid is suppressed.

(4) The attachment member may have an upper surface that is inclined downwardly in a direction away from the second substrate holder. In this case, in a case where contaminants removed by the cleaning tool from the lower surface of the substrate fall on the upper surface of the attachment member, the contaminants received by the upper surface of the attachment member are guided in a direction away from the second substrate holder along the inclined upper surface. Thus, when the lower surface of the substrate held by the first substrate holder is cleaned, contamination of the second substrate holder is reduced.

(5) The substrate cleaning device may further include an airflow generator that generates a strip-shaped flow of air between the cleaning tool and the second substrate holder.

In this case when the lower surface of the substrate held by the first substrate holder is cleaned, splashing of contaminants, that have been removed from the lower surface of the substrate, toward the second substrate holder is reduced by a flow of air generated by the airflow generator. Thus, contamination of the second substrate holder is reduced.

(6) The airflow generator may further be attached to the attachment member. In this case, the airflow generator is provided integrally with the cleaning tool. Therefore, the positional relationship between the airflow generator and the cleaning tool is set appropriately, so that splashing of contaminants, that have been removed from the lower surface of the substrate, toward the second substrate holder is more sufficiently reduced. Thus, contamination of the second substrate holder is more sufficiently reduced.

(7) The airflow generator may form a gas curtain between the cleaning tool and the second substrate holder by injecting a strip-shaped gas toward the lower surface of the substrate.

In this case, because a gas curtain is formed between the cleaning tool and the second substrate holder, contaminants that have been removed from the lower surface of the substrate by the cleaning tool are prevented from being splashed toward the second substrate holder. Thus, contamination of the second substrate holder is further reduced.

(8) An area of a contact portion of the cleaning tool that comes into contact with the lower surface of the substrate may be larger than an area of a suction portion of the second substrate holder that holds the lower-surface center portion of the substrate by suction.

In this case, with the base in the second horizontal position, the cleaning tool can be brought into contact with the lower surface of the substrate to cover the portion, to be held by suction by the second substrate holder, in the lower surface of the substrate. Thus, it is possible to clean a portion, to be held by suction by the second substrate holder, in the substrate without moving the cleaning tool in the horizontal direction.

(9) The cleaning tool lifter-lowerer may be supported to be movable in a horizontal direction with respect to the second substrate holder in the base portion, and the substrate cleaning device may further include a movement driver that moves the cleaning tool lifter-lowerer in the horizontal direction with respect to the second substrate holder in the base portion.

In this case, when the lower-surface outer region of the substrate held by the second substrate holder is cleaned by the cleaning tool, the cleaning tool lifter-lowerer can be moved in the horizontal direction with respect to the second substrate holder. Thus, even in a case where a contact area, that comes into contact with the lower surface of the substrate, in the cleaning tool is smaller than the lower-surface outer region of the substrate, it is possible to clean a wide range of area in the lower surface of the substrate by moving the cleaning tool lifter-lowerer in the horizontal direction with respect to the second substrate holder.

(10) The substrate cleaning device may further include a cleaning tool rotation driver that rotates the cleaning tool about an axis extending in the up-and-down direction. In this case, the cleaning tool is rotated while being in contact with the lower surface of the substrate, whereby it is possible to physically remove contaminants adhering to the lower surface of the substrate without moving the cleaning tool in the horizontal direction.

(11) A substrate cleaning device according to another aspect of the present invention includes a first substrate holder that holds an outer peripheral end of a substrate at a first height position without rotating the substrate, a second substrate holder that rotates the substrate about an axis extending in an up-and-down direction while holding the lower-surface center portion of the substrate by suction at a second height position further downward than the first height position, a substrate mover that moves the substrate between the first height position and the second height position, a cleaning tool that comes into contact with a lower surface of the substrate to clean the lower surface of the substrate, a cleaning tool lifter-lowerer that changes the cleaning tool between a first state where the cleaning tool comes into contact with the lower surface of the substrate held by the first substrate holder and a second state where the cleaning tool comes into contact with the lower surface of the substrate held by the second substrate holder, by lifting or lowering the cleaning tool, a cleaning tool mover that moves the cleaning tool in a horizontal direction with respect to the substrate at a position below the substrate held by the first or second substrate holder, a cleaning liquid supplier that supplies a cleaning liquid to the lower surface of the substrate, and a processing cup that is provided to surround the second substrate holder in a plan view, and receives the cleaning liquid splashed from the substrate in a case where the cleaning liquid is supplied from the cleaning liquid supplier to the substrate that is rotated while being held by suction by the second substrate holder, wherein the first height position is higher than an upper end portion of the processing cup, and the second height position is lower than the upper end portion of the processing cup when the substrate is cleaned by the cleaning tool while being held by the second substrate holder.

In the substrate cleaning device, the substrate is moved between the first height position and the second height position by the substrate mover. With the substrate in the first height position, the outer peripheral end of the substrate is held by the first substrate holder. The cleaning tool lifter-lowerer lifts or lowers the cleaning tool, so that the cleaning tool is changed to the first state. The cleaning liquid is supplied to the lower surface of the substrate.

Here, the first height position is higher than the upper end portion of the processing cup. Even in such a case, because the substrate is not rotated while being held by the first substrate holder, the cleaning liquid to be supplied to the substrate is unlikely to be splashed outwardly of the substrate. Thus, it is possible to clean the lower-surface center portion of the substrate held by the first substrate holder using the cleaning tool while preventing interference between the first substrate holder and the processing cup and reducing splashing of the cleaning liquid.

On the other hand, with the substrate in the second height position, the lower-surface center portion of the substrate is held by suction by the second substrate holder, and the substrate is rotated. The center of the substrate held by the second substrate holder is located below the substrate being held by the first substrate holder at the first height position. The cleaning tool lifter-lowerer lifts or lowers the cleaning tool, so that the cleaning tool is changed to the second state. The cleaning liquid is supplied to the lower surface of the substrate.

Here, because the second height position is lower than the upper end portion of the processing cup, with the substrate held and rotated by the second substrate holder at the second height position, the cleaning liquid supplied to the substrate and splashed from the substrate is received by the processing cup. Thus, the lower-surface outer region of the substrate held by suction by the second substrate holder can be cleaned by the cleaning tool while a reduction in cleanliness of the substrate cleaning device caused by the cleaning liquid splashed from the substrate is suppressed.

As described above, with the substrate cleaning device according to the one aspect of the present invention, it is not required to move the substrate in the horizontal direction in order to clean each of the lower-surface center portion and the lower-surface outer region of the substrate. Further, when the lower-surface center portion and the lower-surface outer region of the substrate are cleaned, splashing of the cleaning liquid, that is supplied to the lower surface of the substrate, outwardly of the substrate is reduced. As a result, the substrate cleaning device that can clean the entire lower surface of the substrate and maintain high cleanliness while reducing an increase in footprint can be realized.

(12) The substrate cleaning device may further include a controller that controls the first substrate holder, the second substrate holder, the substrate mover, the cleaning tool lifter-lowerer, the cleaning tool mover and the cleaning liquid supplier, wherein the controller may control the first substrate holder, the cleaning tool lifter-lowerer and the cleaning liquid supplier such that the lower-surface center portion of the substrate held by the first substrate holder is cleaned by the cleaning tool, when the lower-surface center portion of the substrate is cleaned, may control the second substrate holder, the cleaning tool lifter-lowerer, the clean- ing tool mover and the cleaning liquid supplier such that a lower-surface outer region, surrounding the lower-surface center portion of the substrate, is cleaned by the cleaning tool while a cleaning liquid is supplied to the lower surface of the substrate held by the second substrate holder, when the lower-surface outer region is cleaned, and may control the first substrate holder, the second substrate holder and the substrate mover such that the substrate is moved between the first substrate holder and the second substrate holder.

In this case, the lower-surface center portion of the substrate held by the first substrate holder is cleaned by the cleaning tool. Further, the lower-surface outer region of the substrate held by the second substrate holder is cleaned by the cleaning tool. The substrate is moved by the substrate mover between the first substrate holder and the second substrate holder. Thus, the entire lower surface of the substrate is smoothly cleaned.

(13) The cleaning tool mover may move the cleaning tool in the horizontal direction with respect to the substrate in at least one of a state where the cleaning tool is in contact with the lower surface of the substrate held by the first substrate holder and a state where the cleaning tool is in contact with the lower surface of the substrate held by the second substrate holder.

With the configuration, in at least one of a state where the cleaning tool is in contact with the lower surface of the substrate held by the first substrate holder and a state where the cleaning tool is in contact with the lower surface of the substrate held by the second substrate holder, a region that can be cleaned in the lower surface of the substrate is expanded.

(14) The substrate cleaning device may further include a gas supplier that is configured to be capable of supplying gas to the lower surface of the substrate held by the first substrate holder and to be capable of supplying gas to the lower surface of the substrate held by the second substrate holder.

In this case, after the lower surface of the substrate held by the first substrate holder is cleaned, and after the lower surface of the substrate held by the second substrate holder is cleaned, the lower surface of the substrate is dried by the gas supplied from the gas supplier to the substrate.

(15) The substrate cleaning device may further include a cleaning tool rotation driver that rotates the cleaning tool about an axis extending in the up-and-down direction.

In this case, the cleaning tool is rotated while being in contact with the lower surface of the substrate, so that it is possible to physically remove contaminants adhering to the lower surface of the substrate without moving the cleaning tool in the horizontal direction.

(16) An area of a contact portion of the cleaning tool that comes into contact with the lower surface of the substrate may be larger than an area of a suction portion of the second substrate holder that holds the lower-surface center portion of the substrate by suction.

In this case, with the substrate held by the first substrate holder, the cleaning tool can be brought into contact with the lower surface of the substrate to cover a portion, to be held by suction by the second substrate holder, in the lower surface of the substrate. Thus, it is possible to clean a portion, to be held by suction by the second substrate holder, in the substrate without moving the cleaning tool in the horizontal direction.

(17) The substrate cleaning device may further include a processing cup driver that lifts or lowers the processing cup between an upper cup position at which an upper end portion of the processing cup is higher than the second height position and a lower cup position at which the upper end portion of the processing cup is lower than the second height position, wherein the processing cup driver may hold the processing cup at the upper cup position when the substrate is cleaned by the cleaning tool while being held by the second substrate holder, and may hold the processing cup at the lower cup position before or after the substrate held by the second substrate holder is cleaned.

In this case, the processing cup is held at the upper cup position when the substrate held by the second substrate holder is cleaned. Thus, the cleaning liquid splashed from the substrate is received by the processing cup. On the other hand, before or after the substrate held by the second substrate holder is cleaned, the processing cup is held at the lower cup position. Thus, the second substrate holder can be accessed in the horizontal direction. Therefore, the substrate can be received from or transferred to the second substrate holder from the outside of the substrate cleaning device.

(18) A substrate cleaning device according to yet another aspect of the present invention includes a first substrate holder that holds an outer peripheral end of a substrate, a second substrate holder that holds a lower-surface center region of the substrate at a position farther downward than the first substrate holder, a receiver-transferer that receives and transfers the substrate between the first substrate holder and the second substrate holder, a cleaning tool that comes into contact with a lower surface of the substrate to clean the lower surface of the substrate, and a cleaning controller that controls the cleaning tool such that the lower-surface center region of the substrate is cleaned with a center of the substrate in a first position when the substrate is held by the first substrate holder, and controls the cleaning tool such that a lower-surface outer region surrounding the lower-surface center region of the substrate is cleaned with the center of the substrate in a second position below the first position when the substrate is held by the second substrate holder.

In the substrate cleaning device, the substrate is received and transferred between the first substrate holder and the second substrate holder by the receiver-transferer. When the substrate is held by the first substrate holder, the lower-surface center region of the substrate is cleaned by the cleaning tool with the center of the substrate in the first position. When the substrate is held by the second substrate holder, the lower-surface outer region of the substrate is cleaned by the cleaning tool with the center of the substrate in the second position below the first position. In this manner, it is not required to move the substrate in the horizontal direction in order to clean each of the lower-surface center region and lower-surface outer region of the substrate. Thus, the entire lower surface of the substrate can be cleaned while an increase in footprint is reduced.

(19) The substrate cleaning device may further include a receiving-transferring controller that controls the receiver-transferer such that the substrate having the lower-surface center region that has been cleaned in the first substrate holder to the second substrate holder. In this case, the entire lower surface of the substrate can be cleaned easily.

(20) The receiving-transferring controller may further control the receiver-transferer such that the substrate having the lower-surface outer region that has been cleaned in the second substrate holder is transferred to the first substrate holder again, and the cleaning controller may control the cleaning tool such that the lower-surface center region of the substrate held by the first substrate holder is cleaned again. In this case, the lower-surface center region of the substrate held by the second substrate holder is cleaned again in the first substrate holder. Thus, the substrate can be cleaned more properly.

(21) The substrate cleaning device may further include a receiving-transferring controller that controls the receiver-transferer such that the substrate having the lower-surface outer region that has been cleaned in the second substrate holder is transferred to the first substrate holder. In this case, the lower-surface center region of the substrate held by the second substrate holder is cleaned in the first substrate holder. Thus, the substrate can be cleaned more properly and efficiently.

(22) The substrate cleaning device may be configured to selectively operate in a first cleaning mode or a second cleaning mode, and the cleaning controller may control the cleaning tool such that the lower-surface center region of the substrate is cleaned when the substrate is held by the first substrate holder, and may control the cleaning tool such that the lower-surface outer region of the substrate is cleaned when the substrate is held by the second substrate holder, in the first cleaning mode, and may control the cleaning tool such that the substrate is not cleaned when the substrate is held by the first substrate holder, and may control the cleaning tool such that the lower-surface outer region of the substrate is cleaned when the substrate is held by the second substrate holder, in the second cleaning mode.

In this case, it is possible to clean the entire lower surface of the substrate by causing the substrate cleaning device to operate in the first cleaning mode. Meanwhile, in a case where the lower-surface center region of the substrate does not need to be cleaned, it is possible to efficiently clean the lower-surface outer region of the substrate by causing the substrate cleaning device to operate in the second cleaning mode.

(23) The second substrate holder may be configured to be capable of holding and rotating the substrate, and the substrate cleaning device may further include a base portion that supports the cleaning tool and the second substrate holder, a base driver that changes the base portion between a first state where the cleaning tool is below a center of the substrate to be held by the first substrate holder and a second state where a rotational center of the second substrate holder is below the center of the substrate to be held by the first substrate holder, and a base controller that controls the base driver such that the base portion is in the first state when the substrate is cleaned in the first substrate holder, and controls the base driver such that the base portion is in the second state when the substrate is received and transferred between the first substrate holder and the second substrate holder.

In this case, it is possible to more easily clean the lower-surface center region of the substrate held by the first substrate holder and the lower-surface outer region of the substrate held by the second substrate holder using the common cleaning tool while facilitating receiving and transferring of the substrate between the first substrate holder and the second substrate holder.

(24) A substrate processing apparatus according to yet another aspect of the present invention includes the above-mentioned substrate cleaning device, and a substrate transporter that includes a first transport holder configured to be capable of holding the substrate and a second transport holder configured to be capable of holding the substrate at a position farther downward than the first transport holder, wherein the first transport holder may receive the substrate from or transfer the substrate to the first substrate holder of the substrate cleaning device, and the second transport holder may receive the substrate from or transfer a substrate to the second substrate holder of the substrate cleaning device.

In this case, the substrate is received and transferred (hereinafter referred to as first reception-transfer) between the first transport holder and the first substrate holder that correspond to each other. At this time, the first transport holder needs to move to the first height position.

Further, the substrate is received and transferred (hereinafter referred to as second reception-transfer) between the second transport holder and the second substrate holder that correspond to each other. At this time, the second transport holder needs to move to the second height position.

As described above, the first and second transport holders respectively correspond to the first and second substrate holders and are arranged at intervals in the up-and-down direction. Therefore, in a case where the first reception-transfer and the second reception-transfer are performed at different height positions, a period of time required for movement of each transport holder in the up-and-down direction is shortened. Therefore, the throughput of the substrate process in the substrate processing apparatus is improved.

(25) A substrate cleaning method according to yet another aspect of the present invention includes cleaning a lower-surface center region of a substrate using a cleaning tool that comes into contact with a lower surface of the substrate with a center of the substrate in a first position, when an outer peripheral end of the substrate is held by a first substrate holder, cleaning a lower-surface outer region surrounding the lower-surface center region of the substrate using the cleaning tool with the center of the substrate in a second position below the first position, when the lower-surface center region of the substrate is held by a second substrate holder at a position farther downward than the first substrate holder, and receiving and transferring the substrate between the first substrate holder and the second substrate holder.

With the substrate cleaning method, it is not required to move the substrate in the horizontal direction in order to clean each of the lower-surface center region and the lower-surface outer region of the substrate. Thus, the entire lower surface of the substrate can be cleaned while an increase in footprint is reduced.

(26) The receiving and transferring the substrate may include transferring the substrate having the lower-surface center region that has been cleaned in the first substrate holder to the second substrate holder. In this case, the entire lower surface of the substrate can be cleaned easily.

(27) The substrate cleaning method may further include re-transferring the substrate having the lower-surface outer region that has been cleaned in the second substrate holder to the first substrate holder, and re-cleaning the lower-surface center region of the substrate that has been transferred from the second substrate holder and is held by the first substrate holder using the cleaning tool. In this case, the lower-surface center region of the substrate held by the second substrate holder is cleaned again in the first substrate holder. Thus, the substrate can be cleaned more properly.

(28) The receiving and transferring the substrate may include transferring the substrate having the lower-surface outer region that has been cleaned in the second substrate holder to the first substrate holder. In this case, the lower-surface center region of the substrate to be held by the second substrate holder is cleaned in the first substrate holder. Thus, the substrate can be cleaned more properly and efficiently.

(29) The cleaning a lower-surface center region of a substrate may include cleaning the lower-surface center region of the substrate in a first cleaning mode and not cleaning the substrate in a second cleaning mode, and the cleaning a lower-surface outer region may include cleaning the lower-surface outer region of the substrate in the first and second cleaning modes.

In this case, in the first cleaning mode, the entire lower surface of the substrate can be cleaned. On the other hand, in a case where the lower-surface center region of the substrate does not need to be cleaned, the lower-surface outer region of the substrate can be cleaned efficiently in the second cleaning mode.

(30) The cleaning a lower-surface center region of a substrate may include putting a base portion that supports the cleaning tool and the second substrate holder in a first state, the cleaning a lower-surface outer region may include putting the base portion in a second state, the second substrate holder may be configured to be capable of holding and rotating the substrate, in the first state, the cleaning tool may be below a center of the substrate to be held by the first substrate holder, and in the second state, a rotational center of the second substrate holder may be below the center of the substrate to be held by the first substrate holder.

In this case, it is possible to more easily clean the lower-surface center region of the substrate held by the first substrate holder and the lower-surface outer region of the substrate held by the second substrate holder using the common cleaning tool while facilitating receiving and transferring of the substrate between the first substrate holder and the second substrate holder.

Other features, elements, characteristics, and advantages of the present disclosure will become more apparent from the following description of preferred embodiments of the present disclosure with reference to the attached drawings.

BRIEF DESCRIPTION OF THE DRAWING

FIG. 1 is a schematic plan view of a substrate cleaning device according to one embodiment of the present invention;

FIG. 2 is an external perspective view showing the inner configuration of the substrate cleaning device of FIG. 1;

FIG. 3 is a block diagram showing the configuration of a control system of the substrate cleaning device according to the one embodiment of the present invention;

FIG. 4 is a schematic diagram for explaining one example of an operation of the substrate cleaning device of FIG. 1;

FIG. 5 is a schematic diagram for explaining one example of the operation of the substrate cleaning device of FIG. 1;

FIG. 6 is a schematic diagram for explaining one example of the operation of the substrate cleaning device of FIG. 1;

FIG. 7 is a schematic diagram for explaining one example of the operation of the substrate cleaning device of FIG. 1;

FIG. 8 is a schematic diagram for explaining one example of the operation of the substrate cleaning device of FIG. 1;

FIG. 9 is a schematic diagram for explaining one example of the operation of the substrate cleaning device of FIG. 1;

FIG. 10 is a schematic diagram for explaining one example of the operation of the substrate cleaning device of FIG. 1;

FIG. 11 is a schematic diagram for explaining one example of the operation of the substrate cleaning device of FIG. 1;

FIG. 12 is a schematic diagram for explaining one example of the operation of the substrate cleaning device of FIG. 1;

FIG. 13 is a schematic diagram for explaining one example of the operation of the substrate cleaning device of FIG. 1;

FIG. 14 is a schematic diagram for explaining one example of the operation of the substrate cleaning device of FIG. 1;

FIG. 15 is a schematic diagram for explaining one example of the operation of the substrate cleaning device of FIG. 1;

FIG. 16 is a flowchart showing a substrate cleaning process performed by a control device of FIG. 3;

FIG. 17 is a flowchart showing a substrate cleaning process in a first modified example;

FIG. 18 is a flowchart showing a substrate cleaning process in a second modified example;

FIG. 19 is a schematic plan view showing one example of a substrate processing apparatus including the substrate cleaning device of FIG. 1;

FIG. 20 is a diagram for explaining a specific example of carrying a substrate into and carrying a substrate out from the substrate cleaning device using a main robot of FIG. 16;

DETAILED DESCRIPTION

Figure 21:
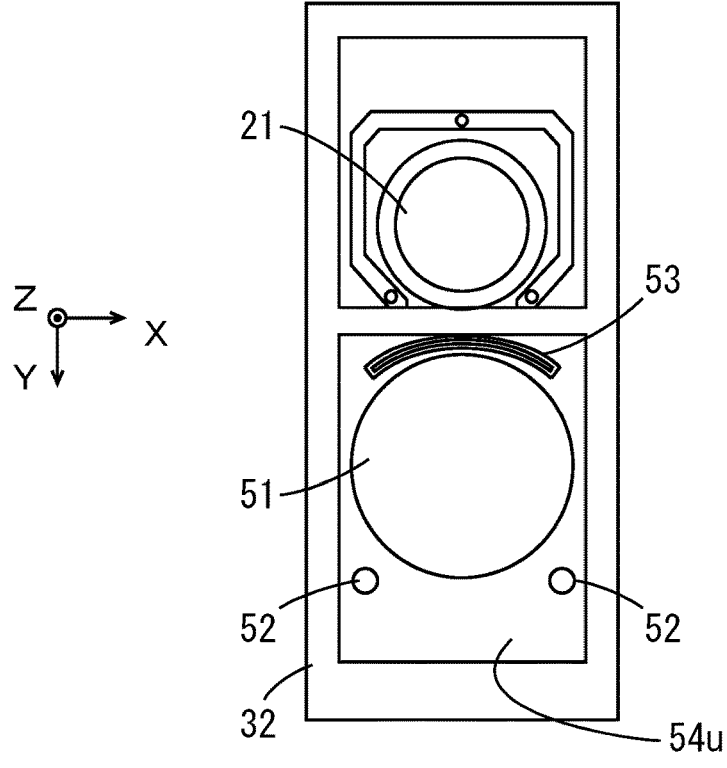
FIG. 21 is a diagram for explaining another example of the configuration of a gas injector.

A substrate cleaning device, a substrate processing apparatus and a substrate cleaning method according to embodiments of the present invention will be described below with reference to drawings. In the following description, a substrate refers to a semiconductor substrate (wafer), a substrate for an FPD (Flat Panel Display) such as a liquid crystal display device or an organic EL (Electro Luminescence) display device, a substrate for an optical disc, a substrate for a magnetic disc, a substrate for a magneto-optical disc, a substrate for a photomask, a ceramic substrate, a substrate for a solar battery, or the like. Further, in the present embodiment, the upper surface of a substrate is a circuit forming surface (main surface), and the lower surface of the substrate is the surface opposite to the circuit forming surface (back surface). Further, in the present embodiment, a substrate is circular except for a notch.

[1] Configuration of Substrate Cleaning Device

FIG. 1 is a schematic plan view of the substrate cleaning device according to one embodiment of the present invention, and FIG. 2 is an external perspective view showing the inner configuration of the substrate cleaning device 1 of FIG. 1. In the substrate cleaning device 1 according to the present embodiment, X, Y, and Z directions orthogonal to one another are defined for the clarity of a positional relationship. In FIG. 1 and the subsequent drawings, the X, Y, and Z directions are suitably indicated by arrows. The X and Y directions are orthogonal to each other within a horizontal plane, and the Z direction corresponds to a vertical direction.

As shown in FIG. 1, the substrate cleaning device 1 includes upper holding devices 10A, 10B, a lower holding device 20, a base device 30, a receiving-transferring device 40, a lower-surface cleaning device 50, a cup device 60, an upper-surface cleaning device 70, an end-portion cleaning device 80 and an opening-closing device 90. These constituent elements are provided in a unit casing 2. In FIG. 2, the unit casing 2 is indicated by the dotted lines.

The unit casing 2 has a rectangular bottom surface portion 2a, and four sidewall portions 2b, 2c, 2d, 2e extending upwardly from four sides of the bottom surface portion 2a. The sidewall portions 2b, 2c are opposite to each other, and the sidewall portions 2d, 2e are opposite to each other. A rectangular opening is formed in the center portion of the sidewall portion 2b. The opening is an inlet-outlet port 2x for a substrate W and is used when the substrate W is carried into and carried out from the unit casing 2. In FIG. 2, the inlet-outlet port 2x is indicated by the thick dotted lines. In the following description, a direction that is directed outwardly of the unit casing 2 in the Y direction (the direction directed from the sidewall portion 2c toward the sidewall portion 2b) from the inside of the unit casing 2 through the inlet-outlet port 2x is referred to as forward, and its opposite direction (the direction directed from the sidewall portion 2b toward the sidewall portion 2c) is referred to as rearward.

An opening-closing device 90 is provided in a portion in which the inlet-outlet port 2x is formed and its vicinal region in the sidewall portion 2b. The opening-closing device 90 includes a shutter 91 that is configured to be capable of opening and closing the inlet-outlet port 2x and a shutter driver 92 that drives the shutter 91. In FIG. 2, the shutter 91 is indicated by the thick two-dots and dash lines. The shutter driver 92 drives the shutter 91 to open the inlet-outlet port 2x when the substrate W is carried into and carried out from the substrate cleaning device 1. Further, the shutter driver 92 drives the shutter 91 to close the inlet-outlet port 2x when a cleaning process is performed on the substrate W in the substrate cleaning device 1.

The base device 30 is provided in the center portion of the bottom surface portion 2a. The base device 30 includes linear guides 31, a mobile base 32 and a base driver 33. The linear guides 31 include two rails and are provided to extend in the Y direction from positions in the vicinity of the sidewall portion 2b to positions in the vicinity of the sidewall portion 2c in a plan view. The mobile base 32 is provided to be movable in the Y direction on the two rails of the linear guides 31. The base driver 33 includes a pulse motor, for example, and moves the mobile base 32 in the Y direction on the linear guides 31.

The lower holding device 20 and the lower-surface cleaning device 50 are provided on the mobile base 32 to be arranged in the Y direction. The lower holding device 20 includes a suction holder 21 and a suction holding driver 22. The suction holder 21 is a so-called spin chuck, has a circular suction surface that can hold a lower surface of the substrate W by suction and is configured to be rotatable about an axis extending in the up-and-down direction (the axis extending in the Z direction). In FIG. 1, the outer shape of the substrate W that is held by suction by the lower holding device 20 is indicated by the two-dots and dash line. In the following description, a region, that is to be sucked by the suction surface of the suction holder 21, in the lower surface of the substrate W when the substrate W is held by suction by the suction holder 21 is referred to as a lower-surface center region. On the other hand, a region, surrounding the lower-surface center region, in the lower surface of the substrate W is referred to as a lower-surface outer region. The lower-surface center region is equivalent to a lower-surface center portion and a lower-surface center region of the present invention.

The suction holding driver 22 includes a motor. The motor of the suction holding driver 22 is provided on the mobile base 32 such that its rotation shaft projects upwardly. The suction holder 21 is provided at the upper end portion of the rotation shaft of the suction holding driver 22. Further, in the rotation shaft of the suction holding driver 22, a suction path for holding the substrate W by suction in the suction holder 21 is formed. The suction path is connected to a suction device (not shown). The suction holding driver 22 rotates the suction holder 21 about the above-mentioned rotation shaft.

On the mobile base 32, the receiving-transferring device 40 is further provided in the vicinity of the lower holding device 20. The receiving-transferring device 40 includes a plurality (three in the present example) of support pins 41, a pin coupling member 42 and a pin lifting-lowering driver 43. The pin coupling member 42 is formed to surround the suction holder 21 in a plan view and couples the plurality of support pins 41 to one another. The plurality of support pins 41 extend upwardly by a certain length from the pin coupling member 42 while being coupled to one another by the pin coupling member 42. The pin lifting-lowering driver 43 lifts or lowers the pin coupling member 42 on the mobile base 32. Thus, the plurality of support pins 41 are lifted or lowered relative to the suction holder 21.

The lower-surface cleaning device 50 includes a lower-surface brush 51, two liquid nozzles 52, a gas injector 53, a lifting-lowering supporter 54, a movement supporter 55, a lower-surface brush rotation driver 55a, a lower-surface brush lifting-lowering driver 55b and a lower-surface brush movement driver 55c. The movement supporter 55 is provided to be movable in the Y direction with respect to the lower holding device 20 in a certain region on the mobile base 32. As shown in FIG. 2, the lifting-lowering supporter 54 is provided on the movement supporter 55 to be liftable and lowerable. The lifting-lowering supporter 54 has an upper surface 54u that is inclined downwardly in a direction away from the suction holder 21 (rearwardly in the present example).

As shown in FIG. 1, the lower-surface brush 51 is formed of a PVA (polyvinyl alcohol) sponge or a PVA sponge in which abrasive grains are dispersed, for example, and has a circular cleaning surface that can come into contact with the lower surface of the substrate W. Further, the lower-surface brush 51 is attached to the upper surface 54u of the lifting-lowering supporter 54 such that the cleaning surface is directed upwardly and the cleaning surface is rotatable about an axis extending in the up-and-down direction through the center of the cleaning surface. The area of the cleaning surface of the lower-surface brush 51 is larger than the area of the suction surface of the suction holder 21.

Each of the two liquid nozzles 52 is attached to the upper surface 54u of the lifting-lowering supporter 54 to be located in the vicinity of the lower-surface brush 51. Further, each of the two liquid nozzles 52 is attached to the upper surface 54u such that a liquid discharge port is directed upwardly. A lower-surface cleaning liquid supplier 56 (FIG. 3) is connected to the liquid nozzles 52. The lower-surface cleaning liquid supplier 56 supplies a cleaning liquid to the liquid nozzles 52. When the substrate W is cleaned by the lower-surface brush 51, the liquid nozzles 52 supply the cleaning liquid supplied from the lower-surface cleaning liquid supplier 56 to the lower surface of the substrate W. In the present embodiment, pure water (deionized water) is used as the cleaning liquid to be supplied to the liquid nozzles 52. As the cleaning liquid to be supplied to the liquid nozzles 52, carbonated water, ozone water, hydrogen water, electrolytic ionized water, SC1 (a mixed solution of ammonia and a hydrogen peroxide solution), TMAH (tetramethylammonium hydroxide) or the like can be used instead of pure water.

The gas injector 53 is a slit-like gas injection nozzle having a gas injection port extending in one direction. The gas injector 53 is attached to the upper surface 54u of the lifting-lowering supporter 54 to be located between the lower-surface brush 51 and the suction holder 21 in a plan view. Further, the gas injector 53 is attached to the upper surface 54u of the lifting-lowering supporter 54 such that a gas injection port is directed upwardly. An injection gas supplier 57 (FIG. 3) is connected to the gas injector 53. The injection gas supplier 57 supplies gas to the gas injector 53. In the present embodiment, a nitrogen gas is used as the gas to be supplied to the gas injector 53. The gas injector 53 injects the gas supplied from the injection gas supplier 57 to the lower surface of a substrate W when the substrate W is cleaned by the lower-surface brush 51 and when the lower surface of the substrate W is dried, as described below. In this case, a strip-shaped gas curtain extending in the X direction is formed between the lower-surface brush 51 and the suction holder 21. As the gas to be supplied to the gas injector 53, an inert gas such as an argon gas or a helium gas can be used instead of a nitrogen gas.

The lower-surface brush rotation driver 55a includes a motor, and rotates the lower-surface brush 51 when a substrate W is cleaned by the lower-surface brush 51. The lower-surface brush lifting-lowering driver 55b includes a stepping motor or an air cylinder, and lifts or lowers the lifting-lowering supporter 54 with respect to the movement supporter 55. The lower-surface brush movement driver 55c includes a motor, and moves the movement supporter 55 in the Y direction on the mobile base 32. Here, the position of the lower holding device 20 in the mobile base 32 is fixed. Therefore, when being moved by the lower-surface brush movement driver 55c in the Y direction, the movement supporter 55 is moved relative to the lower holding device 20. In the following description, the position of the lower-surface cleaning device 50 being located closest to the lower holding device 20 on the mobile base 32 is referred to as a proximal position, and the position of the lower-surface cleaning device 50 located farthest from the lower holding device 20 on the mobile base 32 is referred to as a distal position.

The cup device 60 is further provided in the center portion of the bottom surface portion 2a. The cup device 60 includes a processing cup 61 and a cup driver 62. The processing cup 61 is provided to surround the lower holding device 20 and the base device 30 in a plan view, and be liftable and lowerable. In FIG. 2, the processing cup 61 is indicated by the dotted lines. The cup driver 62 moves the processing cup 61 between a lower cup position and an upper cup position in accordance with which portion of the lower surface of a substrate W is to be cleaned by the lower-surface brush 51. The lower cup position is a height position at which the upper end portion of the processing cup 61 is located farther downwardly than a substrate W held by suction by the suction holder 21. Further, the upper cup position is a height position at which the upper end portion of the processing cup 61 is located farther upwardly than the suction holder 21.

At height positions farther upward than the processing cup 61, the pair of upper holding devices 10A, 10B is provided to be opposite to each other with the base device 30 held therebetween in a plan view. The upper holding device 10A includes a lower chuck 11A, an upper chuck 12A, a lower chuck driver 13A and an upper chuck driver 14A. The upper holding device 10B includes a lower chuck 11B, an upper chuck 12B, a lower chuck driver 13B and an upper chuck driver 14B.

The lower chucks 11A, 11B are arranged symmetrically with respect to a vertical plane extending in the Y direction (the front-and-rear direction) through the center of the suction holder 21 in a plan view, and are provided to be movable in the X direction in a common horizontal plane. Each of the lower chucks 11A, 11B has two support pieces that can be support a lower-surface peripheral portion of a substrate W from below the substrate W. The lower chuck drivers 13A, 13B move the lower chucks 11A, 11B such that the lower chucks 11A, 11B are closer to each other or are farther away from each other.

Similarly to the lower chucks 11A, 11B, the upper chucks 12A, 12B are arranged symmetrically with respect to the vertical plane extending in the Y direction (the front-and-rear direction) through the center of the suction holder 21 in a plan view, and are provided to be movable in the X direction in a common horizontal plane. Each of the upper chucks 12A, 12B has two holding pieces that are configured to abut against two portions of the outer peripheral end of a substrate W and be capable of holding the outer peripheral end of the substrate W. The upper chuck drivers 14A, 14B move the upper chucks 12A, 12B such that the upper chucks 12A, 12B are closer to each other or farther away from each other.

As shown in FIG. 1, at a position near one side of the processing cup 61, the upper-surface cleaning device 70 is provided to be located in the vicinity of the upper holding device 10B in a plan view. The upper-surface cleaning device 70 includes a rotation support shaft 71, an arm 72, a spray nozzle 73 and an upper-surface cleaning driver 74.

The rotation support shaft 71 is supported on the bottom surface portion 2a by the upper-surface cleaning driver 74 to extend in the up-and-down direction, and to be liftable, lowerable and rotatable. As shown in FIG. 2, at a position farther upward than the upper holding device 10B, the arm 72 is provided to extend in the horizontal direction from the upper end portion of the rotation support shaft 71. The spray nozzle 73 is attached to the tip portion of the arm 72.

An upper-surface cleaning fluid supplier 75 (FIG. 3) is connected to the spray nozzle 73. The upper-surface cleaning fluid supplier 75 supplies the cleaning liquid and gas to the spray nozzle 73. In the present embodiment, pure water is used as the cleaning liquid to be supplied to the spray nozzle 73, and a nitrogen gas is used as the gas to be supplied to the spray nozzle 73. When the upper surface of the substrate W is cleaned, the spray nozzle 73 mixes the cleaning liquid and the gas supplied from the upper-surface cleaning fluid supplier 75 to produce a fluid mixture, and injects the produced fluid mixture downwardly.

As the cleaning liquid to be supplied to the spray nozzle 73, carbonated water, ozone water, hydrogen water, electrolytic ionized water, SC1 (a mixed solution of ammonia and a hydrogen peroxide solution), TMAH (tetramethylammonium hydroxide) or the like can be used instead of pure water. Further, as the gas to be supplied to the spray nozzle 73, an inert gas such as an argon gas or a helium gas can be used instead of a nitrogen gas.

The upper-surface cleaning driver 74 includes one or a plurality of pulse motors, an air cylinder and the like, lifts or lowers the rotation support shaft 71, and rotates the rotation support shaft 71. With the above-mentioned configuration, on the upper surface of a substrate W held by suction and rotated by the suction holder 21, the spray nozzle 73 is moved in a circular arc shape. Thus, the entire upper surface of the substrate W can be cleaned.

As shown in FIG. 1, at a position near the other side of the processing cup 61, the end-portion cleaning device 80 is provided to be located in the vicinity of the upper holding device 10A in a plan view. The end-portion cleaning device 80 includes a rotation support shaft 81, an arm 82, a bevel brush 83 and a bevel brush driver 84.

The rotation support shaft 81 is supported on the bottom surface portion 2a by the bevel brush driver 84 to extend in the up-and-down direction and to be liftable, lowerable and rotatable. As shown in FIG. 2, at a position farther upward than the upper holding device 10A, the arm 82 is provided to extend in the horizontal direction from the upper end portion of the rotation support shaft 81. At the tip portion of the arm 82, the bevel brush 83 is provided to project downwardly and to be rotatable about an axis extending in the up-and-down direction.

The bevel brush 83 is formed of a PVA sponge or a PVA sponge in which abrasive grains are dispersed, for example, and its upper half portion has an inverse trapezoidal shape, and its lower half portion has a trapezoidal shape. With the bevel brush 83, the outer peripheral end of the substrate W can be cleaned with the center portion in the up-and-down direction of the outer peripheral surface.

The bevel brush driver 84 includes one or a plurality of pulse motors, an air cylinder and the like, lifts and lowers the rotation support shaft 81 and rotates the rotation support shaft 81. With the above-mentioned configuration, the center portion of the outer peripheral surface of the bevel brush 83 is brought into contact with the outer peripheral end of a substrate W held by suction and rotated by the suction holder 21. Thus, the entire outer peripheral end of the substrate W can be cleaned.

Here, the bevel brush driver 84 further includes a motor built in the arm 82. The motor rotates the bevel brush 83 provided at the tip portion of the arm 82 about the axis extending in the up-and-down direction. Therefore, when the outer peripheral end of a substrate W is cleaned, a cleaning force of the bevel brush 83 in the outer peripheral end of the substrate W is improved by rotation of the bevel brush 83.

FIG. 3 is a block diagram showing the configuration of a control system of the substrate cleaning device 1 according to one embodiment of the present invention. A control device 9 of FIG. 3 includes a CPU (Central Processing Unit), a RAM (Random Access Memory), a ROM (Read Only Memory) and a storage device. The RAM is used as a work area for the CPU. The ROM stores a system program. The storage device stores a control program.

As shown in FIG. 3, the control device 9 includes a chuck controller 9A, a suction controller 9B, a base controller 9C, a receiving-transferring controller 9D, a lower-surface cleaning controller 9E, a cup controller 9F, an upper-surface cleaning controller 9G, a bevel cleaning controller 9H and a carry-in carry-out controller 9I as functions. The functions of the control device 9 are implemented by execution of a substrate cleaning program stored in the storage device by the CPU. Part or all of the functions of the control device 9 may be implemented by hardware such as an electronic circuit.

As shown in FIG. 3, the chuck controller 9A controls the lower chuck drivers 13A, 13B and the upper chuck drivers 14A, 14B in order to receive a substrate W that is carried into the substrate cleaning device 1 and hold the substrate W at a position above the suction holder 21. Further, the suction controller 9B controls the suction holding driver 22 in order to hold a substrate W by suction by the suction holder 21 and rotate the substrate W held by suction.

The base controller 9C controls the base driver 33 in order to move the mobile base 32 with respect to a substrate W held by the upper holding devices 10A, 10B. The receiving-transferring controller 9D controls the pin lifting-lowering driver 43 in order to move a substrate W between a height position of the substrate W held by the upper holding devices 10A, 10B and a height position of the substrate W held by the suction holder 21.

The lower-surface cleaning controller 9E controls the lower-surface brush rotation driver 55a, the lower-surface brush lifting-lowering driver 55b, the lower-surface brush movement driver 55c, the lower-surface cleaning liquid supplier 56 and the injection gas supplier 57 in order to clean the lower surface of a substrate W. The cup controller 9F controls the cup driver 62 in order to receive the cleaning liquid splashed from a substrate W using the processing cup 61 when the substrate W held by the suction by the suction holder 21 is cleaned.

The upper-surface cleaning controller 9G controls the upper-surface cleaning driver 74 and the upper-surface cleaning fluid supplier 75 in order to clean the upper surface of a substrate W held by suction by the suction holder 21. The bevel cleaning controller 9H controls the bevel brush driver 84 in order to clean the outer peripheral end of a substrate W held by suction by the suction holder 21. The carry-in carry-out controller 9I controls the shutter driver 92 in order to open and close the inlet-outlet port 2x of the unit casing 2 when the substrate W is carried into and carried out from a substrate cleaning device 1.

[2] Operation of Substrate Cleaning Device 1

FIGS. 4 to 15 are schematic diagrams for explaining one example of the operation of the substrate cleaning device 1 of FIG. 1. In each of FIGS. 4 to 15, a plan view of the substrate cleaning device 1 is shown in the upper field. Further, a side view of the lower holding device 20 and its peripheral portions as viewed in the Y direction is shown in the middle field, and a side view of the lower holding device 20 and its peripheral portions as viewed in the X direction is shown in the bottom field. The side view in the middle field corresponds to the side view of the substrate cleaning device 1 taken along the line A-A of FIG. 1, and the side view in the bottom field corresponds to the side view of the substrate cleaning device 1 taken along the line B-B of FIG. 1. The expansion and contraction rates of part of the constituent elements are different for the plan view in the upper field and the side views in the middle and bottom fields in order to facilitate understanding of the shape and operation state of each constituent element in the substrate cleaning device 1. Further, in each of FIGS. 4 to 15, the processing cup 61 is indicated by the two-dots and dash lines, and the outer shape of a substrate W is indicated by the thick one-dot and dash lines.

In an initial state before a substrate W is carried into the substrate cleaning device 1, the inlet-outlet port 2x is closed by the shutter 91 of the opening-closing device 90. Further, as shown in FIG. 1, the lower chucks 11A, 11B are also maintained in a state where the distance between the lower chucks 11A, 11B is sufficiently larger than the diameter of the substrate W. Further, the upper chucks 12A, 12B are maintained in a state where the distance between the upper chucks 12A, 12B is sufficiently larger than the diameter of the substrate W. Further, the mobile base 32 of the base device 30 is arranged such that the center of the suction holder 21 is located at the center of the processing cup 61 in a plan view. Further, the lower-surface cleaning device 50 is arranged in the proximal position on the mobile base 32. Further, the lifting-lowering supporter 54 of the lower-surface cleaning device 50 is in a state where the cleaning surface (the upper end portion) of the lower-surface brush 51 is located farther downwardly than the suction holder 21. Further, the receiving-transferring device 40 is in a state where the plurality of support pins 41 are located farther downwardly than the suction holder 21. Further, in the cup device 60, the processing cup 61 is in the lower cup position. In the following description, the center position of the processing cup 61 in a plan view is referred to as a plane reference position rp. Further, the position of the mobile base 32 located on the bottom surface portion 2a when the center of the suction holder 21 is in the plane reference position rp in a plan view is referred to as a first horizontal position.

A substrate W is carried into the unit casing 2 of the substrate cleaning device 1. Specifically, the shutter 91 opens the inlet-outlet port 2x immediately before the substrate W is carried in. Thereafter, as indicated by the thick solid arrow a1 in FIG. 1, a hand (substrate holder) RH of a substrate transporting robot (not shown) carries the substrate W to the substantially center position in the unit casing 2 through the inlet-outlet port 2x. At this time, the substrate W held by the hand RH is located between the lower chuck 11A and the upper chuck 12A, and the lower chuck 11B and the upper chuck 12B as shown in FIG. 4.

Next, as indicated by the thick solid arrows a2 in FIG. 5, the lower chucks 11A, 11B move closer to each other such that a plurality of support pieces of the lower chucks 11A, 11B are located below the lower-surface peripheral portion of the substrate W. In this state, the hand RH is lowered and exits from the inlet-outlet port 2x. Thus, a plurality of portions of the lower-surface peripheral portion of the substrate W held by the hand RH are supported by the plurality of support pieces of the lower chucks 11A, 11B. After the hand RH exits, the shutter 91 closes the inlet-outlet port 2x.

Next, as indicated by the thick solid arrows a3 in FIG. 6, the upper chucks 12A, 12B move closer to each other such that a plurality of holding pieces of the upper chucks 12A, 12B abut against the outer peripheral end of the substrate W. The plurality of holding pieces of the upper chucks 12A, 12B abut against a plurality of portions of the outer peripheral end of the substrate W, whereby the substrate W supported by the lower chucks 11A, 11B is further held by the upper chucks 12A, 12B. In this manner, the center of the substrate W held by the upper holding devices 10A, 10B overlaps or substantially overlaps with the plane reference position rp in a plan view. At this time, as shown in the side view in the middle field of FIG. 6, the height position of the substrate W held by the upper chucks 12A, 12B is equivalent to a first height position of the present invention. Further, as indicated by the thick solid arrow a4 in FIG. 6, the mobile base 32 is moved forwardly from the first horizontal position such that suction holder 21 deviates from the plane reference position rp by a predetermined distance and the center of the lower-surface brush 51 is located at the plane reference position rp. At this time, the position of the mobile base 32 located on the bottom surface portion 2a is referred to as a second horizontal position.

Next, as indicated by the thick solid arrow a5 in FIG. 7, the lifting-lowering supporter 54 is lifted such that the cleaning surface of the lower-surface brush 51 comes into contact with the lower-surface center region of the substrate W. Further, as indicated by the thick solid arrow a6 in FIG. 7, the lower-surface brush 51 is rotated (spins) about the axis extending in the up-and-down direction. Thus, contaminants adhering to the lower-surface center region of the substrate W are physically stripped by the lower-surface brush 51. As shown in the side view in the bottom field in FIG. 7, the height position of the lower-surface brush 51 coming into contact with the lower surface of the substrate W held by the upper holding devices 10A, 10B is equivalent to a first cleaning height position of the present invention.

In the bottom field in FIG. 7, an enlarged side view of a portion in which the lower-surface brush 51 is in contact with the lower surface of the substrate W is shown in a balloon. As shown in the balloon, with the lower-surface brush 51 in contact with the substrate W, the liquid nozzle 52 and the gas injector 53 are held at positions close to the lower surface of the substrate W. At this time, as indicated by the outlined arrow a51, the liquid nozzle 52 discharges the cleaning liquid toward the lower surface of the substrate W at a position in the vicinity of the lower-surface brush 51. Thus, the cleaning liquid that has been supplied to the lower surface of the substrate W from the liquid nozzle 52 is guided to a contact portion in which the lower-surface brush 51 and the substrate W are in contact with each other, whereby contaminants that have been removed from the back surface of the substrate W by the lower-surface brush 51 are cleaned away by the cleaning liquid. In this manner, in the lower-surface cleaning device 50, the liquid nozzle 52 is attached to the lifting-lowering supporter 54 together with the lower-surface brush 51. Thus, the cleaning liquid can be supplied efficiently to a portion to be cleaned in the lower surface of the substrate W by the lower-surface brush 51. Therefore, the consumption of the cleaning liquid is reduced, and excessive splashing of the cleaning liquid is suppressed.

The rotation speed at which the lower-surface brush 51 is rotated when cleaning the lower surface of the substrate W is maintained at about the speed at which the cleaning liquid supplied to the lower surface of the substrate W from the liquid nozzle 52 is not splashed sidewardly of the lower-surface brush 51.

Here, the upper surface 54u of the lifting-lowering supporter 54 is inclined downwardly in a direction away from the suction holder 21. In this case, in a case where the cleaning liquid including contaminants falls on the lifting-lowering supporter 54 from the lower surface of the substrate W, the cleaning liquid received by the upper surface 54u is guided in a direction away from the suction holder 21.

Further, when the lower surface of the substrate W is cleaned by the lower-surface brush 51, the gas injector 53 injects gas toward the lower surface of the substrate W at a position between the lower-surface brush 51 and the suction holder 21 as indicated by the outlined arrow a52 in the balloon of FIG. 7. In the present embodiment, the gas injector 53 is attached onto the lifting-lowering supporter 54 such that the gas injection port extends in the X direction. In this case, when gas is injected to the lower surface of the substrate W from the gas injector 53, the strip-shaped curtain extending in the X direction is formed between the lower-surface brush 51 and the suction holder 21. Thus, when the lower surface of the substrate W is cleaned by the lower-surface brush 51, the cleaning liquid including contaminants is prevented from being splashed toward the suction holder 21. Thus, when the lower surface of the substrate W is cleaned by the lower-surface brush 51, the cleaning liquid including contaminants is prevented from adhering to the suction holder 21, and the suction surface of the suction holder 21 is maintained clean.

While the gas injector 53 injects gas obliquely upwardly toward the lower-surface brush 51 from the gas injector 53 as indicated by the outlined arrow a52 in the example of FIG. 7, the present invention is not limited to this. The gas injector 53 may inject gas in the Z direction toward the lower surface of the substrate W from the gas injector 53.

Next, in the state of FIG. 7, when the cleaning of the lower-surface center region of the substrate W is completed, the rotation of the lower-surface brush 51 is stopped, and the lifting-lowering supporter 54 is lowered such that the cleaning surface of the lower-surface brush 51 is spaced apart from the substrate W by a predetermined distance (a distance larger than 0 mm and not more than 10 mm, for example, about 5 mm). Further, discharging of the cleaning liquid from the liquid nozzle 52 to the substrate W is stopped. At this time, the injection of gas from the gas injector 53 to the substrate W continues.

Thereafter, as indicated by the thick solid arrow a7 in FIG. 8, the mobile base 32 is moved rearwardly such that the suction holder 21 is located at the plane reference position rp. That is, the mobile base 32 is moved from the second horizontal position to the first horizontal position. At this time, the injection of gas from the gas injector 53 to the substrate W continues, so that the lower-surface center region of the substrate W is sequentially dried by the gas curtain.

Next, as indicated by the thick solid arrow a8 in FIG. 9, the lifting-lowering supporter 54 is lowered such that the cleaning surface of the lower-surface brush 51 is located at a position farther downward than the suction surface (upper end portion) of the suction holder 21. Further, as indicated by the thick solid arrows a9 in FIG. 9, the upper chucks 12A, 12B move away from each other such that the plurality of holding pieces of the upper chucks 12A, 12B are spaced apart from the outer peripheral end of the substrate W. At this time, the substrate W is being supported by the lower chucks 11A, 11B.

Thereafter, as indicated by the thick solid arrow a10 in FIG. 9, the pin coupling member 42 is lifted such that the upper end portions of the plurality of support pins 41 are located slightly farther upwardly than the lower chucks 11A, 11B. Thus, the substrate W supported by the lower chucks 11A, 11B is received by the plurality of support pins 41.

Next, as indicated by the thick solid arrows a11 in FIG. 10, the lower chucks 11A, 11B move away from each other. At this time, the lower chucks 11A, 11B move to positions at which the lower chucks 11A, 11B do not overlap with the substrate W supported by the plurality of support pins 41 in a plan view. Thus, both of the upper holding devices 10A, 10B return to the initial state.

Next, as indicated by the thick solid arrow a12 in FIG. 11, the pin coupling member 42 is lowered such that the upper end portions of the plurality of pins 41 are located at positions farther downward than the suction holder 21. Thus, the substrate W supported on the plurality of support pins 41 is received by the suction holder 21. In this state, the suction holder 21 holds the lower-surface center region of the substrate W by suction. In this manner, the center of the substrate W held by suction by the lower holding device 20 overlaps or substantially overlaps with the plane reference position rp in a plan view. At this time, as shown in the side views in the middle and lower fields of FIG. 11, the height position of the substrate W held by suction by the suction holder 21 is equivalent to the second height position of the present invention. At the same time as the pin coupling member 42 is lowered or after the pin coupling member 42 is lowered, the processing cup 61 is lifted from the lower cup position to the upper cup position as indicated by the thick solid arrow a13 in FIG. 11. Thus, the substrate W being in the second height position is located at a position farther downward than the upper end portion of the processing cup 61.

Next, as indicated by the thick solid arrow a14 in FIG. 12, the suction holder 21 rotates about the axis extending in the up-and-down direction (an axial center of the rotation shaft of the suction holding driver 22). Thus, the substrate W held by suction by the suction holder 21 is rotated in a horizontal attitude.

Next, the rotation support shaft 71 of the upper-surface cleaning device 70 is rotated and lowered. Thus, as indicated by the thick solid arrow a15 in FIG. 12, the spray nozzle 73 is moved to a position above the substrate W, and the spray nozzle 73 is lowered such that the distance between the spray nozzle 73 and the substrate W is a predetermined distance. In this state, the spray nozzle 73 injects the fluid mixture of the cleaning liquid and gas to the upper surface of the substrate W. Further, the rotation support shaft 71 is rotated. Thus, as indicated by the thick solid arrow a16 in FIG. 12, the spray nozzle 73 is moved at a position above the rotating substrate W. The fluid mixture is injected to the entire upper surface of the substrate W, so that the entire upper surface of the substrate W is cleaned.

Further, when the upper surface of the substrate W is cleaned by the spray nozzle 73, the rotation support shaft 81 of the end-portion cleaning device 80 is rotated and lowered. Thus, as indicated by the thick solid arrow a17 in FIG. 12, the bevel brush 83 is moved to a position above the outer peripheral end of the substrate W. Further, the bevel brush 83 is lowered such that the center portion of the outer peripheral surface of the bevel brush 83 comes into contact with the outer peripheral end of the substrate W. In this state, the bevel brush 83 is rotated (spins) about the axis extending in the up-and-down direction. Thus, contaminants adhering to the outer peripheral end of the substrate W are physically stripped by the bevel brush 83. The contaminants that have been stripped from the outer peripheral end of the substrate W are cleaned away by the cleaning liquid of the fluid mixture injected from the spray nozzle 73 to the substrate W.

Further, when the upper surface of the substrate W is cleaned by the spray nozzle 73, the lifting-lowering supporter 54 is lifted such that the cleaning surface of the lower-surface brush 51 comes into contact with the lower-surface outer region of the substrate W. Further, as indicated by the thick solid arrow a18 in FIG. 12, the lower-surface brush 51 is rotated (spins) about the axis extending in the up-and-down direction. Further, the liquid nozzle 52 discharges the cleaning liquid toward the lower surface of the substrate W, and the gas injector 53 injects the gas toward the lower surface of the substrate W. In this state, as indicated by the thick solid arrow a19 in FIG. 12, the movement supporter 55 advances or retreats between the proximal position and the distal position on the mobile base 32. In this manner, the lower-surface brush 51 is moved in the horizontal direction by the movement supporter 55 while being in contact with the lower surface of the substrate W, whereby a range of the area that can be cleaned by the lower-surface brush 51 in the lower surface of the substrate W is expanded. Thus, the entire lower-surface outer region of the substrate W held by suction and rotated by the suction holder 21 is cleaned by the lower-surface brush 51. As shown in the side view in the bottom field of FIG. 12, the height position at which the lower-surface brush 51 is located when coming into contact with the lower surface of the substrate W held by suction by the lower holding device 20 is equivalent to a second cleaning height position of the present invention.

Next, when cleaning of the upper surface, the outer peripheral end and the lower-surface outer region of the substrate W is completed, injection of the fluid mixture from the spray nozzle 73 to the substrate W is stopped. Further, as indicated by the thick solid arrow a20 in FIG. 13, the spray nozzle 73 is moved to a position near one side of the processing cup 61 (the position in the initial state). Further, as indicated by the thick solid arrow a21 in FIG. 13, the bevel brush 83 is moved to a position near the other side of the processing cup (the position in the initial state). Further, the rotation of the lower-surface brush 51 is stopped, and the lifting-lowering supporter 54 is lowered such that the cleaning surface of the lower-surface brush 51 is spaced apart from the substrate W by a predetermined distance. Further, the discharging of the cleaning liquid from the liquid nozzle 52 to the substrate W and the injection of gas from the gas injector 53 to the substrate W are stopped. In this state, the suction holder 21 is rotated at a high speed, so that the cleaning liquid adhering to the substrate W is shaken off, and the entire substrate W is dried.

Next, as indicated by the thick solid arrow a22 in FIG. 14, the processing cup 61 is lowered from the upper cup position to the lower cup position. Thus, the substrate W being in the second height position is located farther upward than the upper end portion of the processing cup 61. Further, as indicated by the thick solid arrows a23 in FIG. 14, the lower chucks 11A, 11B move closer to each other to a position at which the lower chucks 11A, 11B can support a new substrate W in preparation for the new substrate W being carried into the unit casing 2.

Finally, the substrate W is carried out from the unit casing 2 of the substrate cleaning device 1. Specifically, the shutter 91 opens the inlet-outlet port 2x immediately before the substrate W is carried out. Thereafter, as indicated by the thick solid arrow a24 in FIG. 15, the hand (substrate holder) RH of the substrate transferring robot (not shown) enters the unit casing 2 through the inlet-outlet port 2x. Subsequently, the hand RH receives the substrate W on the suction holder 21 and exits from the inlet-outlet port2x. After the hand RH exits, the shutter 91 closes the inlet-outlet port 2x.

[3] Effects of Substrate Cleaning Device 1

(1) In the substrate cleaning device 1 according to the present embodiment, the mobile base 32 is moved to the second horizontal position with the outer peripheral end of the substrate W held by the upper holding devices 10A, 10B. With the mobile base 32 in the second horizontal position, the suction holder 21 is opposite to the lower-surface outer region of the substrate W, and the lower-surface brush 51 is opposite to the lower-surface center region of the substrate W. In this case, the lifting-lowering supporter 54 lifts or lowers the lower-surface brush 51 to bring the lower-surface brush 51 into contact with the lower surface of the substrate W. Thus, the lower-surface center region of the substrate W held by the upper holding devices 10A, 10B is cleaned by the lower-surface brush 51.

On the other hand, with the outer peripheral end of the substrate W held by the upper holding devices 10A, 10B, the mobile base 32 is moved to the first horizontal position. With the mobile base 32 in the first horizontal position, the suction holder 21 is opposite to the lower-surface center region of the substrate W, and the lower-surface brush 51 is opposite to the lower-surface outer region of the substrate W. In this case, the receiving-transferring device 40 moves the substrate W onto the suction holder 21, so that it is possible to hold the lower-surface center region of the substrate W by suction by the suction holder 21 without requiring movement of the substrate W in the horizontal direction. With the substrate W that is held by suction being rotated by the suction holder 21, the lifting-lowering supporter 54 lifts or lowers the lower-surface brush 51 to bring the lower-surface brush 51 into contact with the lower surface of the substrate W. Thus, the lower-surface outer region of the substrate W held by suction by the suction holder 21 is cleaned by the lower-surface brush 51.

In this manner, with the substrate cleaning device 1 according to the present embodiment, it is not required to move the substrate W in the horizontal direction in order to clean each of the lower-surface center region and the lower-surface outer region of the substrate W. Therefore, it is possible to clean the entire lower surface of the substrate W while reducing an increase in footprint.

(2) In the substrate cleaning device 1 according to the present embodiment, the lifting-lowering supporter 54 lifts or lowers the lower-surface brush 51 with the substrate W held by the upper holding devices 10A, 10B, whereby the lower-surface brush 51 comes into contact with the lower surface of the substrate W. In this state, the lower-surface brush 51 is rotated, and the cleaning liquid is supplied to the lower surface of the substrate W.

Here, the height position of the substrate W held by the upper holding devices 10A, 10B is higher than the upper end portion of the processing cup 61. Even in such a case, because the substrate W is not rotated while being held by the upper holding devices 10A, 10B, the cleaning liquid supplied to the substrate W is unlikely to be splashed outwardly of the substrate W. Thus, it is possible to clean the lower-surface center region of the substrate W using the lower-surface brush 51 while preventing interference between the upper holding devices 10A, 10B and the processing cup 61, and reducing splashing of the cleaning liquid.

Meanwhile, the lifting-lowering supporter 54 lifts or lowers the lower-surface brush 51 with the substrate W held by suction by the suction holder 21, so that the lower-surface brush 51 comes into contact with the lower surface of the substrate W. In this state, the substrate W is further rotated together with the suction holder 21, and the cleaning liquid is supplied to the lower surface of the substrate W.

Here, the height position at which the substrate W held by suction by the suction holder 21 is located when the lower-surface center region of the substrate W is cleaned by the lower-surface brush 51 is lower than the upper end portion of the processing cup 61. Therefore, the cleaning liquid that is supplied to the lower surface of the substrate W rotated by the suction holder 21 and is splashed outwardly of the substrate W is received by the processing cup 61. Therefore, it is possible to clean the lower-surface outer region of the substrate W held by suction by the suction holder 21 using the lower-surface brush 51 while suppressing a reduction in cleanliness caused by the splashing cleaning liquid.

Between the upper holding devices 10A, 10B and the suction holder 21, the substrate W is received and transferred by lifting or lowering of the substrate W in the Z direction by the receiving-transferring device 40. Thus, large portions of the substrate W being held by the upper holding devices 10A, 10B and large portions the substrate W being held by the lower holding device 20 overlap with each other in a plan view. In this manner, in the substrate cleaning device 1, it is not required to move the substrate W in the horizontal direction in order to clean each of the lower-surface center region and the lower-surface outer region of the substrate W. Further, when the lower-surface center region and the lower-surface outer region of the substrate W are cleaned, splashing of the cleaning liquid, to be supplied to the lower surface of the substrate W, outwardly of the substrate W is reduced. As a result, it is possible to clean the entire lower surface of the substrate W and maintain high cleanliness while reducing an increase in footprint.

(3) As described above, in the substrate cleaning device 1 according to the present embodiment, the area of the cleaning surface of the lower-surface brush 51 is larger than the area of the suction surface of the suction holder 21.

In this case, with the mobile base 32 in the first horizontal position, the lower-surface brush 51 can be brought into contact with the lower surface of the substrate W to cover the portion, held by suction by the suction holder 21, in the lower surface of the substrate W. Thus, it is possible to clean the portion of the substrate W held by suction by the suction holder 21 without moving the lower-surface brush 51 in the horizontal direction.

(4) In the substrate cleaning device 1 according to the present embodiment, the lifting-lowering supporter 54 is moved relative to the lower holding device 20 on the mobile base 32. Thus, even in a case where the contact area of the lower-surface brush 51 that comes into contact with the lower surface of the substrate W is smaller than the lower-surface outer region of the substrate W, it is possible to clean a wide range of area in the lower surface of the substrate W by moving the lifting-lowering supporter 54 in the horizontal direction on the mobile base 32.

[4] Substrate Cleaning Process

FIG. 16 is a flowchart showing a substrate cleaning process performed by the control device 9 of FIG. 3. The substrate cleaning process of FIG. 16 is executed by execution of the substrate cleaning program stored in the storage device by the CPU of the control device 9 on the RAM. The substrate cleaning process will be described below with reference to the control device 9 of FIG. 3, the substrate cleaning device 1 of FIGS. 4 to 15 and the flowchart of FIG. 16.

First, the carry-in carry-out controller 9I controls the shutter driver 92, thereby carrying the substrate W into the unit casing 2 (FIGS. 4, 5 and the step S1). Next, the chuck controller 9A controls the lower chuck drivers 13A, 13B and the upper chuck drivers 14A, 14B, thereby holding the substrate W by the upper holding devices 10A, 10B (FIGS. 5, 6 and the step S2).

Subsequently, the base controller 9C controls the base driver 33, thereby moving the mobile base 32 from the first horizontal position to the second horizontal position (FIG. 6 and the step S3). At this time, the center of the substrate W held by the upper holding devices 10A, 10B is in a first position, and the center of the lower-surface brush 51 is below the first position. Thereafter, the lower-surface cleaning controller 9E controls the lower-surface brush rotation driver 55a, the lower-surface brush lifting-lowering driver 55b, the lower-surface brush movement driver 55c, the lower-surface cleaning liquid supplier 56 and the injection gas supplier 57, thereby cleaning the lower-surface center region of the substrate W with the center of the substrate W in the first position (FIG. 7 and the step S4).

Next, the lower-surface cleaning controller 9E controls the injection gas supplier 57, thereby drying the substrate W (FIG. 8 and the step S5). Further, the base controller 9C controls the base driver 33, thereby moving the mobile base 32 from the second horizontal position to the first horizontal position (FIG. 8 and the step S6). At this time, the rotational center of the suction holder 21 of the lower holding device 20 is located below the first position. In the present example, the steps S5 and S6 are performed substantially simultaneously. Thus, the lower-surface center region of the substrate W is sequentially dried.

Subsequently, the chuck controller 9A controls the lower chuck drivers 13A, 13B and the upper chuck drivers 14A, 14B, and the receiving-transferring controller 9D controls the pin lifting-lowering driver 43, whereby the substrate W is received from the upper holding devices 10A, 10B and transferred to the lower holding device 20 (FIGS. 8 to 11, and the step S7). At this time, the center of the substrate W is in a second position below the first position. In this state, the suction controller 9B controls the suction holding driver 22 such that the lower-surface center region of the substrate W is sucked. Thus, the substrate W is held by the lower holding device 20 (FIG. 11 and the step S8).

Thereafter, the upper-surface cleaning controller 9G controls the upper-surface cleaning driver 74 and the upper-surface cleaning fluid supplier 75, thereby cleaning the entire upper surface of the substrate W (FIG. 12 and the step S9). Further, the bevel cleaning controller 9H controls the bevel brush driver 84, thereby cleaning the outer peripheral end of the substrate W (FIG. 12 and the step S10). Further, the lower-surface cleaning controller 9E controls the lower-surface brush rotation driver 55*a*, the lower-surface brush lifting-lowering driver 55*b*, the lower-surface brush movement driver 55*c*, the lower-surface cleaning liquid supplier 56 and the injection gas supplier 57, thereby cleaning the lower-surface outer region of the substrate W with the center of the substrate W in the second position (FIG. 12 and the step S11).

The steps S9 to S11 are performed substantially simultaneously. When the steps S9 to S11 are performed, the suction controller 9B controls the suction holding driver 22, thereby rotating the substrate W about the axial center of the rotation shaft of the suction holding driver 22. Further, the cup controller 9F controls the cup driver 62, thereby lifting the cup 61 from the lower cup position to the upper cup position.

After the cleaning, the suction controller 9B controls the suction holding driver 22 to rotate the suction holder 21 at a high speed, thereby drying the entire substrate W (FIG. 13 and the step S12). After the cleaning and drying, the upper holding devices 10A, 10B, the cup 61 and the like return to the initial state (FIG. 14). Finally, the carry-in carry-out controller 9I controls the shutter driver 92, thereby carrying out the substrate W from the unit casing 2 (FIG. 15 and the step S13) and ending the substrate cleaning process.

[5] Effects of Substrate Cleaning Process

In the substrate cleaning device 1 according to the present embodiment, the substrate W is received and transferred by the receiving-transferring device 40 between the upper holding devices 10A, 10B and the lower holding device 20. When the substrate W is held by the upper holding devices 10A, 10B, the lower-surface center region of the substrate W is cleaned by the lower-surface brush 51 with the center of the substrate W in the first position. When the substrate W is held by the lower holding device 20, the lower-surface outer region of the substrate W is cleaned by the lower-surface brush 51 with the center of the substrate W in the second position below the first position.

With the configuration, it is not required to move the substrate W in the horizontal direction in order to clean each of the lower-surface center region and the lower-surface outer region of the substrate W. Therefore, it is possible to easily clean the entire lower surface of the substrate W while reducing an increase in footprint.

Further, the base driver 33 is controlled such that the mobile base 32 is in a first state when the substrate W is cleaned in the upper holding devices 10A, 10B. Further, the base driver 33 is controlled such that the mobile base 32 is in a second state when the substrate W is received and transferred between the upper holding devices 10A, 10B and the lower holding device 20. Here, in the first state, the lower-surface brush 51 is below the center of the substrate W to be held by the upper holding devices 10A, 10B. In the second state, the rotational center of the lower holding device 20 is below the center of the substrate W to be held by the upper holding devices 10A, 10B.

In this case, it is possible to more easily clean the lower-surface center region of the substrate W held by the upper holding devices 10A, 10B and the lower-surface outer region of the substrate W held by the lower holding device 20 using the common lower-surface brush 51 while facilitating receiving and transferring the substrate W between the upper holding devices 10A, 10B and the lower holding device 20.

[6] Modified Examples Regarding Substrate Cleaning Process

In the present embodiment, cleaning ends after the lower-surface outer region of the substrate W is cleaned by the lower-surface cleaning device 50, and the substrate W is carried out from the unit casing 2. However, the embodiment is not limited to this. FIG. 17 is a flowchart showing a substrate cleaning process in a first modified example. As shown in FIG. 17, in the present example, the steps S14 to S19 are performed between the step S12 and the step S13 of the substrate cleaning process.

Specifically, after the step S12, the receiving-transferring controller 9D controls the pin lifting-lowering driver 43, thereby receiving the substrate W from the lower holding device 20 and transferring the substrate W to the upper holding devices 10A, 10B again (step S14). At this time, the center of the substrate W is in the first position. In this state, the chuck controller 9A controls the lower chuck drivers 13A, 13B and the upper chuck drivers 14A, 14B, thereby holding the substrate W using the upper holding devices 10A, 10B (step S15).

Next, the base controller 9C controls the base driver 33, thereby moving the mobile base 32 from the first horizontal position to the second horizontal position (step S16). At this time, the center of the lower-surface brush 51 is below the first position. Subsequently, the lower-surface cleaning controller 9E controls the lower-surface brush rotation driver 55*a*, the lower-surface brush lifting-lowering driver 55*b*, the lower-surface brush movement driver 55*c*, the lower-surface cleaning liquid supplier 56 and the injection gas supplier 57, thereby cleaning the lower-surface center region of the substrate W again with the center of the substrate W in the first position (step S17).

Thereafter, the lower-surface cleaning controller 9E controls the injection gas supplier 57, thereby drying the substrate W (step S18). Further, the base controller 9C controls the base driver 33, thereby moving the mobile base 32 from the second horizontal position to the first horizontal position (step S19). In the present example, the steps S18 and S19 are performed substantially simultaneously. Thus, the lower-surface center region of the substrate W is sequentially dried. Finally, the carry-in carry-out controller 9I controls the shutter driver 92, thereby carrying out the substrate W from the unit casing (step S13). Then, the substrate cleaning process ends.

With the first modified example, the lower-surface center region of the substrate W held by the lower holding device 20 is cleaned again in the upper holding devices 10A, 10B. Thus, the substrate W can be cleaned more properly.

FIG. 18 is a flowchart showing a substrate cleaning process in a second modified example. The substrate cleaning process in the second modified example is different from the substrate cleaning process in the first modified example in the following points. In the substrate cleaning process in the second modified example, the steps S3 to S6 are not performed. That is, the lower-surface center region of the substrate W is not cleaned before the lower-surface outer region of the substrate W is cleaned, and is cleaned only after the lower-surface outer region of the substrate W is cleaned.

With the second modified example, the lower-surface center region of the substrate W held by the lower holding device 20 is cleaned in the upper holding devices 10A, 10B. The lower-surface center region of the substrate W is not cleaned before the lower-surface outer region of the substrate W is cleaned. Thus, the substrate W can be cleaned more properly and efficiently.

While the substrate W that is carried into the unit casing 2 is held by the upper holding devices 10A, 10B and then transferred to the lower holding device 20 by the plurality of support pins 41 in the second modified example, the embodiment is not limited to this. The substrate W that is carried into the unit casing 2 may be directly transferred to the lower holding device 20 without the use of the upper holding devices 10A, 10B or the plurality of support pins 41. In this case, the steps S2 and S7 of FIG. 18 are not performed either.

[7] Substrate Processing Apparatus Including Substrate Cleaning Device 1

FIG. 19 is a schematic plan view showing one example of the substrate processing apparatus including the substrate cleaning device 1 of FIG. 1. As shown in FIG. 19, the substrate processing apparatus 100 according to the present embodiment has an indexer block 110 and a processing block 120. The indexer block 110 and the processing block 120 are provided to be adjacent to each other.

The indexer block 110 includes a plurality (four in the present example) of carrier platforms 140 and a transport section 150. The plurality of carrier platforms 140 are connected to the transport section 150. On each carrier platform 140, a carrier C for storing a plurality of substrates W in multiple stages is placed. In the transport section 150, an indexer robot IR and a controller 111 are provided. The indexer robot IR is configured to be movable in the transport section 150, rotatable about a vertical axis, liftable and lowerable. The indexer robot IR has a plurality of hands for receiving and transferring a substrate W. The number of the plurality of hands may be two or four, and are supported to be arranged at intervals in the up-and-down direction. Thus, the indexer robot IR can simultaneously transport a plurality of substrates W using the plurality of hands. The controller 111 is made of a computer or the like including a CPU, a ROM and a RAM and controls each constituent element in the substrate processing apparatus 100.

The processing block 120 includes cleaning sections 161, 162 and a transport section 163. The cleaning section 161, the transport section 163 and the cleaning section 162 are adjacent to the transport section 150 and arranged in this order. In the cleaning sections 161, 162, a plurality (three, for example) of substrate cleaning devices 1 are arranged in a stack.

A main robot MR is provided in the transport section 163. The main robot MR is configured to be rotatable about a vertical axis, liftable and lowerable. The main robot MR has a plurality of hands for receiving and transferring the substrates W. A hand of the main robot MR is equivalent to the above-mentioned hand RH.

A plurality (about twenty, for example) of substrate platforms PASS for receiving and transferring the substrates W between the indexer robot IR and the main robot MR are stacked between the indexer block 110 and the processing block 120.

In the substrate processing apparatus 100, the indexer robot IR takes out an unprocessed substrate W from any one of the plurality of carriers C placed on the plurality of carrier platforms 140. Further, the indexer robot IR places the taken and unprocessed substrate W to any one of the plurality of substrate platforms PASS. Further, the indexer robot IR receives a processed substrate W placed on any one of the plurality of substrate platforms PASS and stores the substrate W in one carrier C.

Further, the main robot MR receives an unprocessed substrate W placed on any one of the plurality of substrate platforms PASS and carries the substrate W into any one of the plurality of substrate cleaning devices 1 in the cleaning sections 161, 162. Further, when a cleaning process ends in any one of the plurality of substrate cleaning devices 1, the main robot MR carries out a processed substrate W from the substrate cleaning device 1 and places the substrate W on any one of the plurality of substrate platforms PASS.

As described above, the substrate processing apparatus 100 of FIG. 19 has the plurality of substrate cleaning devices 1 of FIG. 1. Thus, it is possible to clean an upper surface and a lower surface of a substrate W in one substrate cleaning device 1 without turning the substrate W. Therefore, the throughput of the process of cleaning the substrate W is improved. Further, an increase in footprint is sufficiently reduced by provision of the plurality of substrate cleaning devices 1.

As described above, in the substrate cleaning device 1 according to the present embodiment, the height position of the substrate W held by the upper holding devices 10A, 10B is different from the height position of the substrate W held by the lower holding device 20. As such, the main robot MR of FIG. 19 includes one hand (hereinafter referred to an upper hand) corresponding to the upper holding devices 10A, 10B and the other hand (hereinafter referred to as a lower hand) corresponding to the lower holding device 20.

FIG. 20 is a diagram for explaining a specific example of carrying a substrate W into the substrate cleaning device 1 and carrying out a substrate W from the substrate cleaning device 1 by the main robot MR of FIG. 19. In FIG. 20, operations of carrying substrates W1, W2 into the substrate cleaning device 1 and carrying the substrates W1, W2 out from the substrate cleaning device 1 are shown in a chronological order in a plurality of side views. In each side view, the upper holding devices 10A, 10B and the lower holding device 20 of the substrate cleaning device 1, and the upper hand RH1 and the lower hand RH2 of the main robot MR are schematically shown. In the main robot MR, the upper hand RH1 and the lower hand RH2 are moved by a transport mover RM. The transport mover RM includes a motor, a cylinder and the like as a driving source for moving the upper hand RH1 and the lower hand RH2.

As shown in the side view in the top field, in an initial state, the substrate W1 on which the cleaning process has been performed is held by the lower holding device 20. Further, the unprocessed substrate W2 is held by the upper hand RH1 of the main robot MR. Further, in the initial state, the lower hand RH2 is arranged to be opposite to the lower holding device 20 at a position slightly downward than the upper end portion of the lower holding device 20. Further, the upper hand RH1 is arranged to be opposite to the upper holding devices 10A, 10B at a position slightly downward than the upper end portions of the upper holding devices 10A, 10B.

Here, the distance between a height position at which a substrate is held by the upper holding devices 10A, 10B and a height position at which a substrate is held by the lower holding device 20 is referred to as a first distance D1. Further, the distance between a height position of a substrate held by the upper hand RH1 and a height position of a substrate held by the lower hand RH2 is referred to as a second distance D2. The first distance D1 and the second distance D2 are respectively fixed values.

First, the substrate W held by the lower holding device 20 is carried out. In this case, as shown in the second field from the top in FIG. 20, the lower hand RH2 first advances to a position below the substrate W1 held by the lower holding device 20.

Next, as shown in the third field from the top in FIG. 20, the lower hand RH2 is lifted and receives the substrate W held by the lower holding device 20. Further, the lower hand RH2 that has received the substrate W1 retreats from the substrate cleaning device 1, and carries out the substrate W1 from the substrate cleaning device 1 as shown in the fourth field from the top in FIG. 20. Further, the upper hand RH1 is lifted to a position slightly upward than the upper holding devices 10A, 10B.

Then, as shown in the fifth field from the top in FIG. 20, the upper hand RH1 advances such that the substrate W2 is located above the upper holding devices 10A, 10B. Further, the upper hand RH1 is lowered, and the substrate W2 held by the upper hand RH1 is transferred to the upper holding devices 10A, 10B as shown in the sixth field from the top in FIG. 20. Thereafter, the substrate W2 is held by the upper holding devices 10A, 10B, and the upper hand RH1 retreats from the substrate cleaning device 1. Then, as shown in the seventh field from the top in FIG. 20, the upper hand RH1 exits from the substrate cleaning device 1.

In the substrate processing apparatus 100 of FIG. 20, the substrate W1 is received and transferred between the upper hand RH1 and the upper holding devices 10A, 10B that correspond to each other. In this case, the upper hand RH1 needs to be at the height position substantially the same as those of the upper holding devices 10A, 10B. Further, the substrate W2 is received and transferred between the lower hand RH2 and the lower holding device 20 that correspond to each other. In this case, the lower hand RH2 needs to be at substantially the same height position as that of the lower holding device 20.

As described above, the upper hand RH1 and the lower hand RH2 are arranged in the up-and-down direction to be spaced apart from each other by the second distance D2. Therefore, in a case where the processed substrate W1 is received and transferred at a height position different from a height position at which the unprocessed substrate W2 is received and transferred, the distance required for movement of the upper hand RH1 and the lower hand RH2 in the up-and-down direction is shortened. Specifically, the movement distance of the upper hand RH1 and the lower hand RH2 in the up-and-down direction is shortened to about the difference between the first distance D1 and the second distance D2. Thus, a period of time required for carrying the substrate W1 out from the substrate cleaning device 1 and carrying the substrate W2 into the substrate cleaning device 1 is shortened. Therefore, the throughput of the substrate process in the substrate processing apparatus 100 is improved.

[8] Other Embodiments (1) While the gas injector 53 according to the above-mentioned embodiment is a slit-like gas injection nozzle having a gas injection port extending in one direction and arranged between the lower-surface brush 51 and the suction holder 21, the present invention is not limited to this. The gas injector 53 may have the below-mentioned configuration.

Figure 22:
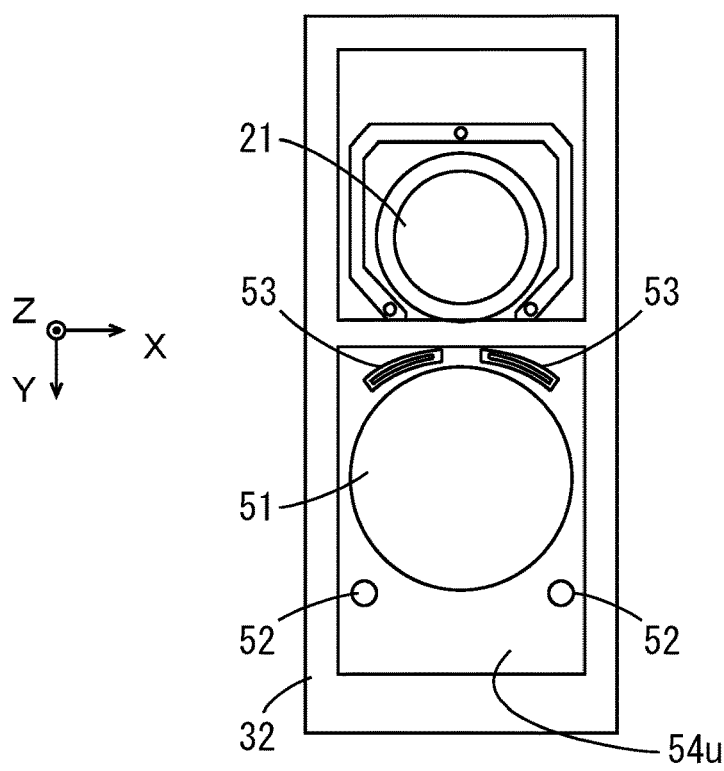
FIG. 22 is a diagram for explaining yet another example of the configuration of the gas injector.

FIG. 21 is a diagram for explaining another example of the configuration of the gas injector 53, and FIG. 22 is a diagram for explaining yet another example of the configuration of the gas injector 53. In each of FIGS. 21 and 22, the gas injector 53 is shown in a plan view together with its peripheral members.

The gas injector 53 of FIG. 21 is formed to extend in a circular arc shape along the outer peripheral end portion of the lower-surface brush 51 between the lower-surface brush 51 and the suction holder 21. In this case, because a gas curtain can be formed to extend along the outer shape of the lower-surface brush 51, contaminants can be more appropriately prevented from being splashed from the lower-surface brush 51 to the suction holder 21.

Further, the gas injector 53 of FIG. 22 has the configuration in which the center portion of the gas injector 53 of FIG. 21 is split. Even with such a configuration, a gas curtain can be formed in at least part of the region between the lower-surface brush 51 and the suction holder 21. Thus, splashing of contaminants from the lower-surface brush 51 to the suction holder 21 can be reduced. With the configuration of FIG. 22, the gas injector 53 is not present in a region in which the lower-surface brush 51 and the suction holder 21 are the closest to each other. Therefore, it is possible to shorten the distance between the suction holder 21 and the lower-surface brush 51 while suppressing the interference between the lower-surface brush 51 and the suction holder 21.

(2) In the lower-surface cleaning device 50 according to the above-mentioned embodiment, the two liquid nozzles 52 are provided at positions farther forward than the center of the lower-surface brush 51 on the upper surface 54u of the lifting-lowering supporter 54. The invention is not limited to this, and the two liquid nozzles 52 may be provided at positions farther rearward than the center of the lower-surface brush 51. Further, the number of the liquid nozzles 52 provided in the lower-surface cleaning device 50 is not limited to two, and may be one, or may be three or more.

While being attached to the upper surface 54u of the lifting-lowering supporter 54 to be directed upwardly, the liquid nozzle 52 according to the above-mentioned embodiment may be attached to be directed obliquely upwardly toward the lower-surface brush 51.

(3) While the upper surface of the substrate W is cleaned by a fluid mixture injected from the spray nozzle 73 in the substrate cleaning device 1 according to the above-mentioned embodiment, the present invention is not limited to this. The substrate cleaning device 1 may have the configuration to physically clean the upper surface of the substrate W using a brush. Alternatively, in the substrate cleaning device 1, the bevel brush 83 may clean the upper surface of the substrate W. When the substrate W is cleaned by a brush, it is necessary to provide a cleaning liquid supplier that supplies a cleaning liquid to the upper surface of the substrate W.

(4) While the receiving-transferring device 40 receives and transfers the substrate W between the upper holding devices 10A, 10B and the lower holding device 20 in the substrate cleaning device 1 according to the above-mentioned embodiment, the present invention is not limited to this. In a case where at least one of the upper holding devices 10A, 10B and the lower holding device 20 is configured to be liftable and lowerable, the receiving-transferring device 40 does not have to be provided. In this case, at least one of the upper holding devices 10A, 10B and the lower holding device 20 is lifted and lowered, so that the substrate W can be moved between the upper holding devices 10A, 10B and the lower holding device 20.

For example, in a case where the upper holding devices 10A, 10B are configured to be movable in the up-and-down direction and can directly receive and transfer the substrate W with respect to the lower holding device 20, the substrate cleaning device 1 does not have to include the receiving-transferring device 40. With this configuration, the upper holding devices 10A, 10B are a receiver-transferer, and the chuck controller 9A that controls the operations of the upper holding devices 10A, 10B is a receiving-transferring controller.

Alternatively, in a case where the lower holding device 20 is configured to be movable in the up-and-down direction and can directly receive and transfer the substrate W with respect to the upper holding devices 10A, 10B, the substrate cleaning device 1 does not have to include the receiving-transferring device 40. With this configuration, the lower holding device 20 is a receiver-transferer, and the suction controller 9B that controls the operation of the lower holding device 20 is a receiving-transferring controller.

(5) While the upper surface 54u of the lifting-lowering supporter 54 is inclined with respect to a horizontal plane in the lower-surface cleaning device 50 according to the above-mentioned embodiment, the upper surface 54u may be configured to be horizontal.

(6) While the lower-surface center region and the lower-surface outer region in the lower surface of the substrate W are cleaned in this order in the substrate cleaning device 1 according to the above-mentioned embodiment, the present invention is not limited to this.

In the substrate cleaning device 1, the lower-surface outer region and the lower-surface center region in the lower surface of the substrate W may be cleaned in this order. In this case, for example, as for a substrate that is carried into the substrate cleaning device 1, a lower-surface center region, an outer peripheral end and an upper surface are cleaned. Thereafter, the substrate W held by the lower holding device 20 is received and held by the upper holding devices 10A, 10B. In this state, the lower-surface center region of the substrate W is cleaned. The cleaned substrate W is carried out from the upper holding devices 10A, 10B to the outside of the unit casing 2.

(7) While the movement of the mobile base 32 and the movement supporter 55 in the Y direction is stopped during cleaning of the lower-surface center region of the substrate W in the substrate cleaning device 1 according to the above-mentioned embodiment, the present invention is not limited to this. At least one of the mobile base 32 and the movement supporter 55 may be moved in the Y direction during cleaning of the lower-surface center region of the substrate W. In this case, when the lower-surface center region of the substrate W is cleaned by the lower-surface brush 51, a wider range of an area in the lower surface of the substrate W can be cleaned.

(8) While the processing cup 61 is arranged at the lower cup position when the lower-surface center region of the substrate W held by the upper holding devices 10A, 10B is cleaned in the substrate cleaning device 1 according to the above-mentioned embodiment, the present invention is not limited to this. As long as the processing cup 61 does not interfere with the upper holding devices 10A, 10B with the processing cup 61 in the upper cup position, the processing cup 61 may be arranged at the upper cup position when the lower-surface center region of the substrate W is cleaned.

(9) While the cleaning liquid is supplied from the liquid nozzle 52 to the lower surface of the substrate W when the lower-surface center region of the substrate W held by the upper holding devices 10A, 10B is cleaned in the substrate cleaning device 1 according to the above-mentioned embodiment, the present invention is not limited to this. Instead of supply of the cleaning liquid to the lower surface of the substrate W from the liquid nozzle 52 when the lower-surface center region of the substrate W is cleaned, the cleaning liquid may be supplied to the lower-surface brush 51 from the liquid nozzle 52 such that the substrate W is impregnated with a certain amount of cleaning liquid before the lower-surface center region of the substrate W is cleaned. In this case, it is not necessary to supply the cleaning liquid to the lower surface of the substrate W when the lower-surface center region of the substrate W is cleaned. Therefore, the cleaning liquid can be prevented from being splashed when the lower-surface center region of the substrate W is cleaned.

(10) In the above-mentioned embodiment, the substrate cleaning device 1 is configured such that lower-surface center region of the substrate W is cleaned when the substrate W is held by the upper holding devices 10A, 10B. However, the embodiment is not limited to this. For example, the substrate cleaning device 1 may be configured to selectively operate in a first cleaning mode or a second cleaning mode.

In the first cleaning mode, the lower-surface cleaning controller 9E controls the lower-surface cleaning device 50 such that the lower-surface center region of the substrate W is cleaned when the substrate W is held by the upper holding devices 10A, 10B, and controls the lower-surface cleaning device 50 such that the lower-surface outer region of the substrate W is cleaned when the substrate W is held by the lower holding device 20. On the other hand, in the second cleaning mode, the lower-surface cleaning controller 9E controls the lower-surface cleaning device 50 such that the substrate W is not cleaned when the substrate W is held by the upper holding devices 10A, 10B, and controls the lower-surface cleaning device 50 such that the lower-surface outer region of the substrate W is cleaned when the substrate W is held by the lower holding device 20.

In this case, it is possible to clean the entire lower surface of the substrate W by causing the substrate cleaning device 1 to operate in the first cleaning mode. Meanwhile, in a case where the lower-surface center region of the substrate W does not need to be cleaned, it is possible to efficiently clean the lower-surface outer region of the substrate W by causing the substrate cleaning device 1 to operate in the second cleaning mode.

(11) While the substrate cleaning device 1 includes the upper-surface cleaning device 70 and the end-portion cleaning device 80 in the above-mentioned embodiment, the embodiment is not limited to this. In a case where the upper surface of the substrate W does not have to be cleaned, the substrate cleaning device 1 does not have to include the upper-surface cleaning device 70. Further, in a case where the outer peripheral end of the substrate W does not have to be cleaned, the substrate cleaning device 1 does not have to include the end-portion cleaning device 80.

[9] Correspondences Between Constituent Elements in Claims and Parts in Preferred Embodiments In the following paragraphs, non-limiting examples of correspondences between various elements recited in the claims below and those described above with respect to various preferred embodiments of the present disclosure are explained.

(1) Regarding Claims 1 to 10

In the above-mentioned embodiment, the upper holding devices 10A, 10B are an example of a first substrate holder, the lower holding device 20 is an example of a second substrate holder, the receiving-transferring device 40 is an example of a mover, the lower-surface brush 51 is an example of a cleaning tool, and the lifting-lowering supporter 54 is an example of a cleaning tool lifter-lowerer.

Further, the suction holding driver 22 is an example of a rotation driver, the mobile base 32 is an example of a base portion, the linear guide 31 and the base driver 33 are examples of a base mover, and the substrate cleaning device 1 is an example of a substrate cleaning device.

Further, the lower-surface brush movement driver 55c is an example of a movement driver, the lower-surface brush rotation driver 55a is an example of a cleaning tool rotation driver, the lifting-lowering supporter 54 is an example of an attachment member, the liquid nozzle 52 is an example of a cleaning liquid suppler, the upper surface 54u is an example of an upper surface of the attachment member, and the gas injector 53 is an example of an airflow generator.

(2) Regarding Claims 11 to 17, and 24

In the above-mentioned embodiment, the upper holding devices 10A, 10B are an example of a first substrate holder, the lower holding device 20 is an example of a second substrate holder, the receiving-transferring device 40 is an example of a substrate mover, the lower-surface brush 51 is an example of a cleaning tool and the lifting-lowering supporter 54 is an example of a cleaning tool lifter-lowerer.

Further, the base device 30, the movement supporter 55 and the lower-surface brush movement driver 55c are examples of a cleaning tool mover, the liquid nozzle 52 is an example of a cleaning liquid supplier, the processing cup 61 is an example of a processing cup, and the substrate cleaning device 1 is an example of a substrate cleaning device.

Further, the control device 9 is an example of a controller, the lower-surface brush rotation driver 55a is an example of a cleaning tool rotation driver, the cup driver 62 is an example of a processing cup driver, the main robot MR is an example of a substrate transporter, the upper hand RH1 is an example of a first transport holder, the lower hand RH2 is an example of a second transport holder, and the substrate processing apparatus 100 is an example of a substrate processing apparatus.

In the above-mentioned embodiment, the substrate W is an example of a substrate, the upper holding devices 10A, 10B are an example of a first substrate holder, the lower holding device 20 is an example of a second substrate holder, the receiving-transferring device 40 is an example of a receiver-transferer, the lower-surface brush 51 is an example of a cleaning tool, and the lower-surface cleaning controller 9E is an example of a cleaning controller. The substrate cleaning device 1 is an example of a substrate cleaning device, the receiving-transferring controller 9D is an example of a receiving-transferring controller, the mobile base 32 is an example of a base portion, the base driver 33 is an example of a base driver, and the base controller 9C is an example of a base controller.

As each of constituent elements recited in the claims, various other elements having configurations or functions described in the claims can be also used.

While preferred embodiments of the present disclosure have been described above, it is to be understood that variations and modifications will be apparent to those skilled in the art without departing the scope and spirit of the present disclosure. The scope of the present disclosure, therefore, is to be determined solely by the following claims.

We claim:

1. A substrate cleaning device comprising:
   a first substrate holder that holds an outer peripheral end of a substrate;
   a second substrate holder that holds a lower-surface center portion of the substrate by suction at a position farther downward than the first substrate holder;
   a mover that moves the substrate between the first substrate holder and the second substrate holder;
   a cleaning tool that comes into contact with a lower surface of the substrate to clean the lower surface of the substrate;
   a cleaning tool lifter-lowerer that supports the cleaning tool from below, and lifts or lowers the cleaning tool between a first cleaning height position at which the cleaning tool comes into contact with the lower surface of the substrate while the substrate is held by the first substrate holder and not the second substrate holder and a second cleaning height position at which the cleaning tool comes into contact with the lower surface of the substrate while the substrate is held by the second substrate holder and not the first substrate holder;
   a rotation driver that supports the second substrate holder from below and rotates the second substrate holder about an axis extending in an up-and-down direction;
   a base portion that supports the cleaning tool lifter-lowerer and the rotation driver such that the cleaning tool and the second substrate holder are spaced apart from each other in a plan view; and
   a base mover that moves the base portion horizontally between a first horizontal position at which the second substrate holder is aligned in an up-and-down direction to the lower-surface center portion of the substrate and the cleaning tool is aligned in an up-and-down direction to a lower-surface outer region surrounding the lower-surface center portion of the substrate, and a second horizontal position at which the second substrate holder is aligned in an up-and-down direction to the lower-surface outer region of the substrate and the cleaning tool is aligned in an up-and-down direction to the lower-surface center portion of the substrate, with the substrate held by the first substrate holder.

2. The substrate cleaning device according to claim 1, further comprising an attachment member to which the cleaning tool is attached, wherein
   the cleaning tool lifter-lowerer supports the cleaning tool by liftably and lowerably supporting the attachment member.

3. The substrate cleaning device according to claim 2, further comprising a cleaning liquid supplier that is attached to the attachment member and supplies a cleaning liquid to the lower surface of the substrate when the lower surface of the substrate is cleaned by the cleaning tool.

4. The substrate cleaning device according to claim 2, wherein
   the attachment member has an upper surface that is inclined downwardly in a direction away from the second substrate holder.

5. The substrate cleaning device according to claim 2, further comprising an airflow generator that generates a strip-shaped flow of air between the cleaning tool and the second substrate holder.

6. The substrate cleaning device according to claim 5, wherein the airflow generator is further attached to the attachment member.

7. The substrate cleaning device according to claim 5, wherein the airflow generator forms a gas curtain between the cleaning tool and the second substrate holder by injecting a strip-shaped gas toward the lower surface of the substrate.

8. The substrate cleaning device according to claim 1, wherein an area of a contact portion of the cleaning tool that comes into contact with the lower surface of the substrate is larger than an area of a suction portion of the second substrate holder that holds the lower-surface center portion of the substrate by suction.

9. The substrate cleaning device according to claim 1, wherein the base portion is configured to support the cleaning tool lifter-lowerer such that the cleaning tool lifter-lowerer is movable in a horizontal plane with respect to the rotation driver, and the substrate cleaning device further includes a movement driver that moves the cleaning tool lifter-lowerer in the horizontal direction with respect to the second substrate holder in the base portion.

10. The substrate cleaning device according to claim 1, further comprising a cleaning tool rotation driver that rotates the cleaning tool about an axis extending in the up-and-down direction.

11. A substrate cleaning device comprising:

a first substrate holder that holds an outer peripheral end of a substrate at a first height position without rotating the substrate;

a second substrate holder that rotates the substrate about an axis extending in an up-and-down direction while holding the lower-surface center portion of the substrate by suction at a second height position further downward than the first height position;

a substrate mover that moves the substrate between the first height position and the second height position;

a cleaning tool that comes into contact with a lower surface of the substrate to clean the lower surface of the substrate;

a cleaning tool lifter-lowerer that changes the cleaning tool between a first state where the cleaning tool comes into contact with the lower surface of the substrate while the substrate is held by the first substrate holder and not by the second substrate holder and a second state where the cleaning tool comes into contact with the lower surface of the substrate while the substrate is held by the second substrate holder and not by the first substrate holder, by lifting or lowering the cleaning tool;

a cleaning tool mover that moves the cleaning tool in a horizontal direction with respect to the substrate at a position below the substrate held by the first or second substrate holder;

a cleaning liquid supplier that supplies a cleaning liquid to the lower surface of the substrate; and a processing cup that is provided to surround the second substrate holder in a plan view, and receives the cleaning liquid splashed from the substrate in a case where the cleaning liquid is supplied from the cleaning liquid supplier to the substrate that is rotated while being held by suction by the second substrate holder, wherein the first height position is higher than an upper end portion of the processing cup, and the second height position is lower than the upper end portion of the processing cup when the substrate is cleaned by the cleaning tool while being held by the second substrate holder.

12. The substrate cleaning device according to claim 11, further comprising a controller that controls the first substrate holder, the second substrate holder, the substrate mover, the cleaning tool lifter-lowerer, the cleaning tool mover and the cleaning liquid supplier, wherein the controller controls the first substrate holder, the cleaning tool lifter-lowerer and the cleaning liquid supplier such that the lower-surface center portion of the substrate held by the first substrate holder is cleaned by the cleaning tool, when the lower-surface center portion of the substrate is cleaned, controls the second substrate holder, the cleaning tool lifter-lowerer, the cleaning tool mover and the cleaning liquid supplier such that a lower-surface outer region, surrounding the lower-surface center portion of the substrate, is cleaned by the cleaning tool while the cleaning liquid is supplied to the lower surface of the substrate held by the second substrate holder, when the lower-surface outer region is cleaned, and controls the first substrate holder, the second substrate holder and the substrate mover such that the substrate is moved between the first substrate holder and the second substrate holder.

13. The substrate cleaning device according to claim 11, wherein the cleaning tool mover moves the cleaning tool in the horizontal direction with respect to the substrate in at least one of a state where the cleaning tool is in contact with the lower surface of the substrate held by the first substrate holder and a state where the cleaning tool is in contact with the lower surface of the substrate held by the second substrate holder.

14. The substrate cleaning device according to claim 11, further comprising a gas supplier that is configured to be capable of supplying gas to the lower surface of the substrate held by the first substrate holder and to be capable of supplying gas to the lower surface of the substrate held by the second substrate holder.

15. The substrate cleaning device according to claim 11, further comprising a cleaning tool rotation driver that rotates the cleaning tool about an axis extending in the up-and-down direction.

16. The substrate cleaning device according to claim 11, wherein an area of a contact portion of the cleaning tool that comes into contact with the lower surface of the substrate is larger than an area of a suction portion of the second substrate holder that holds the lower-surface center portion of the substrate by suction.

17. The substrate cleaning device according to claim 11, further comprising a processing cup driver that lifts or lowers the processing cup between an upper cup position at which an upper end portion of the processing cup is higher than the second height position and a lower cup position at which the upper end portion of the processing cup is lower than the second height position, wherein the processing cup driver holds the processing cup at the upper cup position when the substrate is cleaned by the cleaning tool while being held by the second substrate holder, and holds the processing cup at the lower cup position before or after the substrate held by the second substrate holder is cleaned.

18. A substrate processing apparatus comprising:

the substrate cleaning device according to claim 11; and a substrate transporter that includes a first transport holder configured to be capable of holding the substrate and a second transport holder configured to be capable of holding the substrate at a position farther downward than the first transport holder, wherein the first transport holder receives the substrate from or transfers the substrate to the first substrate holder of the substrate cleaning device, and the second transport holder receives the substrate from or transfers a substrate to the second substrate holder of the substrate cleaning device.

19. A substrate cleaning device comprising:

a first substrate holder that holds an outer peripheral end of a substrate in a first position in a vertical direction;

a second substrate holder that holds a lower-surface center region of the substrate in a second position farther downward than the first substrate holder in the vertical direction;

a receiver-transferer that receives and transfers the substrate between the first substrate holder and the second substrate holder;

a cleaning tool that comes into contact with a lower surface of the substrate to clean the lower surface of the substrate;

a cleaning controller that controls the cleaning tool such that the lower-surface center region of the substrate is cleaned while the substrate is in the first position when the substrate is held by the first substrate holder, and controls the cleaning tool such that a lower-surface outer region surrounding the lower-surface center region of the substrate is cleaned while the substrate is in the second position when the substrate is held by the second substrate holder;

a base portion configured to support the cleaning tool and the second substrate holder; and a unit casing that has a horizontal bottom surface portion and stores the first substrate holder, the second substrate holder, the receiver-transferer, the cleaning tool, and the base portion, wherein the base portion is configured to be integrally movable in a horizontal direction together with the cleaning tool and the second substrate holder on the bottom surface portion of the unit casing, the cleaning tool and the second substrate holder are arranged to be aligned in a plan view, and the base portion further includes:

a linear guide that includes a rail provided on the bottom surface portion to extend in a direction in which the cleaning tool and the second substrate holder are aligned, a mobile base that is movably provided on the rail of the linear guide, and a base driver that moves the mobile base on the linear guide.

20. The substrate cleaning device according to claim 19, further comprising a receiving-transferring controller that controls the receiver-transferer such that the substrate having the lower-surface center region that has been cleaned in the first substrate holder to the second substrate holder.

21. The substrate cleaning device according to claim 20, wherein the receiving-transferring controller further controls the receiver-transferer such that the substrate having the lower-surface outer region that has been cleaned in the second substrate holder is transferred to the first substrate holder again, and the cleaning controller controls the cleaning tool such that the lower-surface center region of the substrate held by the first substrate holder is cleaned again.

22. The substrate cleaning device according to claim 19, further comprising a receiving-transferring controller that controls the receiver-transferer such that the substrate having the lower-surface outer region that has been cleaned in the second substrate holder is transferred to the first substrate holder.

23. The substrate cleaning device according to claim 19, wherein the substrate cleaning device is configured to selectively operate in a first cleaning mode or a second cleaning mode, and the cleaning controller controls the cleaning tool such that the lower-surface center region of the substrate is cleaned when the substrate is held by the first substrate holder, and controls the cleaning tool such that the lower-surface outer region of the substrate is cleaned when the substrate is held by the second substrate holder, in the first cleaning mode, and controls the cleaning tool such that the substrate is not cleaned when the substrate is held by the first substrate holder, and controls the cleaning tool such that the lower-surface outer region of the substrate is cleaned when the substrate is held by the second substrate holder, in the second cleaning mode.

24. A substrate cleaning device comprising:

a first substrate holder that holds an outer peripheral end of a substrate in a first position in a vertical direction;

a second substrate holder that holds a lower-surface center region of the substrate in a second position farther downward than the first substrate holder in the vertical direction;

a receiver-transferer that receives and transfers the substrate between the first substrate holder and the second substrate holder;

a cleaning tool that comes into contact with a lower surface of the substrate to clean the lower surface of the substrate;

a cleaning controller that controls the cleaning tool such that the lower-surface center region of the substrate is cleaned while the substrate is in the first position when the substrate is held by the first substrate holder, and controls the cleaning tool such that a lower-surface outer region surrounding the lower-surface center region of the substrate is cleaned while the substrate is in the second position in the vertical direction when the substrate is held by the second substrate holder;

a base portion that supports the cleaning tool and the second substrate holder;

a base driver that changes the base portion between a first state where the cleaning tool is below the center of the substrate to be held by the first substrate holder and a second state where a rotational center of the second substrate holder is below the center of the substrate to be held by the first substrate holder, and a base controller that controls the base driver such that the base portion is in the first state when the substrate is cleaned in the first substrate holder, and controls the base driver such that the base portion is in the second state when the substrate is received and transferred between the first substrate holder and the second substrate holder.

* * * * *